United States Patent
Fukutani et al.

(10) Patent No.: US 8,497,572 B2
(45) Date of Patent: Jul. 30, 2013

(54) SEMICONDUCTOR MODULE AND METHOD OF MANUFACTURING THE SAME

(75) Inventors: Keita Fukutani, Anjo (JP); Kuniaki Mamitsu, Nukata-gun (JP); Yasushi Ookura, Okazaki (JP); Masayoshi Nishihata, Chiryu (JP); Hiroyuki Wado, Toyota (JP); Syun Sugiura, Toyota (JP)

(73) Assignee: DENSO CORPORATION, Kariya (JP)

( * ) Notice: Subject to any disclaimer, the term of this patent is extended or adjusted under 35 U.S.C. 154(b) by 225 days.

(21) Appl. No.: 13/173,248

(22) Filed: Jun. 30, 2011

(65) Prior Publication Data

US 2012/0001308 A1   Jan. 5, 2012

(30) Foreign Application Priority Data

Jul. 5, 2010 (JP) ................................. 2010-153125
Jul. 8, 2010 (JP) ................................. 2010-155872

(51) Int. Cl.
*H01L 23/34* (2006.01)
(52) U.S. Cl.
USPC ............ 257/675; 257/E23.052; 257/E21.506; 257/E23.079; 257/E23.01; 257/E23.141; 257/E23.001; 257/E23.151; 257/E23.153; 257/E23.142; 257/E23.08

(58) Field of Classification Search
None
See application file for complete search history.

(56) References Cited

U.S. PATENT DOCUMENTS

| 2001/0033477 A1 | 10/2001 | Inoue et al. | |
|---|---|---|---|
| 2004/0089934 A1* | 5/2004 | Shimoida et al. | 257/686 |
| 2004/0183188 A1* | 9/2004 | Oohama | 257/706 |

FOREIGN PATENT DOCUMENTS

| JP | A-2002-203941 | 7/2002 |
|---|---|---|
| JP | A-2006-120970 | 5/2006 |
| JP | A-2006-140217 | 6/2006 |
| JP | A-2006-222149 | 8/2006 |

* cited by examiner

*Primary Examiner* — Fei Fei Yeung Lopez
(74) *Attorney, Agent, or Firm* — Posz Law Group, PLC

(57) ABSTRACT

In a semiconductor module, a first heat sink is disposed on a rear surface of a first semiconductor chip constituting an upper arm, and a second heat sink is disposed on a front surface of the first semiconductor chip through a first terminal. A third heat sink is disposed on a rear surface of a second semiconductor chip constituting a lower arm, and a fourth heat sink is disposed on a front surface of the second semiconductor chip through a second terminal. A connecting part for connecting between the upper arm and the lower arm is integral with the first terminal, and is connected to the third heat sink while being inclined relative to the first terminal.

26 Claims, 23 Drawing Sheets

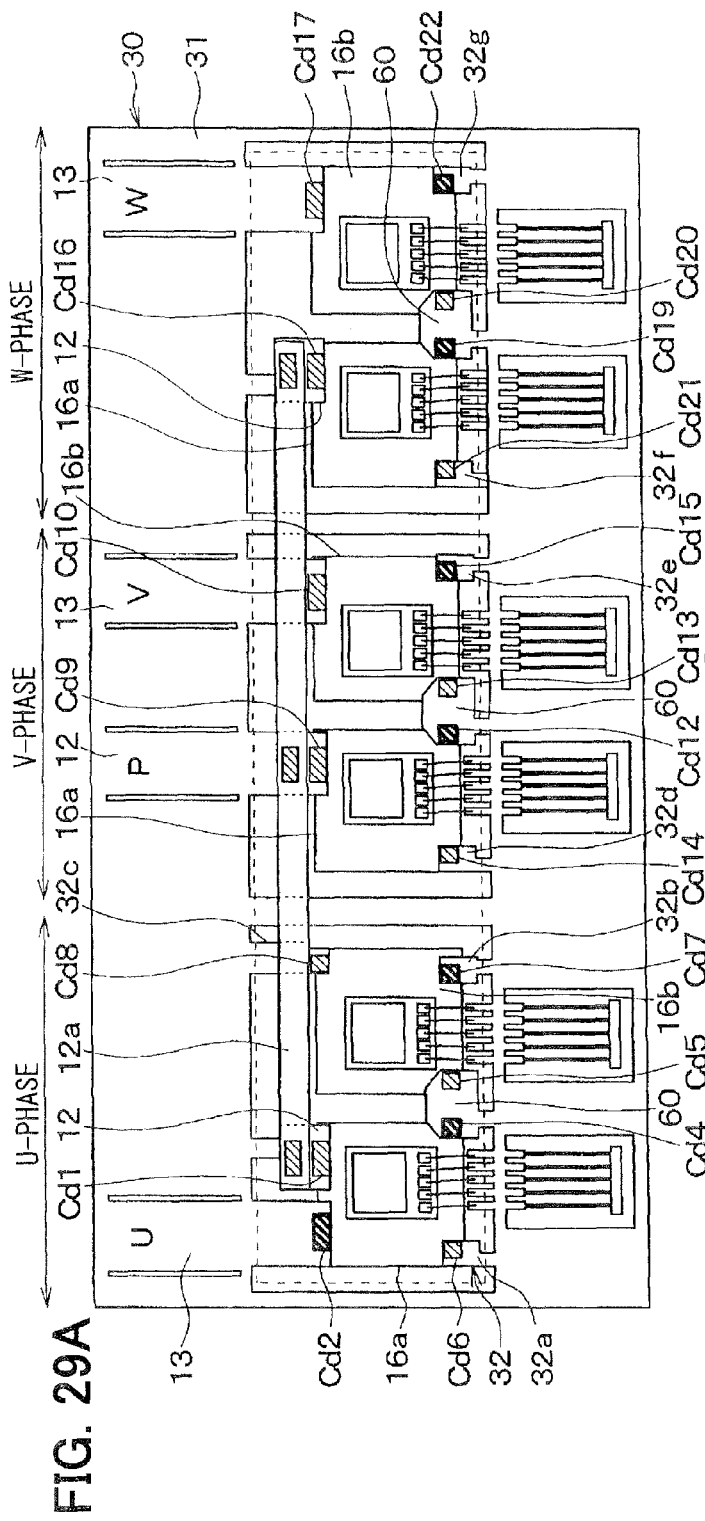
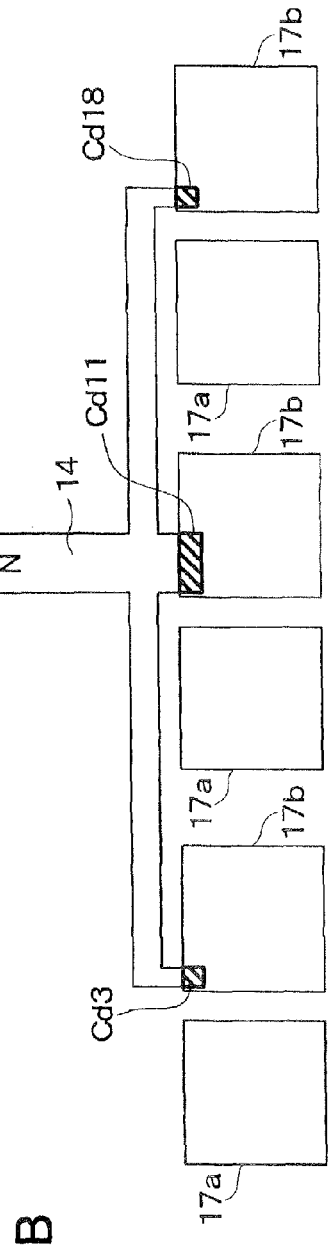
FIG. 29A
FIG. 29B

SEMICONDUCTOR MODULE AND METHOD OF MANUFACTURING THE SAME

CROSS REFERENCE TO RELATED APPLICATION

This application is based on Japanese Patent Applications No. 2010-153125 filed on Jul. 5, 2010 and No. 2010-155872 filed on Jul. 8, 2010, the disclosure of which are incorporated herein by reference.

FIELD OF THE INVENTION

The present invention relates to a semiconductor module in which a semiconductor chip formed with a semiconductor power element and a heat sink are molded with a resin. More particularly, the present invention relates to a semiconductor module in which at least two semiconductor power element, such as an upper arm (high-side element) and a lower arm (low-side element), are molded with a resin.

BACKGROUND OF THE INVENTION

For example, Japanese Patent No. 4192396, which corresponds to US2001/0033477, describes a semiconductor module in which an upper arm and a lower arm are connected in series. Such a semiconductor module is known as a 2 in 1 package structure. Each of the upper arm and the lower arm has a semiconductor chip formed with a semiconductor power element, such as an insulated gate bipolar transistor (IGBT). In each of the upper arm and the lower arm, a heat sink is disposed on an emitter side of the semiconductor chip a metal block, and another heat sink is disposed on a collector side of the semiconductor chip. The semiconductor chip is sealed with a resin in a state where the heat sinks are exposed from the resin.

A heat sink that connects between the upper arm and the lower arm and has an intermediate potential is larger than the other heat sinks. The semiconductor chip of the upper arm is mounted on the large heat sink such that a front surface of the semiconductor chip faces upward. Also, the semiconductor chip of the lower arm is mounted on the large heat sink such that a rear surface of the semiconductor chip faces upward.

In such a semiconductor module, however, directions of mounting the semiconductor chips are not uniform. Therefore, an assembling process is complicated.

For example, Japanese Patent Application Publication No. 2006-140217 describes a semiconductor module in which a first semiconductor chip and a second semiconductor chip are mounted in the same direction. A heat sink (i.e., electrode plate) connected to a front surface of the first semiconductor chip and a heat sink (i.e., electrode plate) connected to a rear surface of the second semiconductor chip are connected to each other through a conductive member.

In such a structure, however, the conductive member is a separate member. Therefore, the number of components increases, resulting in an increase in the number of connecting portions between the components. Moreover, the manufacturing process is complicated. In addition, the heat sink connected to the front surface of the first semiconductor chip and the heat sink connected to the rear surface of the second semiconductor chip are extended to be close to each other. The conductive member is connected to the extended portions of the heat sinks to electrically connect between the heat sinks. Therefore, the area of the heat sinks increases, and hence the area of the semiconductor module increases.

For example, in Japanese Patent Application Publication No. 2006-222149, heat sinks are integrated in a connecting part for connecting between the upper arm and the lower arm. Further, the heat sinks are provided with projections as terminals (e.g., metal blocks).

In forming such a semiconductor module, first, a semiconductor chip formed with a semiconductor element for the upper arm is bonded with a heat sink and a semiconductor chip formed with a semiconductor element for the lower arm is bonded with a heat sink. Thereafter, the heat sinks with which the semiconductor chips have been bonded are fixed to the heat sinks integrated in the connecting part.

In a semiconductor module described in Japanese Patent Application Publication No. 2006-120970, a first semiconductor element and a second semiconductor element are mounted in the same direction. A heat sink connected to a front surface of the first semiconductor element and a heat sink connected to the rear surface of a second semiconductor element are connected to each other using a separate connecting part. Since the semiconductor elements are arranged in the same direction, the manufacturing process is simplified.

In such a semiconductor module, however, control terminals for controlling semiconductor power elements of semiconductor chips are fixed to a heat sink that is connected to the rear surface of the semiconductor chip until components are molded with a resin. The control terminals are cut after the molding. Therefore, even in a finished product, a hanging lead, which has the same potential as the rear surface of the semiconductor chip, exists adjacent to the control terminals. Depending on the potential difference between the control terminals and the hanging lead, it is necessary to ensure a creeping distance. Thus, it is difficult to reduce the size of the semiconductor module. Further, in a structure where the heat sink connected to the front surface of the semiconductor chip of the upper arm and the heat sink connected to the rear surface of the semiconductor chip of the lower arm are connected through a separate member, it is necessary to fix the components using a special means.

FIGS. 30A and 30B illustrate an example of a semiconductor module. FIG. 30A is a schematic plan view of a semiconductor module J10, before being molded with a resin. FIG. 30B is a cross-sectional view of the semiconductor module J10 taken along a line XXXA-XXXA in FIG. 30A. Although FIG. 30A is not a cross-sectional view, some portions are hatched for the sake of clarity.

The semiconductor module J10 includes semiconductor chips J11, such as a first semiconductor chip J11a for an upper arm and a second semiconductor chip J11b for a lower arm, leads J12, J13, J14, control terminals J15, and heat sinks J16, J17, such as lower heat sinks J16a, J16b and upper heat sinks J17a, J17b. The first semiconductor chip J11a and the second semiconductor chip J11b are formed with semiconductor power elements. The components J11a, J11b, J12, J13, J14, J15, J16, and J17 are integrally molded in a resin mold part J20.

The lower heat sink J16a is connected to the rear surface of the first semiconductor chip 11a, and the upper heat sink J17a is connected to the front surface of the first semiconductor chip 11a through a metal block J59a. The lower heat sink J16b is connected to the rear surface of the second semiconductor chip J11b, and the upper heat sink J17b is connected to the front surface of the second semiconductor chip J11b through a metal block J59b.

Before being molded in the resin mold part J20, the leads J12 through J14 and the control terminals J15 are included in a lead frame J30. That is, the leads J12 through J14 and the control terminals J15 are continuous from a frame portion J31 of the lead frame J30. In this state, the leads J12 through J14 and the control terminals J15 are connected to the heat sinks J16a, J16b, J17a, J17b and the semiconductor chips J11a, J11b by soldering or the like. For example, the lead 12, which serves as a positive electrode lead, is connected to the heat sink J16a of the upper arm. The lead 13, which serves as an output lead producing an output potential, is connected to the heat sink J16b of the lower arm. The lead J14, which serves as a negative electrode lead, is connected to the heat sink J17b of the lower arm.

The heat sink J17a and the heat sink J16b are connected to each other through a connecting part J60 so that the heat sinks J17a, J16b have the middle potential. The control terminals J15 include control terminals J15a for the upper arm and terminals J15b for the lower arm. The control terminals J15a are connected to pads disposed on the front surface of the first semiconductor chip J11a through bonding wires J22a. Likewise, the control terminals J15b are connected to pads disposed on the front surface of the second semiconductor chip 11b through bonding wires J22b.

The lead frame J30 has hanging leads J32a, J32b, J32c for restricting the components from inclining during the molding. The components of each of the upper arm and the lower arm are connected to the lead frame J30 at multiple corner portions thereof.

In FIG. 30A, the hatched portions with thin lines indicate connecting portions with the lower heat sinks J16a, J16b, and the hatched portion with thick lines indicate connecting portion with the upper heat sinks J17a, J17b.

In such a configuration, a collector potential and an emitter potential (equal to the middle potential) of the semiconductor power element of the upper arm are respectively applied to the hanging lead J32b, which is adjacent to the control terminal J15a, and the control terminal J15a. Therefore, the voltage of 1000V or more may be applied to the portion b1 between the control terminal J15a and the hanging lead J32b when an inverter is operated. Likewise, a potential difference between the collector potential of the semiconductor power element of the upper arm and the middle potential occurs at a portion b2 between the hanging lead J32b and the hanging lead J32c. Further, a potential difference between the middle potential and the emitter potential of the semiconductor power element of the lower arm occurs at a portion b3 between the hanging lead J32c and the control terminals J15b.

In the finished product, the hanging leads J32b, J32c, the control terminals J15b and the like are exposed from the resin mold part J20. Therefore, predetermined creeping distances need to be maintained at the portions b1, b2, b3 corresponding to respective potential differences.

As a result, a width of the semiconductor module J10, such as a dimension of the semiconductor module J10 in a right and left direction of FIG. 30A, increases. Accordingly, it is difficult to reduce the size of the semiconductor module J10. Further, since the connecting part J60 for connecting between the heat sink J17a of the upper arm and the heat sink J16b of the lower arm is the separate member, the components need to be fixed using a special means.

SUMMARY OF THE INVENTION

The present invention is made in view of the foregoing matter, and it is an object of the present invention to provide a semiconductor module, which is capable of reducing an area of a heat sink and the number of components and being manufactured with a simplified process, and a method of manufacturing the semiconductor module.

It is another object of the present invention to provide a semiconductor module having a reduced width while maintaining necessary creeping distances and capable of being assembled with enhanced assemblability, and a method of manufacturing the semiconductor module.

It is further another object of the present invention to provide a semiconductor module having a reduced size while maintaining necessary creeping distances, and capable of being assembled with enhanced assemblability while restricting inclination of components due to molding pressure during resin-molding.

In a semiconductor module according to a first aspect, a first semiconductor chip constituting an upper arm is provided with a semiconductor power element, and a second semiconductor chip constituting a lower arm is provided with a semiconductor power element. A first heat sink is connected to a pad disposed on a rear surface of the first semiconductor chip. A first terminal is connected to a pad disposed on a front surface of the first semiconductor chip. A second heat sink is connected to the first terminal on a side opposite to the first semiconductor chip with respect to the first terminal. A third heat sink is connected to a pad disposed on a rear surface of the second semiconductor chip. A second terminal is connected to a pad disposed on a front surface of the second semiconductor chip. A fourth heat sink is connected to the second terminal on a side opposite to the second semiconductor chip with respect to the second terminal. A positive electrode lead is connected to the first heat sink. A middle lead is connected between the upper arm and the lower arm as a middle terminal. A negative electrode lead is connected to a pad disposed on the front surface of the second semiconductor chip. A resin mold part molds the first and second semiconductor chips, the first through fourth heat sinks, the positive electrode lead, the middle lead and the negative electrode lead. Further, the upper arm and the lower arm are connected to each other through a connecting part. The connecting part is integral with the first terminal. The connecting part includes an inclined portion inclined relative to the terminal body portion to be connected to the third heat sink.

In such a configuration, the first terminal is disposed between the first semiconductor chip and the second heat sink to space the second heat sink from the first semiconductor chip by a predetermined distance, and the connecting part is integral with the first terminal. Therefore, the upper arm and the lower arm are connected to each other through the connecting part while maintaining the distance by the first terminal. Accordingly, the number of components can be reduced, as compared with a structure in which the connecting part is provided as a separate member.

Further, the upper arm and the lower arm are connected to each other by connecting an end of the connecting part to the third heat sink. Therefore, the number of connecting portions can be reduced. Moreover, the semiconductor module can be manufactured by simply stacking the components on top of the other. Therefore, the manufacturing process can be simplified.

In addition, the connecting part is inclined relative to the first terminal to be connected to the third heat sink. In this case, the upper arm and the lower arm can be connected to each other without increasing the area of the second heat sink and the third heat sink. Therefore, it is not necessary to increase the area of the second heat sink and the third heat sink.

In a semiconductor module according to a second aspect, the first terminal is integral with the second heat sink. The connecting part is integral with one of the second heat sink and the third heat sink. The connecting part includes an inclined portion inclined relative to the one and is connected to the other of the second heat sink and the third heat sink.

Also in such a configuration, the upper arm and the lower arm are connected to each other through the connecting part while maintaining the distance between the second heat sink and the first semiconductor chip by the first terminal. The connecting part is integral with one of the second heat sink and the third heat sink. Accordingly, the number of components can be reduced, as compared with a structure in which the connecting part is provided as a separate member.

Further, the upper arm and the lower arm are connected to each other by connecting an end of the connecting part to the one of the second heat sink and the third heat sink. Therefore, the number of connecting portions can be reduced. Moreover, the semiconductor module can be manufactured by simply stacking the components on top of the other. Therefore, the manufacturing process can be simplified.

In addition, the connecting part is inclined relative to the one of the second heat sink and the third heat sink. In this case, the upper arm and the lower arm can be connected to each other without increasing the area of the second heat sink and the third heat sink. Therefore, it is not necessary to increase the area of the second heat sink and the third heat sink.

In a semiconductor module according to a third aspect, a first semiconductor chip constituting an upper arm is provided with a vertical semiconductor power element. A second semiconductor chip constituting a lower arm is provided with a vertical semiconductor power element. A first heat sink is connected to a pad disposed on a rear surface of the first semiconductor chip. A second heat sink is connected to a front surface of the first semiconductor chip. A third heat sink is connected to a pad disposed on a rear surface of the second semiconductor chip. A fourth heat sink is connected to a front surface of the second semiconductor chip. A positive electrode lead is connected to the first heat sink. A first control terminal is electrically connected to a pad that is disposed on the front surface of the first semiconductor chip for controlling the semiconductor power element through a boning wire. A second control terminal is electrically connected to a pad that is disposed on the front surface of the second semiconductor chip for controlling the semiconductor power element through a bonding wire. A negative electrode lead is connected to the fourth heat sink. A connecting part connects between the second heat sink and the third heat sink. A middle lead is connected to at least one of the second heat sink, the third heat sink and the connecting part. A resin mold part covers the first semiconductor chip and the second semiconductor chip, and surfaces of the first through fourth heat sinks and ends of the positive electrode lead, the middle lead, the negative electrode lead, the first control terminal and the second control terminal are exposed from the resin mold part, the surfaces of the first through fourth heat sinks being opposite to the first and second semiconductor chips. The resin mold part has been formed in a state where the positive electrode lead, the middle lead, the negative electrode lead, the first control terminal, the second control terminal and the connecting part are integral with a frame portion of a lead frame. The positive electrode lead, the middle lead, the negative electrode lead, the first control terminal, the second control terminal and the connecting part have been cut from the frame portion after the resin mold part was formed.

In such a configuration, the connecting part functions as a hanging lead when the resin mold part is formed. Therefore, the number of hanging leads can be reduced. For example, it is not necessary to employ two hanging leads between the first and second control terminals. In this case, because creeping distances can be ensured between the first and second control terminals and the hanging lead, a width of the semiconductor module, that is, a dimension of the semiconductor module in a direction in which the first and second semiconductor chips are arranged can be reduced. Therefore, a size of the semiconductor module can be reduced. Moreover, since the hanging leads are reduced, the number of connecting portions between the first through fourth heat sinks and the lead frame can be reduced in total. Further, the connecting part is provided by a part of the lead frame. Accordingly, it is not necessary to fix the hanging lead using a special means, and hence the assemblability improves.

In a method of manufacturing the semiconductor module according to the third aspect, the first and second semiconductor chip are molded with a resin in a state where the positive electrode lead, the middle lead, the negative electrode lead, the first control terminal, the second control terminal and the connecting part are integral with the frame portion of the lead frame. After the molding, the positive electrode lead, the middle lead, the negative electrode lead, the first control terminal, the second control terminal and the connecting part are cut from the frame portion.

In such a manufacturing method, during the molding, the connecting part can serve as the hanging lead while connecting the second heat sink and the third heat sink. Therefore, the number of hanging leads can be reduced.

BRIEF DESCRIPTION OF THE DRAWINGS

Other objects, features and advantages of the present invention will become more apparent from the following detailed description made with reference to the accompanying drawings, in which like parts are designated by like reference numbers and in which:

FIGS. 29A and 29B are schematic plan views of a semiconductor module for illustrating a layout of components according to a twenty-first embodiment of the present invention;

DETAILED DESCRIPTION OF EXEMPLARY EMBODIMENTS

Hereinafter, exemplary embodiments of the present invention will be described with reference to the drawings.

First Embodiment

A first embodiment will be described with reference to FIGS. 1 through 3.

In the present embodiment, a semiconductor module according to the present embodiment is exemplarily employed to an inverter for driving a three-phase motor.

Figure 1:
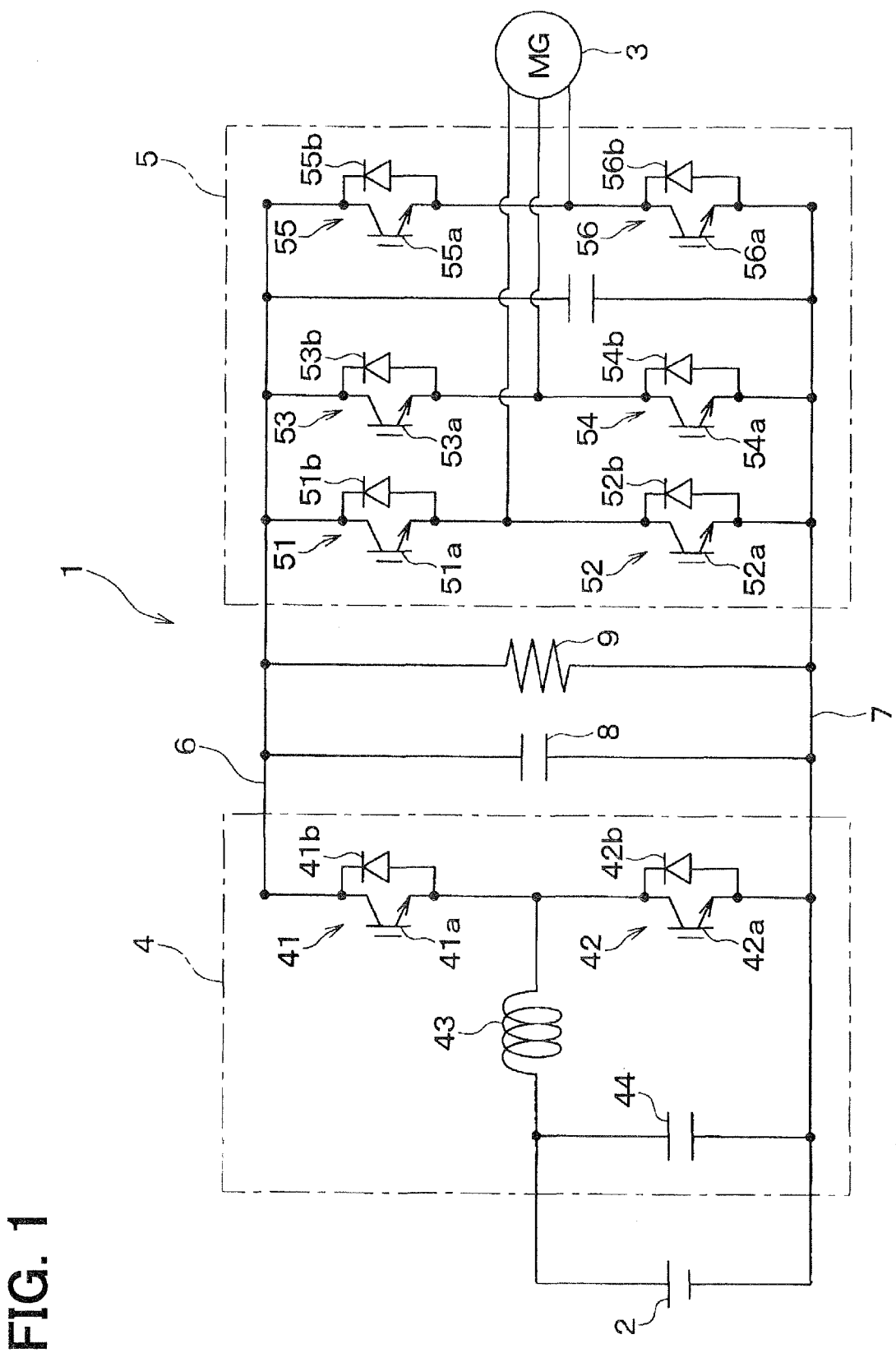
FIG. 1 is a circuit diagram of an inverter employing a semiconductor module according to a first embodiment of the present invention.

FIG. 1 is a circuit diagram of an inverter 1 in which a semiconductor module 10 of the present embodiment is employed. The inverter 1 is configured to drive a three-phase motor 3 as an electric device based on a DC power source 2. The inverter 1 includes a booster circuit 4 and an inverter output circuit 5.

The booster circuit 4 includes an upper arm 41, a lower arm 42, a reactor 43, and a capacitor 44. The upper arm 41 and the lower arm 42 are connected in series. The upper arm 41 includes an IGBT 41a and a freewheel diode (FWD) 41b, which are connected in parallel to each other. The lower arm 42 includes an IGBT 42a and a freewheel diode (FWD) 42b, which are connected in parallel with each other. A positive terminal of the DC power source 2 is connected to a middle point of the upper arm 41 and the lower arm 42 through the reactor 43. The capacitor 44 is connected in parallel with the DC power source 2, on an upstream side of the reactor 43.

In the booster circuit 4, the reactor 43 charges energy based on power supply from the DC power source 2 in a condition where the IGBT 41a is in an off state and the IGBT 42a is in an on state. For example, the DC power source 2 is a 200V-series battery generating the voltage of 288V. The reactor 43 is charged with energy by such a high voltage.

When the IGBT 41a is set to an on state and the IGBT 42a is set to an off state, the energy charged in the reactor 43 is applied to a power supply line 6 of the inverter output circuit 5 as a power source voltage larger than power of the DC power source 2. By alternately repeating the on and off switching of the IGBTs 41a, 42a, a fixed power source voltage can be supplied to the inverter output circuit 5.

The inverter 1 further includes a capacitor 8 and a resistor 9 between the booster circuit 4 and the inverter output circuit 5. The capacitor 8 and the resistor 9 are connected in parallel with each other between the power supply line 6 and a GND line 7. The capacitor 8 is a smoothing capacitor, and is employed to generate a fixed power source voltage by reducing ripples and an effect of noise generated in switching the IGBTs 41a, 42a. The resistor 9 is a discharging resistor, and is employed to consume the energy charged in the capacitor 8 when the IGBT 41a is in the off state.

The inverter output circuit 5 includes three phases connected in parallel with each other. Each phase includes an upper arm 51, 53, 55 and a lower arm 52, 54, 56 connected in series. The inverter output circuit 5 orderly applies midpoint potentials between the upper arms 51, 53, 55 and the lower arms 52, 54, 56 to a U-phase, a V-phase and a W-phase of the three-phase motor 3.

Each of the upper and lower arms 51 through 56 is provided with an IGBT 51a, 52a, 53a, 54a, 55a, 56a and a FWD 51b, 52b, 53b, 54b, 55b, 56b. Three-phase alternate currents, which have different cycles, are supplied to the three-phase motor 3 by controlling on and off states of the IGBTs 51a through 56a. In this way, the inverter 1 drives the three-phase motor 3.

For example, a semiconductor chip constituting the upper arm and a semiconductor chip constituting the lower arm are packaged into a semiconductor module. Such a semiconductor module is referred to as a 2 in 1 package structure. The semiconductor module 10 of the present embodiment is employed to such a semiconductor module. That is, the semiconductor module 10 of the present embodiment is employed to a semiconductor module composed of the upper arm 41 and the lower arm 42 of the booster circuit 4 and/or any of a semiconductor module composed of the upper arm 51 and the lower arm 52, a semiconductor module composed of the upper arm 53 and the lower arm 54, and a semiconductor module composed of the upper arm 55 and the lower arm 56.

Figure 2:
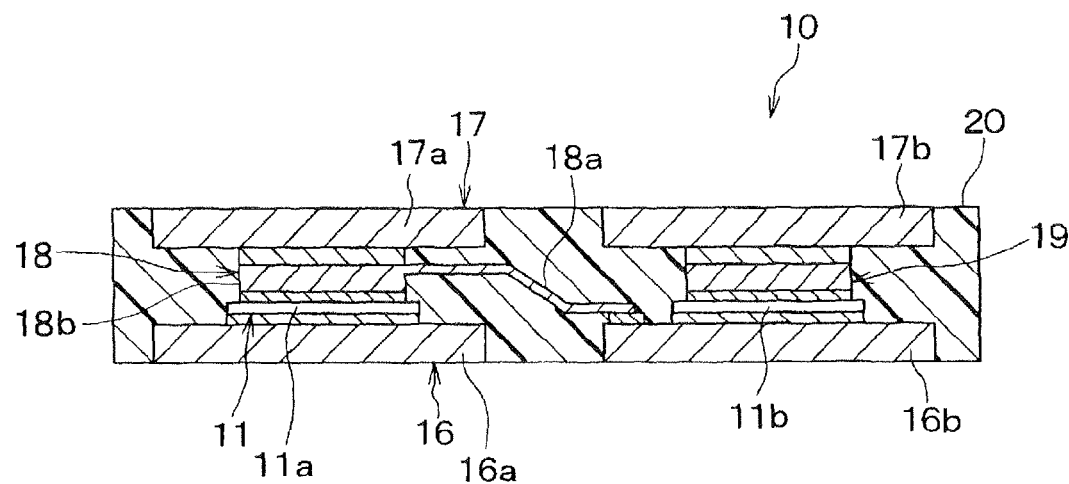
FIG. 2 is a cross-sectional view of the semiconductor module according to the first embodiment.

FIG. 2 is a cross-sectional view of the semiconductor module 10. FIG. 3 is a schematic plan view of the semiconductor module 10 before being molded with a resin, for illustrating a layout of components. FIG. 2 also corresponds to a cross-sectional view taken along a line II-II in FIG. 3 in a condition where the semiconductor module 10 is molded with a resin. Although FIG. 3 is not a cross-sectional view, some portions are hatched for the sake of clarity. Hereinafter, a structure and a manufacturing method of the semiconductor module 10 will be described with reference to FIGS. 2 and 3.

The semiconductor module 10 includes a semiconductor chip 11, leads 12, 13, 14, control terminals 15, a lower heat sink 16, an upper heat sink 17, and terminals 18, 19. The components 11 through 19 are integrally molded with a resin, such as a resin mold part 20.

For example, the semiconductor chip 11 is connected on the lower heat sink 16 through a solder or the like, and the leads 12 through 14 are connected to the lower and upper heat sinks 16, 17. Then, the terminals 18, 19 are connected on the semiconductor chip 11 through a solder or the like. Further, the upper heat sink 17 is connected on the terminals 18, 19 through a solder or the like. Then, this connected unit is integrally molded with the resin mold part 20.

The semiconductor chip 11 is provided with elements forming the upper and lower arms 41, 42, 51 through 56. The semiconductor chip 11 includes a semiconductor chip 11a (e.g., first semiconductor chip) and a semiconductor chip 11b (e.g., second semiconductor chip). The semiconductor chips 11a, 11b have the same basic structure. One of the semiconductor chips 11a, 11b constitutes the upper arm 41, 51, 53, 55 and the other of the semiconductor chips 11a, 11b constitutes the lower arm 42, 52, 54, 56.

For example, the semiconductor chip 11a, which is on a left side in FIG. 2, provides the upper arm 41, 51, 53, 55, and the semiconductor chip 11b, which is on a right side in FIG. 2, provides the lower arm 42, 52, 54, 56. In the present embodiment, the IGBT 41a, 42a, 51a through 56a and the FWD 41b, 42b, 51b through 56b formed in the semiconductor chips 11a, 11b are constructed as vertical-type elements that allow the electric current in a direction perpendicular to a substrate. Various pads are formed on a front surface and a rear surface of each of the semiconductor chips 11a, 11b.

For example, a pad connected to a gate of the IGBT 41a, 42a, 51a through 56a for controlling the semiconductor power element is formed on the front surface of each semiconductor chip 11a, 11b. Further, a pad connected to an emitter of the IGBT 41a, 42a, 51a through 56a and an anode of the FWD 41b, 42b, 51b through 56b is formed on the front surface of each semiconductor chip 11a, 11b. A pad connected to a collector of the IGBT 51a through 56a and a cathode of the FWD 41b, 42b, 51b through 56b is formed over an entire rear surface of each the semiconductor chip 11a, 11b.

The leads 12 through 14 are formed by pressing (e.g., stamping) from a single metal plate. The lead 12 corresponds to a positive electrode lead 12, the lead 13 corresponds to a middle lead (e.g., output lead), and the lead 14 corresponds to a negative electrode lead. The positive electrode lead 12 serves as a terminal connected to the power supply line 6 or the like. The negative electrode lead 14 serves as a terminal connected to the GND line 7. The middle lead 13 is connected to an optimal position of a midpoint potential line connecting between the upper arm 41, 51, 53, 55 and the lower arm 42, 52, 54, 56 to be connected to the three-phase motor 3.

The positive electrode lead 12 is connected to the rear surface of the semiconductor chip 11a through a heat sink 16a. That is, the positive electrode lead 12 is connected to the collector of the IGBT 41a, 51a, 53a, 55a and the cathode of the FWD 41b, 51b, 53b, 55b of the upper arm 41, 51, 53, 55 through the heat sink 16a. An end of the positive electrode lead 12 is bonded to the front surface of the heat sink 16a by soldering, welding or the like, and an opposite end of the positive electrode lead 12 is exposed from the resin mold part 20 to be connected to the power supply line 6 or the like.

The middle lead 13 is connected to the front surface of the semiconductor chip 11a through a heat sink 17a and the terminal 18. That is, the middle lead 13 is connected to the emitter of the IGBT 41a, 51a, 53a, 55a and the anode of the FWD 41b, 51b, 53b, 55b of the upper arm 41, 51, 53, 55 through the heat sink 17a and the terminal 18. An end of the middle lead 13 is bonded to the rear surface of the heat sink 17a by soldering, welding or the like, and an opposite end of the middle lead 13 is exposed from the resin mold part 20 to be connected to the three-phase motor 3.

The negative electrode lead 14 is connected to the front surface of the semiconductor chip 11b through a heat sink 17b. That is, the negative electrode lead 14 is connected to the emitter of the IGBT 42a, 52a, 54a, 56a and the anode of the FWD 42b, 52b, 54b, 56b of the lower arm 42, 52, 54, 56 through the heat sink 17b. An end of the negative electrode lead 14 is connected to the rear surface of the heat sink 17b, and an opposite end of the negative electrode lead 14 is exposed from the resin mold part 20 to be connected to the GND line 7 or the like.

The control terminals 15 serve as gate wirings of the IGBT 41a, 42a, 51a through 56a. Ends of the control terminals 15 are connected to the pads formed on the front surface of the semiconductor chips 11a, 11b through bonding wires 22 to be electrically connected to the gates of the IGBT 41a, 42a, 51a through 56a. The opposite ends of the control terminals 15, which are opposite to the semiconductor chips 11a, 11b, are exposed from the resin mold part 20 to be electrically connected to external devices.

The lower heat sink 16 includes the heat sink 16a connected to the semiconductor chip 11a and the heat sink 16b connected to the semiconductor chip 11b. The heat sink 16a is exposed from the resin mold part 20 on a side opposite to the semiconductor chip 11a for radiating heat from the semiconductor chip 11a. Likewise, the heat sink 16b is exposed from the resin mold part 20 on a side opposite to the semiconductor chip 11b for radiating heat from the semiconductor chip 11b.

The upper heat sink 17 includes the heat sink 17a for the upper arm and the heat sink 17b for the lower arm. The heat sink 17a is disposed opposite to the semiconductor chip 11a with respect to the terminal 18. The heat sink 17a is connected to the semiconductor chip 11a through the terminal 18. The heat sink 17b is disposed opposite to the semiconductor chip 11b with respect to the terminal 19. The heat sink 17b is connected to the semiconductor chip 11b through the terminal 19.

The heat sink 17a is exposed from the resin mold part 20 on a side opposite to the semiconductor chip 11a for radiating heat from the semiconductor chip 11a. Likewise, the heat sink 17b is exposed from the resin mold part 20 on a side opposite to the semiconductor chip 11b for radiating heat from the semiconductor chip 11b. The heat sinks 16a, 16b, 17a, 17b are larger than the semiconductor chips 11a, 11b for widely diffusing the heat from the semiconductor chips 11a, 11b, thereby facilitating heat radiation.

The terminals 18, 19 are disposed between the semiconductor chips 11a, 11b and the upper heat sinks 17a, 17b. The terminals 18, 19 serve as spacers for keeping distances between the semiconductor chips 11a, 11b and the upper heat sink 17 at a predetermined distance. Thus, the control terminals 15 can be connected to the pads disposed on the front surfaces of the semiconductor chips 11a, 11b through the bonding wires 22 while avoiding the bonding wires 22 from contacting the heat sink 17.

Each of the terminals 18, 19 typically has a size corresponding to the size of the pad formed on each of the semiconductor chips 11a, 11b, the pad being connected to the emitter of the IGBT 41a, 42a, 51a through 56a and the anode of the FWD 41b, 42b, 51b through 56b. Further, the thickness of the portion of the terminals 18, 19 corresponding to the semiconductor chips 11a, 11b is increased. In the present embodiment, however, the terminal 18 is provided by an oddly-shaped member due to having a connecting part 18a. That is, the terminals 18, 19 have different shapes.

That is, the terminal 18 includes a terminal body portion 18b connected to the semiconductor chip 11a and the connecting part 18a extending from the terminal body portion 18b, while the terminal 19 has the shape corresponding to the pad of the semiconductor chip 11b. Further, the thickness of the terminal body portion 18b is greater than the thickness of the connecting part 18a.

In the present embodiment, the connecting part 18a for connecting between the upper arm 41, 51, 53, 55 and the lower arm 42, 52, 54, 56 is provided by the terminal 18 connected to the semiconductor chip 11a. That is, the terminal 18 also serves to connect between the upper arm 41, 51, 53, 55 and the lower arm 42, 52, 54, 56.

For example, the connecting part 18a extends from the terminal body portion 18b toward the semiconductor chip 11b of the lower arm, then is inclined relative to the terminal body portion 18b to be connected to the front surface of the heat sink 16b. That is, the connecting part 18a includes a straight section parallel to the terminal body portion 18b, an inclined section inclined relative to the terminal body portion 18b and an end section connected to the front surface of the heat sink 16b. In this way, the terminal 18 is provided with the connecting part 18a for connecting between the upper arm 41, 51, 53, 55 and the lower arm 42, 52, 54, 56. Therefore, it is not necessary to employ a separate connecting part.

To form the resin mold part 20, the aforementioned components are placed in a molding die, and then resin is injected into the molding die to mold the components. The aforementioned components except for the respective exposed portions of the leads 12 through 14 and control terminals 15 are covered with the mold resin part 20. Thus, the semiconductor chip 11 and the like are protected by the resin mold part 20.

The semiconductor module 10 having the aforementioned structure is manufactured in the following manner.

First, the leads 12 through 14 are prepared. For example, the leads 12 through 14 are formed from a metal plate such as by pressing. Next, the positive electrode lead 12 is connected to the heat sink 16a by soldering, welding or the like. The connecting part 18a is connected to the heat sink 16b by soldering, welding or the like. Then, the semiconductor chips 11a, 11b are bonded on the heat sinks 16a, 16b, respectively, through solder or the like.

Thereafter, the terminal body portion 18b is bonded on the semiconductor chip 11a through solder or the like, and the terminal 19 is bonded on the semiconductor chip 11b through solder or the like. The connecting part 18a may be bonded with the heat sink 16b at this time.

The control terminals 15 are connected to the pads on the semiconductor chips 11a, 11b, which are connected to the gates of the IGBT 41a, 42a, 51a through 56a, through the bonding wires 22. Further, the heat sinks 17a, 17b are bonded on the terminals 18, 19 through solder or the like. Also, the middle lead 13 and the heat sink 17a are bonded with each other, and the negative electrode lead 14 and the heat sink 17b are bonded with each other. It is noted that, in FIG. 3, the terminals 18, 19 are hatched with thin lines, and bonding portions between the leads 12 through 14 and the heat sinks 16, 17 and the bonding portion between the connecting part 18a and the heat sink 17 are hatched with thick lines.

Then, the components fixed in the above manner are placed in the molding die (not shown) in that condition, and the resin is injected into the molding die. Thus, the components are covered with the resin mold part 20. In this way, the semiconductor module 10 is produced.

In the semiconductor module 10 according to the present embodiment, the terminal 18, which is provided for spacing the semiconductor chip 11a and the heat sink 17a by a predetermined distance, has the connecting part 18a. That is, the connecting part 18a for connecting between the upper arm 41, 51, 53, 55 and the lower arm 42, 52, 54, 56 and the terminal body portion 18b as the spacer are provided by the single terminal 18. Therefore, the number of components reduces, as compared with a case where the connecting part for connecting the upper arm and the lower arm is provided by a separate member.

In such a structure, the upper arm 41, 51, 53, 55 and the lower arm 42, 52, 54, 56 are connected to each other at a single location. That is, the upper arm 41, 51, 53, 55 and the lower arm 42, 52, 54, 56 can be connected to each other only by connecting the end of the connecting part 18a to the heat sink 16b. Therefore, the number of connecting portions can be reduced, and hence the manufacturing process of the semiconductor module 10 can be simplified.

Further, the semiconductor module 10 can be manufactured only by stacking the components on top of another. Accordingly, the manufacturing process is further simplified. Since the terminals 18, 19 and the heat sinks 17a, 17b are separate components, dimensional tolerance due to the thickness of the heat sinks 16, 17 or the like can be absorbed by portions connecting between the terminals 18, 19 and the heat sinks 17a, 17b.

The connecting part 18a is bent into a predetermined shape to be connected to the heat sink 16b. That is, the connecting part 18a is partly inclined relative to the terminal body portion 18b to be connected to the heat sink 16b. In such a structure, the upper arm 41, 51, 53, 55 and the lower arm 42, 52, 54, 56 are connected to each other without increasing the area of the heat sinks 16b, 17a. That is, it is not necessary to enlarge or project ends of the upper heat sink 17a and the lower heat sink 16b beyond the lower heat sink 16a and the upper heat sink 17b. Therefore, the increase in the area of the heat sinks 17a, 16b is restricted, and hence the increase in overall size of the semiconductor module 10 due to the increase in the area of the heat sinks 17a, 16b is restricted.

Because the heat sinks 16a, 17b have different potential from that of the connecting part 18a, it is necessary to space between the heat sinks 16a, 17b and the connecting part 18a so as to avoid contact between the connecting part 18a and the heat sinks 16a, 17b. In the structure where the connecting part 18a is inclined, the distance between the heat sinks 16a, 17b and the connecting part 18a is easily ensured.

Second Embodiment

A second embodiment will be described with reference to FIG. 4. In the semiconductor module 10 according to the present embodiment, the structure of the connecting part 18*a* is modified from that of the first embodiment. Other structures are similar to those of the first embodiment, and thus a different structure will be mainly described hereinafter.

Figure 4:
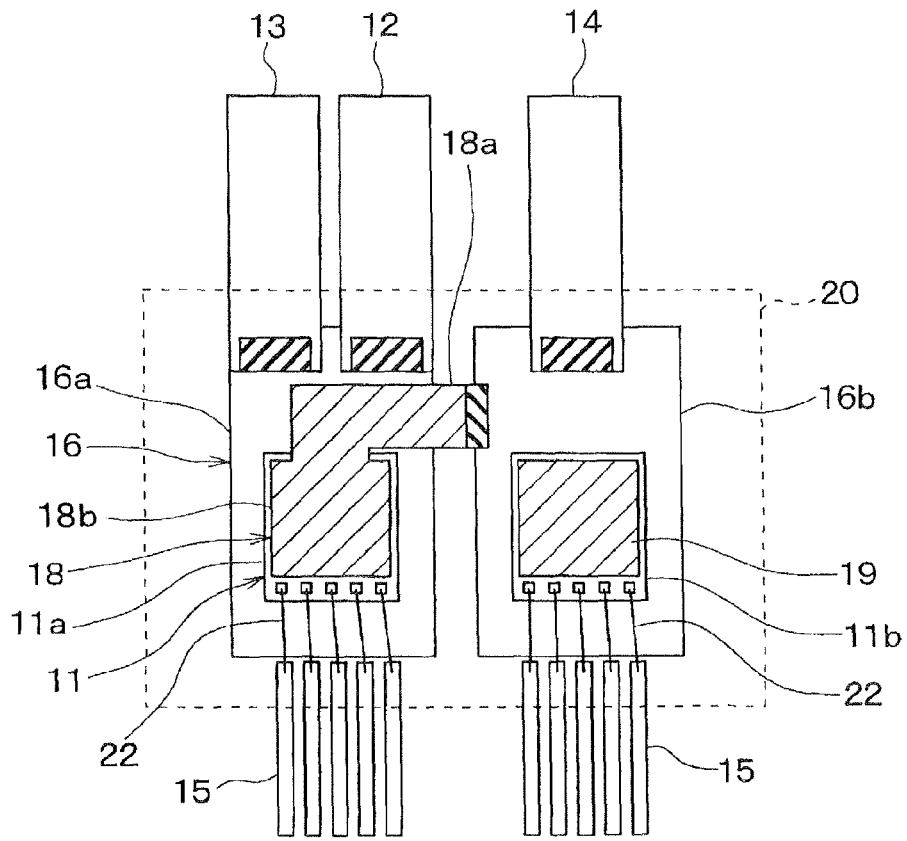
FIG. 4 is a schematic plan view of a semiconductor module, before being molded with a resin, according to a second embodiment of the present invention.

FIG. 4 is a schematic plan view of the semiconductor module 10, before being molded with the resin, for illustrating the layout of the components. Although FIG. 4 is not a cross-sectional view, some portions are hatched for the sake of clarity. For example, the terminals 18, 19 are hatched with thin lines, and the bonding portions between the leads 12 through 14 and the heat sinks 16, 17 and the bonding portion between the connecting part 18*a* and the heat sink 16*b* are hatched with thick lines.

Figure 3:
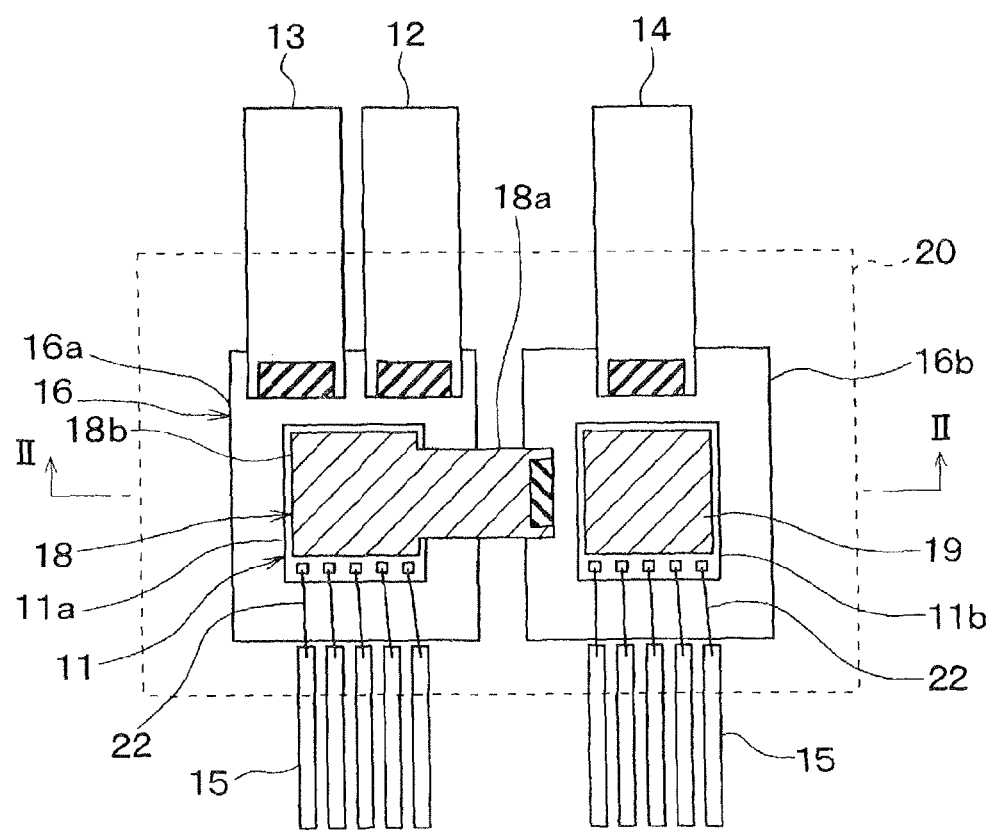
FIG. 3 is a schematic plan view of the semiconductor module, before being molded with a resin, according to the first embodiment.

As shown in FIG. 4, the connecting part 18*a* is arranged in a different manner from that of the first embodiment shown in FIG. 3. In the first embodiment shown in FIG. 3, the connecting part 18*a* extends from the terminal body portion 18*b* toward the semiconductor chip 11*b* of the lower arm 42, 52, 54, 56. In the present embodiment, the connecting part 18*a* is not arranged on a line passing through the semiconductor chips 11*a*, 11*b*, but arranged adjacent to the middle lead 13. In other words, the connecting part 18*a* is arranged between the terminal body portion 18*b* and the middle lead 13, that is, above the semiconductor chip 11*a* in FIG. 4. Further, the connecting part 18*a* is connected to the heat sink 16*b* at a location away from the line passing through the semiconductor chips 11*a*, 11*b*, that is, above the semiconductor chip 11*b* in FIG. 4.

In this case, it is not necessary to provide a space for connecting the connecting part 18*a* to the heat sink 16*b* on the line passing through the semiconductor chips 11*a*, 11*b*. Therefore, the width of the heat sink 17*a*, which corresponds to a dimension along a direction in which the semiconductor chips 11*a*, 11*b* are arranged, such as a right and left direction in FIG. 4, can be reduced.

Third Embodiment

A third embodiment will be described with reference to FIG. 5. In the semiconductor module 10 according to the present embodiment, the structure of the connecting part 18*a* is modified from that of the first and second embodiments. Other structures are similar to those of the first and second embodiments, and thus a different structure will be mainly described hereinafter.

Figure 5:
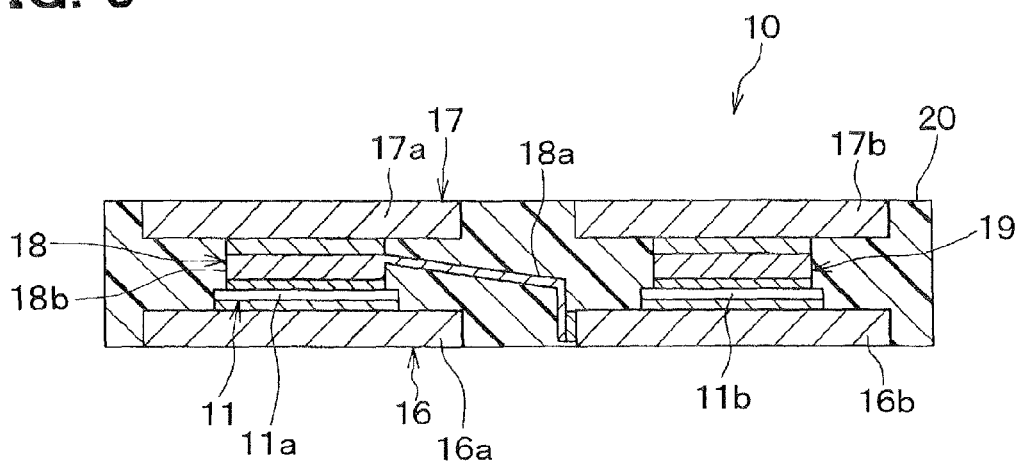
FIG. 5 is a cross-sectional view of a semiconductor module according to a third embodiment of the present invention.

FIG. 5 is a cross-sectional view of the semiconductor module 10. In the first and second embodiments, the connecting part 18*a* is partly inclined relative to the terminal body portion 18*b* and connected to the front surface of the heat sink 16*b*. In the present embodiment, the connecting part 18*a* is bent, that is, inclined relative to the terminal body portion 18*b*, and the end of the connecting part 18*a* is connected to the side surface of the heat sink 16*b*.

In this way, the end of the connecting part 18*a* can be connected to the side surface of the heat sink 16*b*. In this case, the dimensional tolerance of the connection between the upper arm 41, 51, 53, 55 and the lower arm 42, 52, 54, 56 can be absorbed with respect to a direction parallel to the semiconductor chips 11*a*, 11*b*, not in the direction of the normal to the semiconductor chips 11*a*, 11*b*.

Fourth Embodiment

A fourth embodiment will be described with reference to FIG. 6. In the semiconductor module 10 according to the present embodiment, the terminal 18 including the connecting part 18*a* is integral with the middle lead 13. Other structures are similar to those of the first and second embodiments, and a different structure will be mainly described hereinafter.

Figure 6:
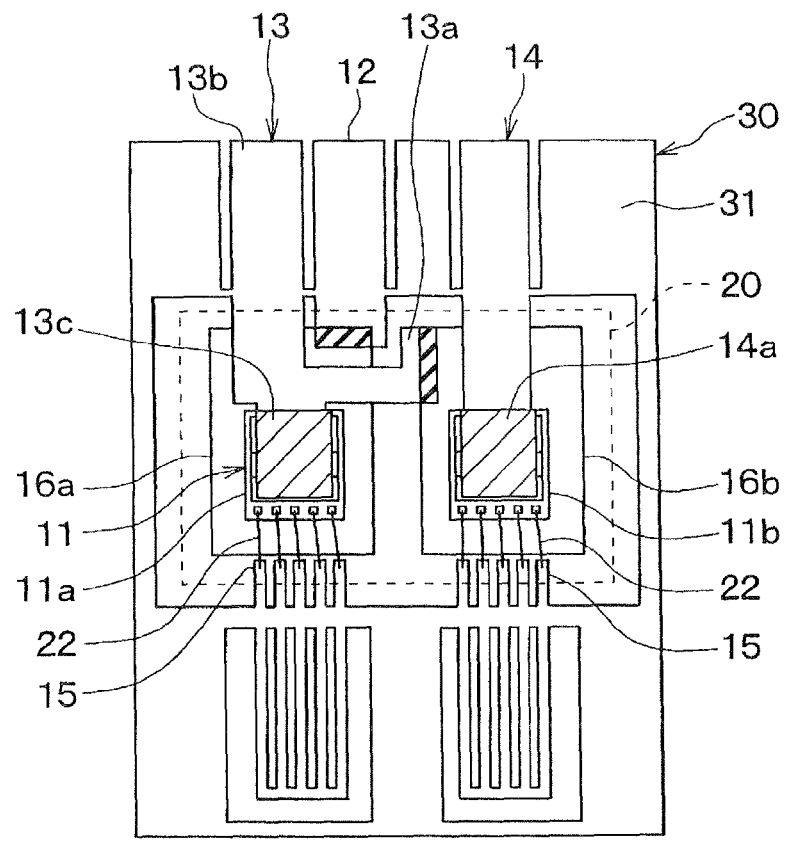
FIG. 6 is a schematic plan view of a semiconductor module, before being molded with a resin, according to a fourth embodiment of the present invention.

FIG. 6 is a schematic plan view of the semiconductor module 10, before being molded with the resin, for illustrating the layout of components. Although FIG. 6 is not a cross-sectional view, some portions are hatched for the sake of clarity.

As shown in FIG. 6, the middle lead 13 includes a connecting part 13*a*, an output terminal portion 13*b* and a terminal body portion 13*c*. That is, the middle lead 13 is configured to serve as the connecting part, the output terminal and the terminal body portion. In other words, the terminal 18 and the connecting part 18*a* of the first and second embodiments are integrated with the middle lead 13. Likewise, the negative electrode lead 14 includes a terminal 14*a*. That is, the terminal 19 of the first and second embodiment is integrated with the negative electrode lead 14.

Specifically, the middle lead 13 is directly connected to the semiconductor chip 11*a*, and the negative electrode lead 14 is directly connected to the semiconductor chip 11*b*. The middle lead 13 is connected to the semiconductor chip 11*a* at the terminal body portion 13*c*. The negative electrode lead 14 is connected to the semiconductor chip 11*b* at the terminal body portion 14*a*. The thickness of the terminal body portion 13*c* is greater than the thickness of the remaining portion of the middle lead 13. Likewise, the thickness of the terminal body portion 14*a* is greater than the thickness of the remaining portion of the negative electrode lead 14. By increasing the thickness of the terminal body portions 13*c*, 14*a* greater than the remaining portions of the middle lead 13 and the negative electrode lead 14, the heat sink 16 is held at a predetermined distance from the semiconductor chips 11*a*, 11*b*. In FIG. 6, the terminal body portions 13*c*, 14*a* are hatched with thin lines.

The connecting part 13*a* and the output terminal portion 13*b* extend from the terminal body portion 13*c*. A lead portion of the negative electrode lead 14 extends from the terminal body portion 14*a*. The leads 12 through 14 may be formed from a metal plate having a thick portion at a location corresponding to the terminal body portions 13*c*, 14*a*. Alternatively, the leads 12 through 14 may be formed by pressing a metal plate with an even thickness once, and then metal pieces having the size corresponding to the terminal body portions 13*c*, 14*a* may be bonded with the metal plate such as by welding to form the terminal body portions 13*c*, 14*a*.

That is, in the aforementioned structure, the middle lead 13 and the negative electrode lead 14 are directly connected to the semiconductor chips 11*a*, 11*b*, and thus the middle lead 13 and the negative electrode lead 14 also have functions as metal blocks that are usually disposed between the semiconductor chips and the heat sinks.

Further, the connecting part 13*a* and the output terminal portion 13*b* are formed as extensions extending from the terminal body portion 13*c*. The connecting part 13*a* and the output terminal portion 13*b* diverge from the terminal body portion 13*c* on a side opposite to the control terminals 15 with respect to the terminal body portion 13*c*. Therefore, the middle lead 13 can be connected to the heat sink 16 to which the rear surface of the semiconductor chip 11*b* is connected at the connecting part 13*a* as well as to the three-phase motor 3 through the output terminal portion 13*b*.

In other words, the middle lead 13 is an oddly-shaped member in which the connecting part 13*a* for connecting between the upper arm 41, 51, 53, 55 and the lower arm 42, 52, 54, 56, the output terminal portion 13*b* to be connected to the three-phase motor 3 and the terminal body portion 13*c* serving as the metal block are integrated. The connecting part 13a for connecting between the upper arm 41, 51, 53, 55 and the lower arm 42, 52, 54, 56 can be provided by the single middle lead 13. It is not necessary to form the connecting part 13 by a separate member.

The semiconductor module 10 having the aforementioned structure is manufactured in the following manner.

First, the leads 12 through 14 are formed from a metal plate, such as by pressing. In this condition, as shown in FIG. 6, the leads 12 through 14 are still held in a frame portion 31 of the lead frame 30 as portions of the lead frame 30. In a case where the metal plate originally has the thick portions at locations corresponding to the terminal body portions 13c, 14a, the terminal body portions 13c, 14a are formed at a time of pressing the metal plate. In a case where the metal plate having the even thickness is used, the metal pieces having the size corresponding to the terminal body portions 13c, 14a are bonded to the corresponding locations of the pressed metal plate. Thus, the terminal body portions 13c, 14a having the larger thickness are formed.

Thereafter, the semiconductor chips 11a, 11b are bonded on the heat sinks 16a, 16b through solder or the like. Then, the middle lead 13 is bonded on the semiconductor chip 11a through solder or the like, and the negative electrode lead 14 is bonded on the semiconductor chip 11b through solder or the like. Further, the positive electrode lead 12 is connected to the heat sink 16a by soldering, welding or the like. The connecting part 13a of the middle lead 13 is connected to the heat sink 16b by soldering, welding or the like. In FIG. 6, the connecting portion between the middle lead 13 and the heat sinks 16a, 16b is hatched with thick lines.

Further, the control terminals 15 are connected to the pads of the semiconductor chips 11a, 11b, which are connected to the gates of the IGBTs 41a, 42a, 51a through 56a, through the bonding wires 22. Then, the heat sinks 17a, 17b are bonded on the middle lead 13 and the negative electrode lead 14 through solder or the like.

The components fixed in the aforementioned manner are placed in the molding die in that condition, and a resin is injected into the molding die. Thus, the components are covered with the resin mold part 20. Then, the frame portion 31 is cut from the leads 12 through 14 and the control terminals 15. In this way, the semiconductor module 10 is finished.

In the present embodiment, the middle lead 13 functions as a spacer, such as a metal block, for spacing the semiconductor chips 11a from the heat sink 17a by a predetermined distance, at a location between the semiconductor chip 11a and the heat sink 17a. That is, the middle lead 13 is the oddly shaped member. The middle lead 13 provides the connecting part 13a for connecting between the upper arm 41, 51, 53, 55 and the lower arm 42, 52, 54, 56 and the output terminal portion 13b to be connected to the three-phase motor 3, while maintaining the thickness at the terminal body portion 13c. Accordingly, the number of components can be reduced.

In addition, the upper arm 41, 51, 53, 55 and the lower arm 42, 52, 54, 56 are connected to each other at one connecting portion. That is, the upper arm 41, 51, 53, 55 and the lower arm 42, 52, 54, 56 are connected to each other by connecting the end of the connecting part 13a to the heat sink 16b. Therefore, the number of connecting portions can be reduced, and the manufacturing process of the semiconductor module 10 can be simplified.

Further, the connecting part 13a is connected to the heat sink 16b by inclining relative to the remaining portion of the middle lead 13, such as the output terminal portion 13b. Therefore, similar to the first embodiment, it is not necessary to enlarge the heat sinks 17a, 16b. Accordingly, the increase in size of the semiconductor module 10 due to the enlargement of the heat sinks 17a, 16b can be restricted.

Fifth Embodiment

A fifth embodiment will be described with reference to FIGS. 7 and 8. In the semiconductor module 10 according to the present embodiment, the structure of the semiconductor chip 11 forming the arms 41, 42, 51 through 56 is modified from that of the fourth embodiment. Other structures are similar to those of the fourth embodiment, and a different structure will be mainly described hereinafter.

Figure 7:
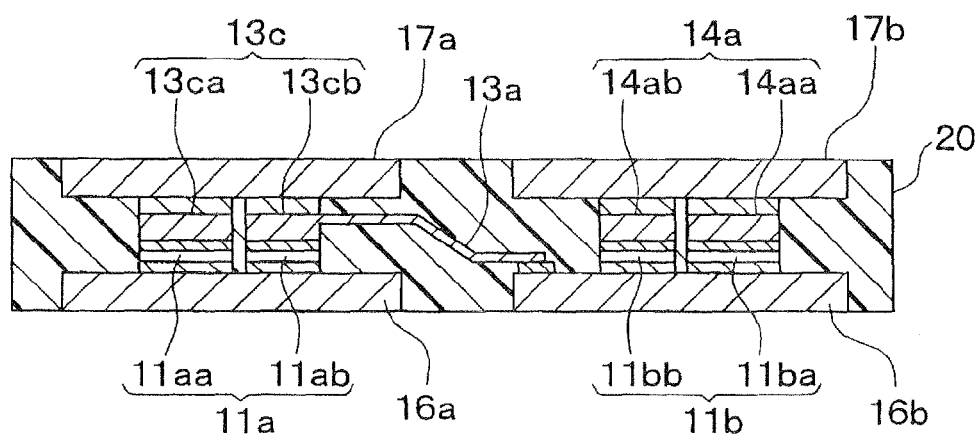
FIG. 7 is a cross-sectional view of a semiconductor module according to a fifth embodiment of the present invention.

FIG. 7 is a cross-sectional view of the semiconductor module 10. FIG. 8 is a schematic plan view of the semiconductor module 10, before being molded with a resin, for illustrating the layout of components. Also, FIG. 7 corresponds to a cross-sectional view taken along a line VII-VII in FIG. 8 after molded with the resin. Although FIG. 8 is not a cross-sectional view, some portions are hatched for the sake of clarity. For example, the terminal body portions 13c, 14a are hatched with thin lines, and the connecting portions between the leads 12, 13 and the heat sinks 16a, 16b are hatched with thick lines.

Figure 8:
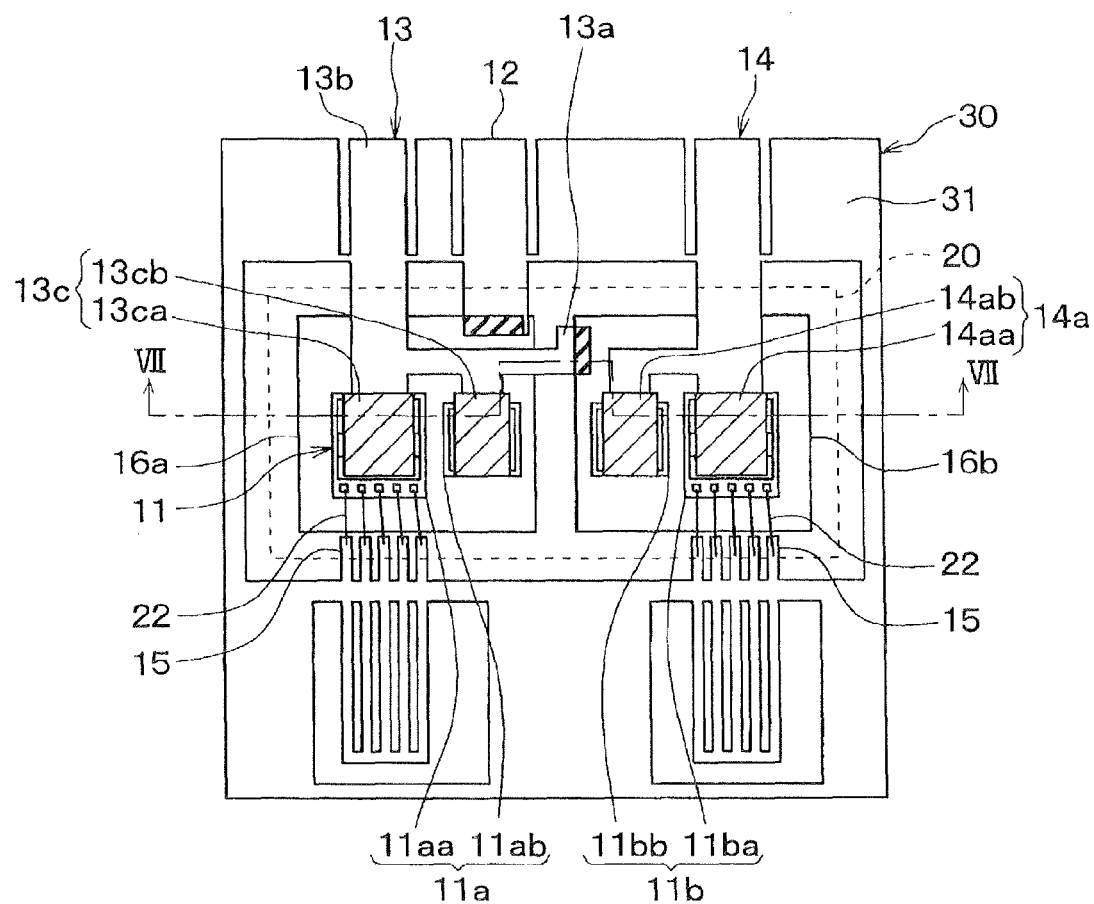
FIG. 8 is a schematic plan view of the semiconductor module, before being molded with a resin, according to the fifth embodiment.

As shown in FIGS. 7 and 8, the semiconductor chip 11 each forming the arm 41, 42, 51 through 56 is constructed of two chip portions. Specifically, the upper arm 41, 51, 53, 55 is provided by semiconductor chips 11aa, 11ab, and the lower arm 42, 52, 54, 56 is provided by semiconductor chips 11ba, 11bb. The IGBTs 41a, 42a, 51a through 56a are formed in the semiconductor chips 11aa, 11ba. The FWDs 41b, 42b, 51b through 56b are formed in the semiconductor chips 11ab, 11bb.

The middle lead 13 has two terminal body portions 13ca, 13cb. Likewise, the negative electrode lead 14 has two terminal body portions 14aa, 14ab. The terminal body portions 13ca, 13cb, 14aa, 14ab are bonded with the semiconductor chips 11aa, 11ab, 11ba, 11bb, respectively.

Also in the case where each of the semiconductor chips 11a, 11b is constructed of two chip portions 11aa, 11ab, 11ba, 11bb, the middle lead 13 can be configured to include the connecting part 13a for connecting between the upper arm 41, 51, 53, 55 and the lower arm 42, 52, 54, 56 and the output terminal portion 13b to be connected to the three-phase motor 3, and the terminal body portions 13ca, 13cb having the thickness greater than the other portions of the middle lead 13. Accordingly, the advantageous effects similar to the first embodiment can be achieved.

In the example of FIGS. 7 and 8, the semiconductor chips 11aa, 11ab of the upper arm 41, 51, 53, 55 are arranged in the right and left direction of FIGS. 7 and 8. Also, the semiconductor chips 11ba, 11bb of the lower arm 42, 52, 54, 56 are arranged in the right and left direction of FIGS. 7 and 8. That is, the semiconductor chips 11aa, 11ab, 11ba, 11bb are arranged in parallel to the arrangement direction of the upper arm 41, 51, 53, 55 and the lower arm 42, 52, 54, 56. Alternatively, the semiconductor chips 11aa, 11ab may be arranged in the up and down direction of FIGS. 7 and 8, that is, in a direction perpendicular to the arrangement direction of the upper arm 41, 51, 53, 55 and the lower arm 42, 52, 54, 56. Also, the semiconductor chips 11ba, 11bb may be arranged in the direction perpendicular to the arrangement direction of the upper arm 41, 51, 53, 55 and the lower arm 42, 52, 54, 56.

Sixth Embodiment

A sixth embodiment will be described with reference to FIG. 9. In the semiconductor module 10 according to the present embodiment, the structure of the leads 12 through 14 is modified from that of the fourth embodiment. Other structures are similar to those of the fourth embodiment, and a different structure will be mainly described.

Figure 9:
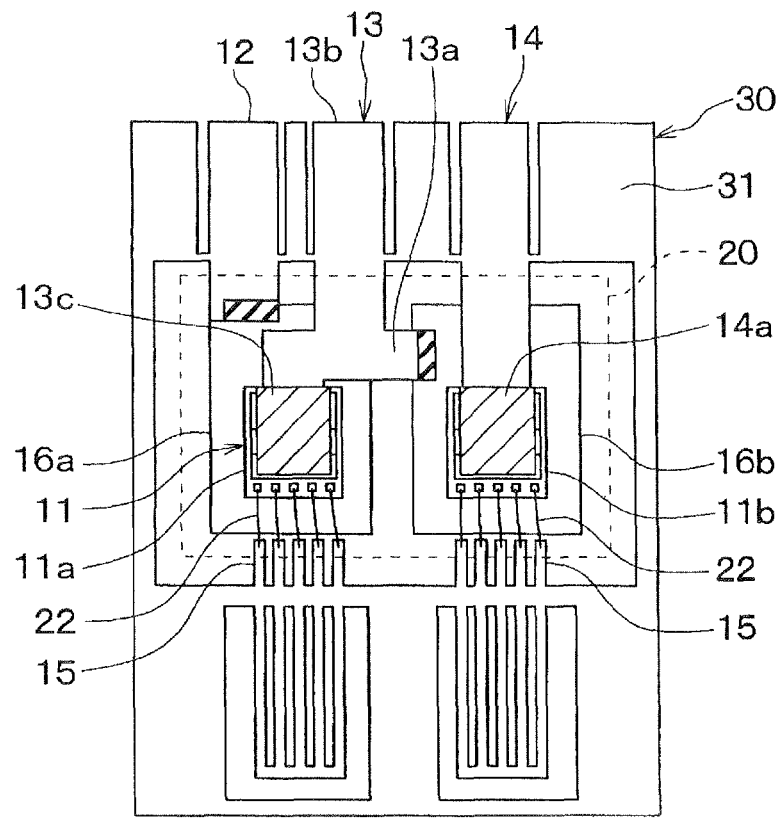
FIG. 9 is a schematic plan view of a semiconductor module, before being molded with a resin, according to a sixth embodiment of the present invention.

FIG. 9 is a schematic plan view of the semiconductor module 10, before being molded with a resin, for illustrating the layout of components. Although FIG. 9 is not a cross-sectional view, some portions are hatched for the sake of clarity. For example, the terminal body portions 13c, 14a are hatched with thin lines, and the connecting portions between the leads 12, 13 and the heat sinks 16a, 16b are hatched with thick lines.

As shown in FIG. 9, the positions of the middle lead 13 and the positive electrode lead 12 are opposite from those of the fourth embodiment. That is, in the fourth embodiment shown in FIG. 6, the positive electrode lead 12 is disposed between the middle lead 13 and the negative electrode lead 14. In the sixth embodiment shown in FIG. 9, on the other hand, the middle lead 13 is disposed between the positive electrode lead 12 and the negative electrode lead 14. The components arranged in the aforementioned manner are molded with the resin mold part 20.

In this way, the positions of the leads 12 through 14 can be changed. Also in this case, the advantageous effects similar to the fourth embodiment can be achieved.

Seventh Embodiment

A seventh embodiment will be described with reference to FIG. 10. In the semiconductor module 10 according to the present embodiment, the structure of the leads 12 through 14 is modified from that of the fourth embodiment. Other structures are similar to those of the fourth embodiment, and a different structure will be mainly described hereinafter.

Figure 10:
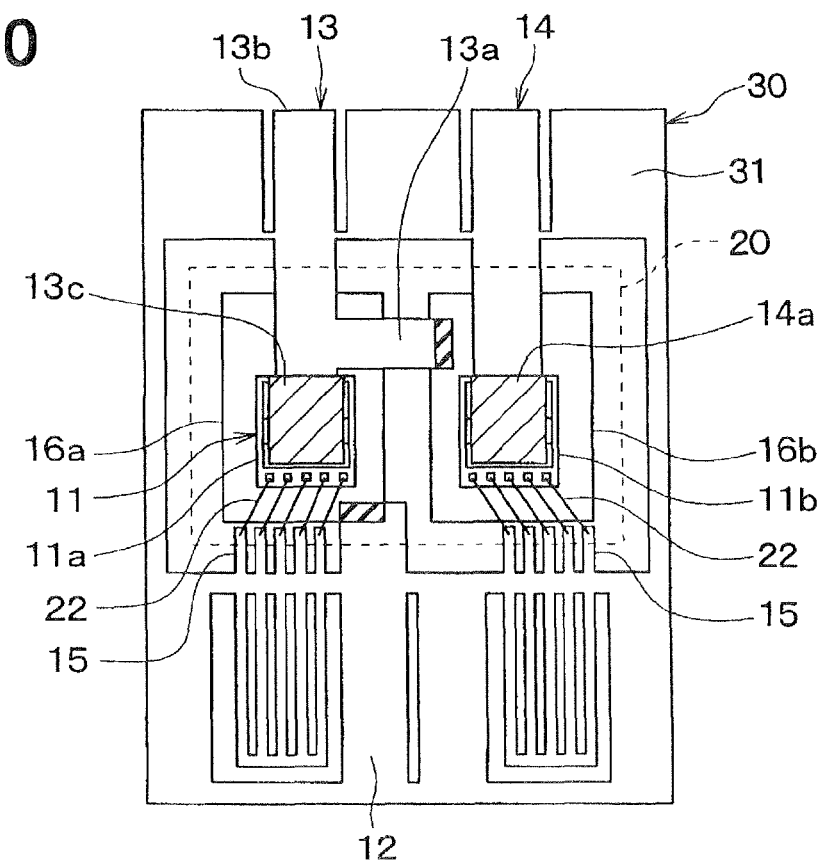
FIG. 10 is a schematic plan view of a semiconductor module, before being molded with a resin, according to a seventh embodiment of the present invention.

FIG. 10 is a schematic plan view of the semiconductor module 10, before being molded with a resin, for illustrating the layout of components. Although FIG. 10 is not a cross-sectional view, some portions are hatched for the sake of clarity. For example, the terminal body portions 13c, 14a are hatched with thin lines, and the connecting portions between the leads 12, 13 and the heat sinks 16a, 16b are hatched with thick lines.

As shown in FIG. 10, the positive electrode lead 12 is disposed opposite to the middle lead 13 and the negative electrode lead 14 with respect to the semiconductor chips 11a, 11b. That is, the positive electrode lead 12 is disposed on the same side as the control terminals 15 with respect to the semiconductor chips 11a, 11b. The components arranged in the aforementioned manner are molded with the resin mold part 20.

In this way, the leads 12 through 14 can be extended in different directions, such as in two or more different directions. Also in this case, the advantageous effects similar to those of the fourth embodiment can be achieved.

Eighth Embodiment

An eighth embodiment will be described with reference to FIG. 11. The semiconductor module 10 according to the present embodiment is constructed as a 4 in 1 package structure in which four arms constituting two phases are integrated. Other structures are similar to those of the fourth through seventh embodiments, and a different structure will be mainly described hereinafter.

Figure 11:
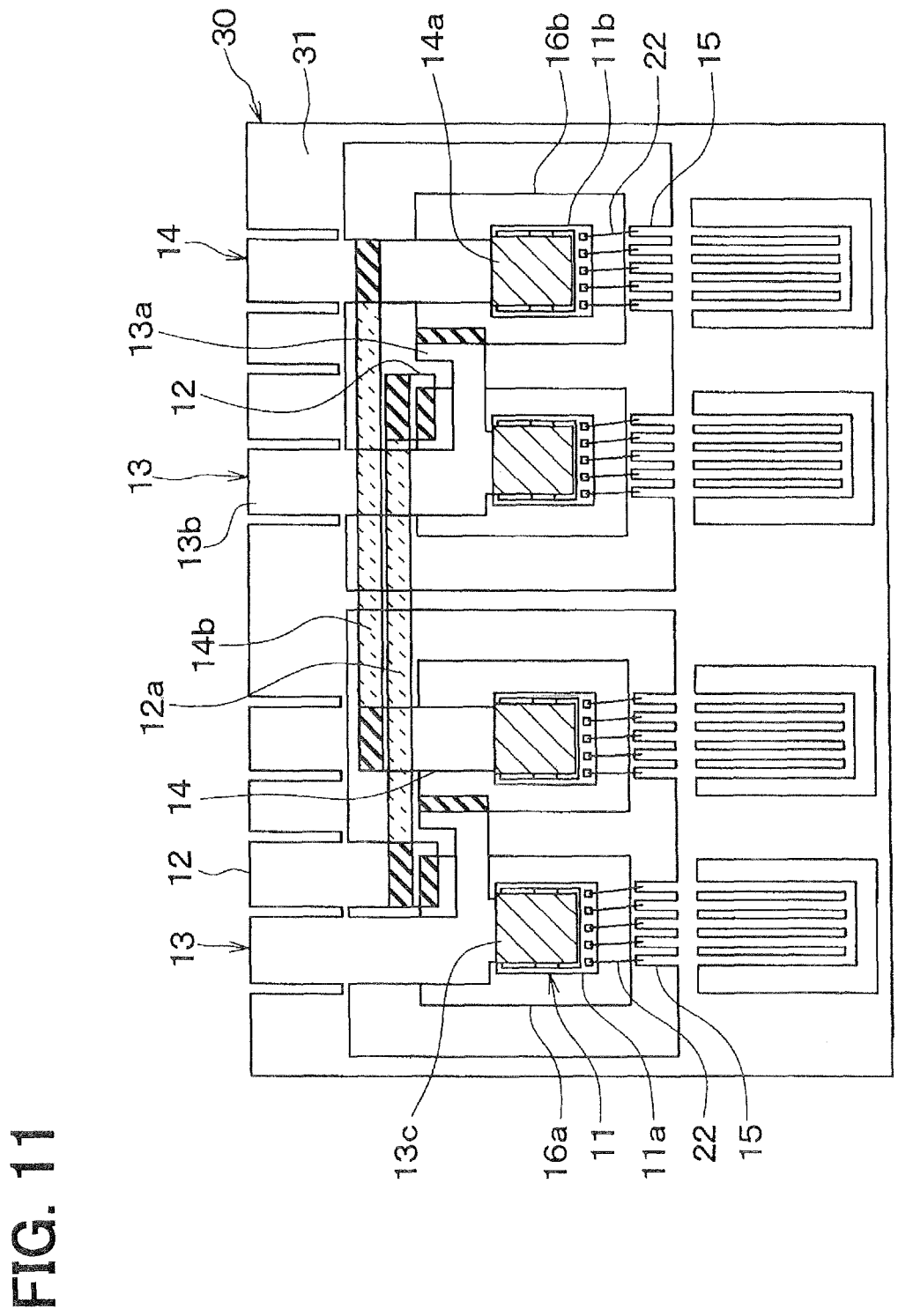
FIG. 11 is a schematic plan view of a semiconductor module, before being molded with a resin, according to an eighth embodiment of the present invention.

FIG. 11 is a schematic plan view of the semiconductor module 10, before being molded with a resin, for illustrating the layout of components. Although FIG. 11 is not a cross-sectional view, some portions are hatched for the sake of clarity. For example, the terminal body portions 13c, 14a are hatched with thin lines, and the connecting portions between the leads 12, 13 and the heat sinks 16a, 16b are hatched with thick lines.

As shown in FIG. 11, the arms 51 through 56 of two phases are included in the semiconductor module 10. That is, the semiconductor module 10 includes two phases. The positive electrode leads 12 of the two phases are coupled to each other through a coupling part 12a. Also, the negative electrode leads 14 of the two phases are coupled to each other through a coupling part 14b. The coupling parts 12a, 14b are hatched with dashed lines for the sake of clarity.

The portions where the positive electrode leads 12 and the coupling part 12a overlap correspond to the connecting portions between the positive electrode leads 12 and the coupling part 12a. Also, the portions where the negative electrode leads 14 and the coupling part 14a overlap correspond to the connecting portions between the negative electrode leads 14 and the coupling part 14a. These connecting portions are also hatched with thick lines.

Also in the case where the semiconductor module 10 is constructed as the 4 in 1 package structure, the structures similar to the above embodiments can be employed, and the advantageous effects similar to the above embodiments can be achieved. Also in this case, the lead frame 30 including the leads 12 through 14 for the four arms can be formed by pressing one metal plate at a time. Therefore, the lead frame 30 can be effectively formed.

In the example shown in FIG. 11, the component layout of the fourth embodiment shown in FIG. 6 is employed. Alternatively, the component layout of any of the fifth through seventh embodiments may be employed in the 4 in 1 package structure. In addition, the present embodiment is not limited to the inverter output circuit 5 having the three phases, but may be employed to any other circuits, such as an H-bridge circuit in which upper and lower arms for the two phases are arranged in an H-bridge shape.

Ninth Embodiment

A ninth embodiment will be described with reference to FIG. 12. The semiconductor module 10 according to the present embodiment is constructed as a 6 in 1 package structure in which six arms constituting three phases are integrated. Other structures are similar to those of the fourth through seventh embodiments, and a different structure will be mainly described hereinafter.

Figure 12:
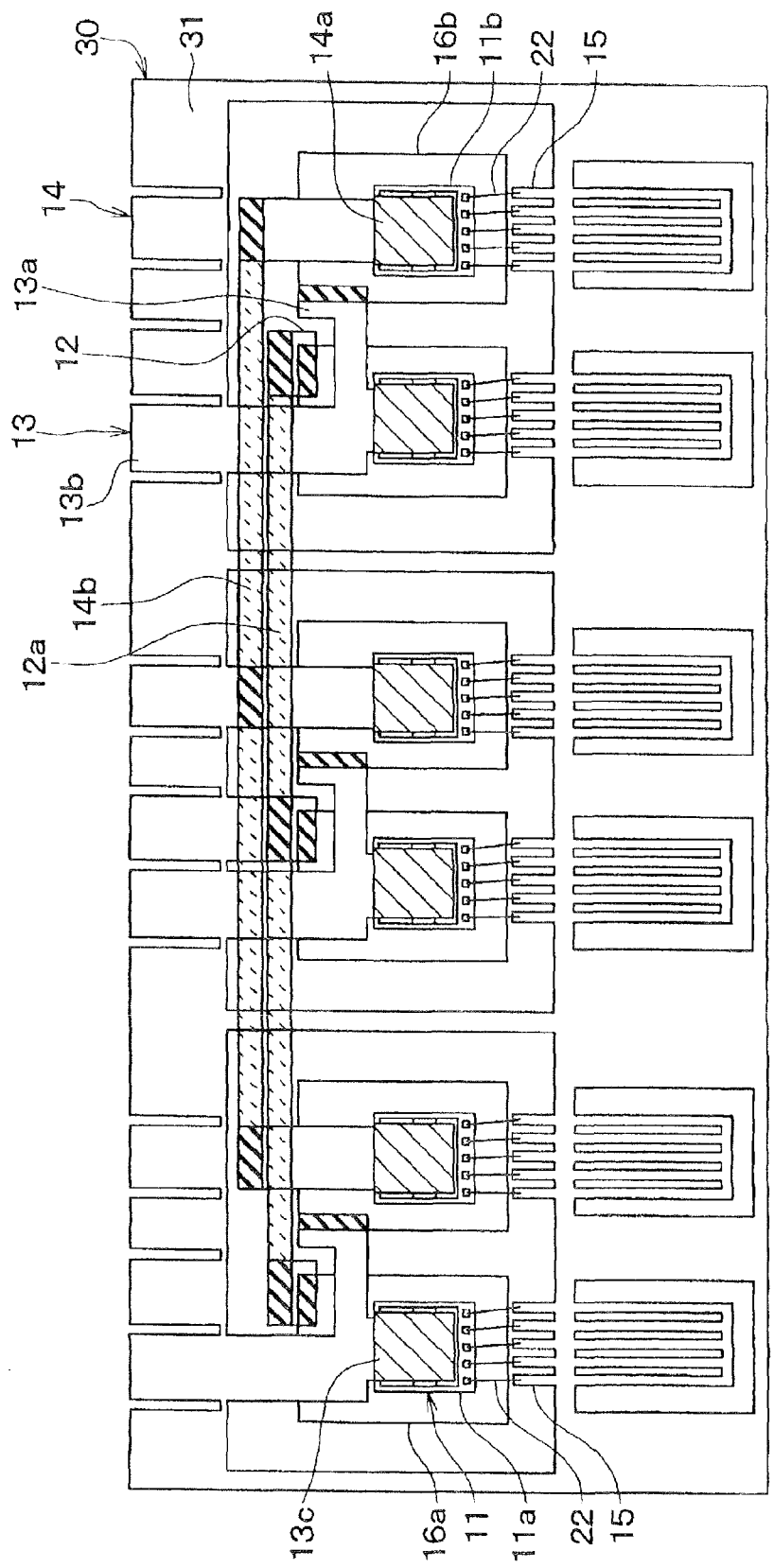
FIG. 12 is a schematic plan view of a semiconductor module, before being molded with a resin, according to a ninth embodiment of the present invention.

FIG. 12 is a schematic plan view of the semiconductor module 10, before being molded with a resin, for illustrating the layout of components. Although FIG. 12 is not a cross-sectional view, some portions are hatched for the sake of clarity. For example, the terminal body portions 13c, 14a are hatched with thin lines, and the connecting portions between the leads 12, 13 and the heat sinks 16a, 16b are hatched with thick lines.

As shown in FIG. 12, the six arms 51 through 56 for three phases are included in the semiconductor module 10. In the present embodiment, similar to the eighth embodiment, the positive electrode leads 12 of the three phases are coupled to each other through the coupling part 12a. Also, the negative electrode leads 14 of the three phases are coupled to each other through the coupling part 14b. The coupling parts 12a, 14b are hatched with dashed lines for the sake of clarity. The portions where the positive electrode leads 12 and the coupling part 12a overlap correspond to the connecting portions between the positive electrode leads 12 and the coupling part 12a. Also, the portions where the negative electrode leads 14 and the coupling part 14a overlap correspond to the connecting portions between the negative electrode leads 14 and the coupling part 14a. These coupling portions are hatched with thick lines.

Also in the case where the semiconductor module 10 is constructed as the 6 in 1 package structure, the structures similar to the above embodiments can be employed, and the advantageous effects similar to the above embodiments can be achieved. Also in this case, the lead frame 30 including the leads 12 through 14 of the six arms can be formed by pressing one metal plate at a time. Therefore, the lead frame 30 can be effectively formed.

In the example shown in FIG. 12, the component layout of the fourth embodiment shown in FIG. 6 is employed. Alternatively, the component layout of any of the fifth through seventh embodiments may be employed in the 6 in 1 package structure.

Tenth Embodiment

A tenth embodiment will be described hereinafter with reference to FIGS. 13 and 14. In the present embodiment, the lead frame 30 used in manufacturing the semiconductor module 10 is modified from that of the fourth through ninth embodiments. Other structures are similar to those of the fourth through ninth embodiments, and a different structure will be mainly described hereinafter.

Figure 13:
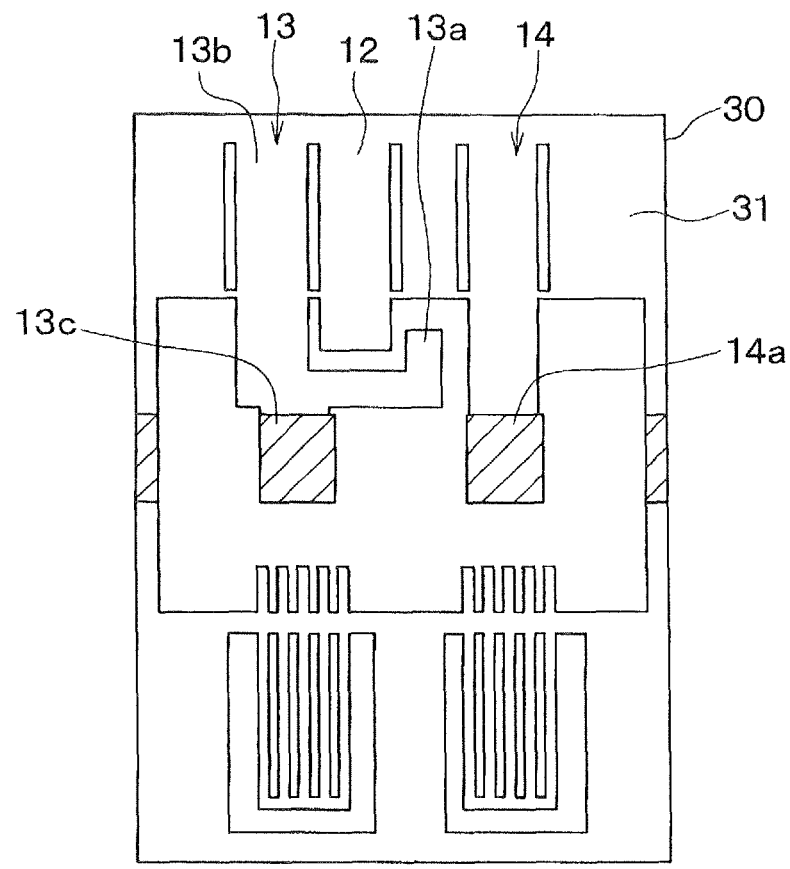
FIG. 13 is a schematic top view of a lead frame used for manufacturing a semiconductor module according to a tenth embodiment of the present invention.

FIG. 13 is a plan view of the lead frame 30 in which the leads 12 through 14 are joined with the frame portion 31. In the example of FIG. 13, the component layout of the fourth embodiment shown in FIG. 6 is exemplarily employed. FIG. 14 is a plan view of a lead frame 30 including multiple phases. FIGS. 13 and 14 are not cross-sectional views, but some portions are hatched for the sake of clarity.

Figure 14:
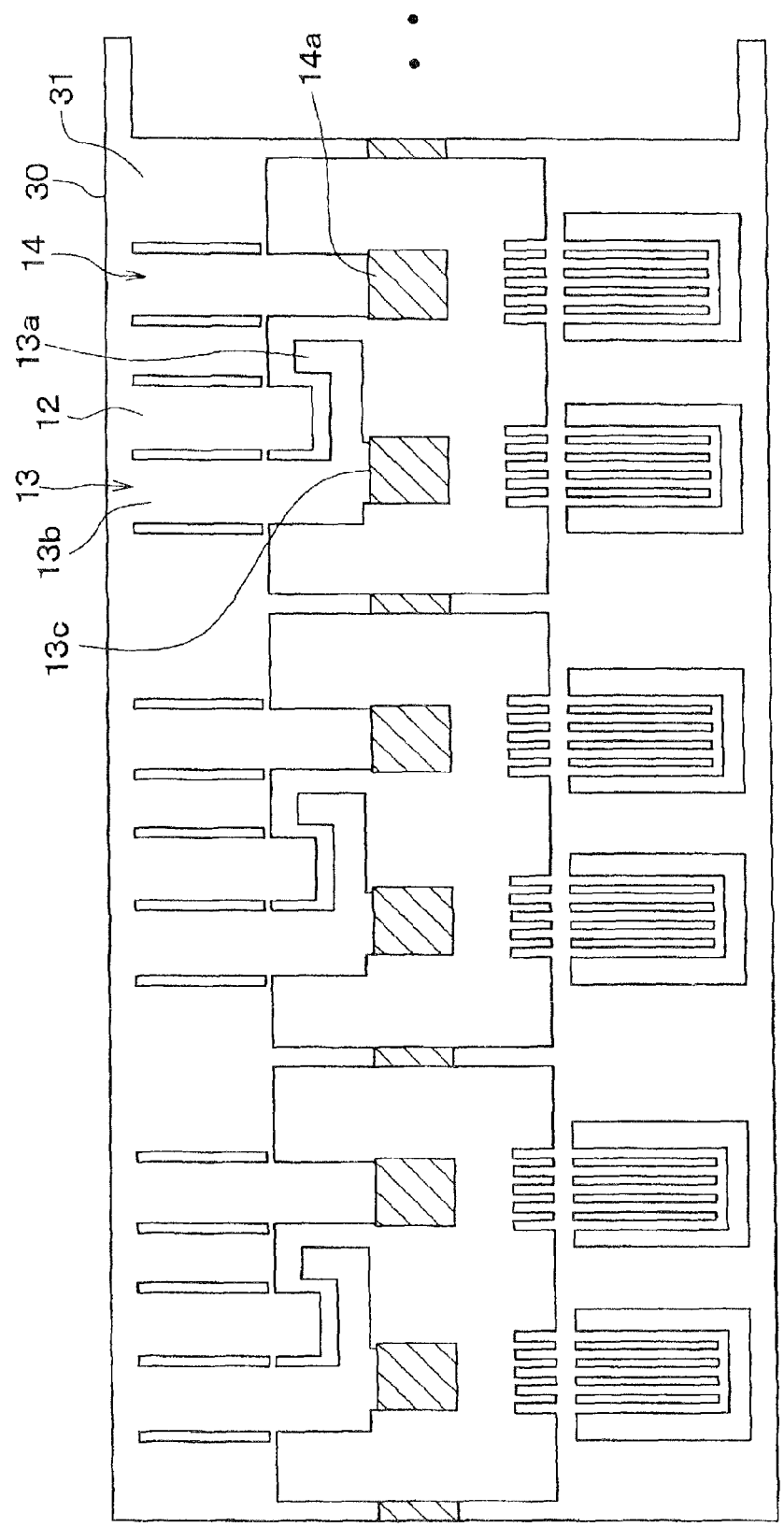
FIG. 14 is a schematic top view of a lead frame including multiple phases as another example according to the tenth embodiment.

In the present embodiment, to form the lead frame 30, a long metal plate is prepared, and is made into a predetermined shape as shown in FIG. 14 by drawing or pressing. That is, a base lead frame including multiple phases is formed once, and then is cut at predetermined positions so that each cut section includes the predetermined number of phases.

For example, the lead frame 30 shown in FIG. 13 is formed by cutting the base lead frame shown in FIG. 14. The lead frame 30 shown in FIG. 13 is for one phase.

In a case where the metal plate has a thick portion along a line where the terminal body portions 13c, 14a are to be formed, the lead frames 30 for the predetermined number of phases can be continuously formed.

That is, a long metal plate in which the line corresponding to the terminal body portions 13a, 14a has a thickness greater than the remaining portion can be used to form the lead frames 30. In this case, after the lead frame 30 for the predetermined number of phase is formed once, another lead frame 30 can be continuously formed using the remaining metal plate.

In such a case, since the line passing through the portions corresponding to the terminal body portions 13c, 14a is thicker than the other portion of the metal plate, even if multiple lead frames 30 are continuously formed, it is less likely that the metal plate will be displaced. Thus, the terminal body portions 13c, 14a can be accurately formed. In this case, therefore, it is not necessary to bond the metal pieces each having the size corresponding to the terminal body portion 13c, 14a with the metal plate by soldering, welding or the like, after the lead frame 30 is formed from the metal plate. Therefore, the manufacturing process of the lead frame 30 is simplified, and thus the manufacturing process of the semiconductor module 10 can be eased.

The aforementioned manufacturing process of the lead frame 30 is not limited to the method of manufacturing the lead frame 30 for the 2 in 1 package structure as the fourth embodiment. The aforementioned manufacturing process can be employed to the lead frames 30 for any of the fifth through seventh embodiments. Since the lead frame 30 shown in FIG. 14 can be simply cut at predetermined locations, the aforementioned manufacturing process can be employed to manufacture the lead frames 30 for the eighth embodiment or the ninth embodiment, such as 4 in 1 package or 6 in 1 package.

Eleventh Embodiment

An eleventh embodiment will be described with reference to FIG. 15. In the semiconductor module 10 according to the present embodiment, the heat sink 17a of the upper arm 41, 51, 53, 55 is provided with a terminal and a connecting part. Other structures are similar to those of the first embodiment, and a different structure will be mainly described hereinafter.

Figure 15:
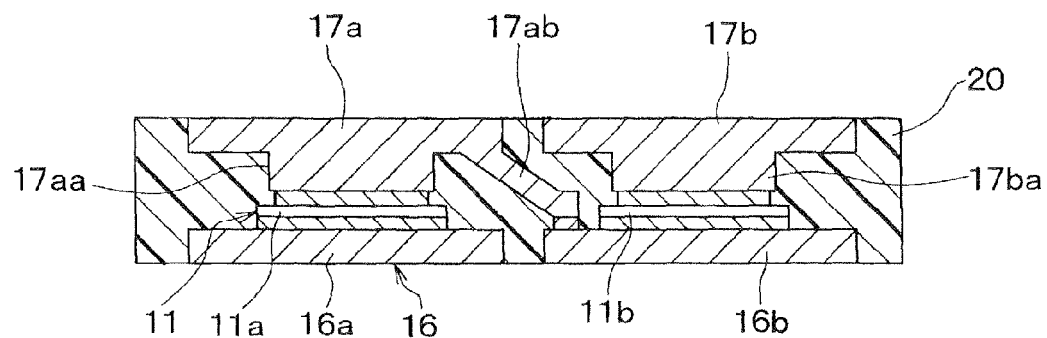
FIG. 15 is a cross-sectional view of a semiconductor module according to an eleventh embodiment of the present invention.

FIG. 15 is a cross-sectional view of the semiconductor module 10 according to the present embodiment. As shown in FIG. 15, the heat sink 17a of the upper arm 41, 51, 53, 55 has a terminal 17aa as a terminal body portion and a connecting part 17ab. The terminal 17aa projects toward the semiconductor chip 11a on a rear side of the heat sink 17a. Further, the heat sink 17b of the lower arm 42, 52, 54, 56 has a terminal 17ba as a terminal body portion projecting toward the semiconductor chip 11b on a rear side of the heat sink 17b.

The connecting part 17ab extends from the heat sink 17a toward the semiconductor chip 11b of the lower arm 42, 52, 54, 56. Further, the connecting part 17ab is inclined relative to the remaining portion of the heat sink 17a including the terminal 17aa to be connected to the front surface of the heat sink 16b. In this case, the connecting part 17ab is provided by the heat sink 17a, that is, the connecting part 17ab is integral with the heat sink 17a. Therefore, it is not necessary to form the connecting part for connecting the upper arm 41, 51, 53, 55 and the lower arm 42, 52, 54, 56 by a separate member.

In such a structure, the upper arm 41, 51, 53, 55 and the lower arm 42, 52, 54, 56 are connected to each other at one connecting portion. That is, the upper arm 41, 51, 53, 55 and the lower arm 42, 52, 54, 56 are connected to each other only at the end of the connecting part 17ab. Therefore, the number of connecting portions can be reduced, and hence the manufacturing process of the semiconductor module 10 can be simplified.

Further, the semiconductor module 10 can be manufactured by stacking the components on top of another. Accordingly, the manufacturing process is further simplified.

Moreover, the connecting part 17ab is connected to the heat sink 16b while inclining relative to the main portion of the heat sink 17a and the terminal 17aa. Therefore, similar to the first embodiment, the upper arm 41, 51, 53, 55 and the lower arm 42, 52, 54, 56 can be connected to each other without enlarging the heat sinks 17a, 16b. Accordingly, the increase in the area of the heat sinks 17a, 16b is restricted, and hence the increase in overall size of the semiconductor module 10 due to the increase in the area of the heat sinks 17a, 16b is restricted.

Because the heat sinks 16a, 17b have different potential from that of the connecting part 17ab, it is necessary to space between the heat sinks 16a, 17b and the connecting part 17ab so as to avoid contact between the connecting part 17ab and the heat sinks 16a, 17b during the manufacturing process and in the finished condition. In the structure where the connecting part 17ab is inclined, the distance between the heat sinks 16a, 17b and the connecting part 17ab is easily ensured. In addition, dimensional tolerance due to the thickness of the heat sinks 16, 17 and the like can be absorbed by flexibility of the connecting part 17ab and the connecting portion between the connecting part 17ab and the heat sink 16b.

Twelfth Embodiment

A twelfth embodiment will be described with reference to FIG. 16. In the semiconductor module 10 according to the present embodiment, the heat sink 16b of the lower arm 42, 52, 54, 56 has a terminal and a connecting part. Other structures are similar to those of the eleventh embodiment, and a different structure will be mainly described hereinafter.

Figure 16:
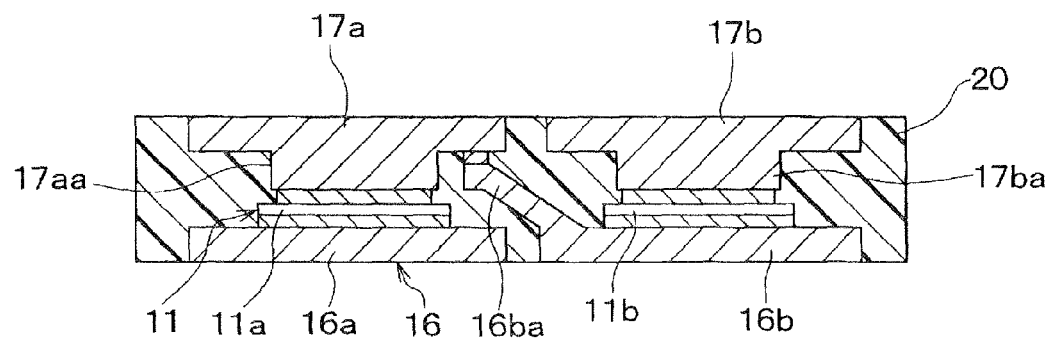
FIG. 16 is a cross-sectional view of a semiconductor module according to a twelfth embodiment of the present invention.

FIG. 16 is a cross-sectional view of the semiconductor module 10. As shown in FIG. 16, the heat sink 16b of the lower arm 42, 52, 54, 56 has a connecting part 16ba on a front surface facing the semiconductor chip 11b. The heat sink 17a of the upper arm 41, 51, 53, 55 has the terminal 17aa as the terminal body portion projecting toward the semiconductor chip 11a. The heat sink 17b of the lower arm 42, 52, 54, 56 has the terminal 17ba as the terminal body portion projecting toward the semiconductor chip 11b.

Also in the case where the heat sink 16b of the lower arm 42, 52, 54, 56 has the connecting part 16ba, the advantageous effects similar to those of the eleventh embodiment can be achieved.

Thirteenth Embodiment

A thirteenth embodiment will be described with reference to FIGS. 17 and 18.

Figure 17:
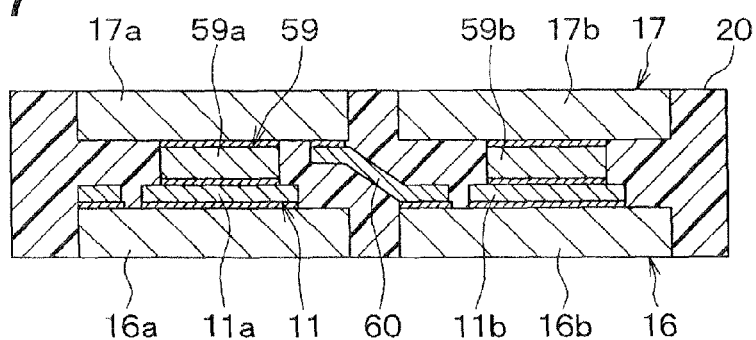
FIG. 17 is a cross-sectional view of a semiconductor module according to a thirteenth embodiment of the present invention.

FIG. 17 is a cross-sectional view of the semiconductor module 10. FIG. 18 is a schematic plan view of the semiconductor module 10, before being molded with a resin, for illustrating a layout of components. Also, FIG. 17 corresponds to a cross-sectional view taken along a line XVII-XVII in FIG. 18 in a condition where the semiconductor module 10 is molded with a resin. Although FIG. 18 is not a cross-sectional view, some portions are hatched for the sake of clarity. Hereinafter, structures different from the aforementioned embodiments will be mainly described.

In the semiconductor module 10, the components, such as the semiconductor chip 11, the leads 12, 13, 14, the control terminals 15, the lower and upper heat sinks 16, 17, are integrally molded with the resin mold part 20. For example, the semiconductor chip 11 is connected on the lower heat sink 16 through a solder or the like, and a metal block 59 is connected on the semiconductor chip 11 through a solder or the like. Then, the upper heat sink 17 is connected on the metal block 59 through a solder or the like. Further, the above components are integrally molded with the resin mold part 20.

The semiconductor chip 11 is provided with elements forming the upper and lower arms 41, 42, 51 through 56. Specifically, the semiconductor chip 11 includes the semiconductor chip 11a and the semiconductor chip 11b. The semiconductor chips 11a, 11b have the same basic structure. One of the semiconductor chips 11a, 11b provides the upper arm 41, 51, 53, 55 and the other of the semiconductor chips 11a, 11b provides the lower arm 42, 52, 54, 56. For example, the semiconductor chip 11a, which is on a left side in FIG. 17, provides the upper arm 41, 51, 53, 55, and the semiconductor chip 11b, which is on a right side in FIG. 17, provides the lower arm 42, 52, 54, 56.

The IGBT 41a, 42a, 51a through 56a and the FWD 41b, 42b, 51b through 56b formed in the semiconductor chips 11a, 11b are constructed as vertical-type elements that allow the electric current in a direction perpendicular to a substrate. Various pads are formed on the front surface and the rear surface of each of the semiconductor chips 11a, 11b.

For example, the pad connected to the gate of the IGBT 41a, 42a, 51a through 56a is formed on the front surface of each semiconductor chip 11a, 11b. Further, the pad connected to the emitter of the IGBT 41a, 42a, 51a through 56a and the anode of the FWD 41b, 42b, 51b through 56b is formed on the front surface of each semiconductor chip 11a, 11b. The pad connected to the collector of the IGBT 51a through 56a and the cathode of the FWD 41b, 42b, 51b through 56b is formed over the entire rear surface of the semiconductor chip 11a, 11b.

The metal block 59 connected to the front surface of the semiconductor chip 11 is, for example, made of a metal having high heat conductivity, such as copper. The metal block 59 includes a metal block 59a for the upper arm 41, 51, 53, 55 and a metal block 59b for the lower arm 42, 52, 54, 56.

The metal block 59a is connected to the pad that is formed on the front surface of the semiconductor chip 11a and connected to the emitter of the IGBT 41a, 51a, 53a, 55a and the anode of the FWD 41b, 51b, 53b, 55b. The metal block 59b is connected to the pad that is formed on the front surface of the semiconductor chip 11b and connected to the emitter of the IGBT 42a, 52a, 54a, 56a and the anode of the FWD 42b, 52b, 54b, 56b.

The lead 12 serves as the positive electrode lead. The lead 13 serves as the middle lead (e.g., output lead). The lead 14 serves as the negative electrode lead. The leads 12 through 14, the control terminals 15 and the like are formed by pressing a single metal plate, together with a connecting part 60, which will be described later. The leads 12 through 14, the control terminals 15 and the connecting part 60 are integrated in the lead frame 30, and are continuous from the frame portion 31 of the lead frame 30. The leads 12 through 14, the control terminals 15 and the connecting part 60 are connected to the heat sinks 16, 17 and the semiconductor chip 11 through a solder or the like.

Figure 18:
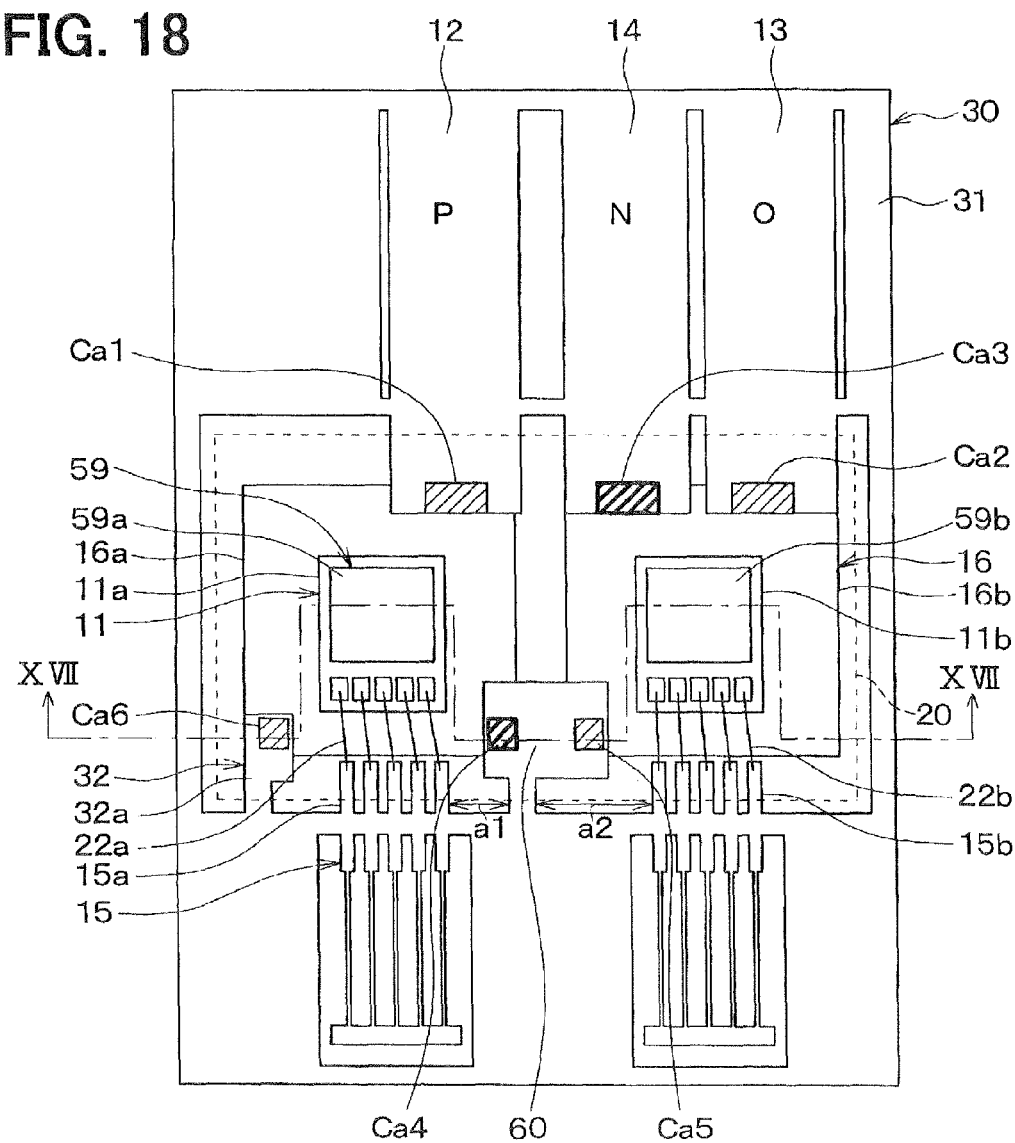
FIG. 18 is a schematic plan view of the semiconductor module, before being molded with a resin, according to the thirteenth embodiment.

Although FIG. 18 is not a cross-sectional view, some portions are hatched for the sake of clarity. The portion hatched with thin lines indicates a connecting portion of the lead frame 30 with the lower heat sink 16. The portion hatched with thick lines indicates a connecting portion of the lead frame 30 with the upper heat sink 17.

The positive electrode lead 12 serves as a terminal connected to the power supply line 6 and the like. As shown in FIG. 18, the positive electrode lead 12 is connected to the rear surface of the semiconductor chip 11a through the heat sink 16a. That is, the positive electrode lead 12 is connected to the collector of the IGBT 41a, 51a, 53a, 55a and the cathode of the FWD 41b, 51b, 53b, 55b of the upper arm 41, 51, 53, 55 through the heat sink 16a.

Specifically, an end of the positive electrode lead 12 is connected to the heat sink 16a at a first connecting point Ca1 through a solder or the like. The heat sink 16a has a generally rectangular shape, and the first connecting point Ca1 is located at one of the corner portions of the heat sink 16a. The opposite end of the positive electrode lead 12 is exposed from the resin mold part 20 and connected to the power supply line 6 and the like.

The middle lead 13 serves as the output terminal to be connected to the three-phase motor 3 between the upper arm 41, 51, 53, 55 and the lower arm 42, 52, 54, 56. The middle lead 13 is connected to the rear surface of the semiconductor chip 11b through the heat sink 16b. That is, the middle lead 13 is connected to the collector of the IGBT 42a, 52a, 54a, 56a and the cathode of the FWD 42b, 52b, 54b, 56b of the lower arm 42, 52, 54, 56 through the heat sink 16b.

Specifically, an end of the middle lead 13 is connected to the heat sink 16b at a second connecting point Ca2 through a solder or the like. The heat sink 16b is a generally rectangular shape. The second connecting point Ca2 is located at one of the corner portions of the heat sink 16b.

The connecting part 60 connects between the heat sink 17a and the heat sink 16b so as to connect between the emitter of the IGBT 41a, 51a, 53a, 55a and the anode of the FWD 41b, 51b, 53b, 55b of the upper arm 41, 51, 53, 55 and the collector of the IGBT 42a, 52a, 54a, 56a and the cathode of the FWD 42b, 52b, 54b, 56b of the lower arm 42, 52, 54, 56. Therefore, the middle lead 13 has a middle potential between the upper arm 41, 51, 53, 55 and the lower arm 42, 52, 54, 56.

The negative electrode lead 14 serves as a terminal connected to the GND line 7. The negative electrode lead 14 is connected to the heat sink 17b at a third connecting point Ca3. That is, the negative electrode lead 14 is connected to the front surface of the semiconductor chip 11b, that is, to the emitter of the IGBT 42a, 52a, 54a, 56a and the anode of the FWD 42b, 52b, 54b, 56b of the lower arm 42, 52, 54, 56, through the metal block 59b. An end of the negative electrode lead 14 is connected to the rear surface of the heat sink 17b, and the opposite end of the negative electrode lead 14 is exposed from the resin mold part 20 and connected to the GND line 7 or the like.

The positive electrode lead 12 and the middle lead 13 are connected to the heat sink 16 on the lower side, while the negative electrode lead 14 is connected to the heat sink 17 on the upper side. That is, the leads 12 through 14 are connected to the heat sinks 16, 17 on different levels. Therefore, the leads 12 through 14 are bent at the time of pressing to cope with the connection on the different levels.

The control terminals 15 include control terminals 15a for the upper arm 41, 51, 53, 55 and control terminals 15b for the lower arm 42, 52, 54, 56. The control terminals 15a, 15b serve as gate wirings of the IGBT 41a, 42a, 51a through 56a. The control terminals 15a, 15b are electrically connected to the pads that are formed on the front surface of the semiconductor chips 11a, 11b and connected to the gates of the IGBTs 41a, 42a, 51a through 56a via bonding wires 22a, 22b. The leads 12 through 14 are disposed on a side opposite to the control terminals 15a, 15b with respect to the semiconductor chips 11a, 11b.

The semiconductor chips 11a, 11b are not directly connected to the heat sinks 17a, 17b, but connected to the heat sinks 17a, 17b through the metal blocks 59a, 59b. Because the semiconductor chips 11a, 11b are spaced from the heat sinks 17a, 17b by the metal blocks 59a, 59b, it is less likely that the bonding wires 22a, 22b will contact the heat sinks 17a, 17b. The ends of the control terminals 15a, 15b opposite to the semiconductor chips 11a, 11b are exposed from the resin mold part 20 to be connected to external devices.

The lower heat sink 16 includes the heat sink 16a connected to the semiconductor chip 16a and the heat sink 16b connected to the semiconductor chip 16b. The heat sink 16a has a generally rectangular shape, when viewed along a direction of the normal to the surface of the heat sink 16a. Likewise, the heat sink 16b has a generally rectangular shape, when viewed along a direction of the normal to the surface of the heat sink 16b. The heat sink 16a is exposed from the resin mold part 20 on a side opposite to the semiconductor chip 11a for radiating heat from the semiconductor chip 11a. Likewise, the heat sink 16b is exposed from the resin mold part 20 on a side opposite to the semiconductor chip 11b for radiating heat from the semiconductor chip 11b.

The upper heat sink 17 includes the heat sink 17a connected to the semiconductor chip 11a through the metal block 59a and the heat sink 17b connected to the semiconductor chip 11b through the metal block 59b. The heat sink 17a is exposed from the resin mold part 20 on a side opposite to the semiconductor chip 11a for radiating heat from the semiconductor chip 11a. Likewise, the heat sink 17b is exposed from the resin mold part 20 on a side opposite to the semiconductor chip 11b for radiating heat from the semiconductor chip 11b.

The heat sink 16a and the heat sink 16b are arranged such that one of the sides of the heat sink 16a is opposed to one of the sides of the heat sink 16b. Likewise, the heat sink 17a and the heat sink 17b are arranged such that one of the sides of the heat sink 17a is opposed to one of the sides of the heat sink 17b. The heat sinks 16a, 16b, 17a, 17b are larger than the semiconductor chips 11a, 11b for widely diffusing the heat from the semiconductor chips 11a, 11b, thereby facilitating heat radiation.

The connecting part 60 connects between the upper arm 41, 51, 53, 55 and the lower arm 42, 52, 54, 56. The connecting part 60 has a predetermined thickness, that is, a predetermined sectional area so as to allow the electric current supplied to the three-phase motor 3, the sectional area being defined in a direction perpendicular to the direction of the electric current in the connecting part, such as an up and down direction in FIG. 17.

The emitter of the IGBT 41a, 51a, 53a, 55a and the anode of the FWD 41b, 51b, 53b, 55b of the upper arm 41, 51, 53, 55 and the collector of the IGBT 42a, 52a, 54a, 56a and the cathode of the FWD 42b, 52b, 54b, 56b of the lower arm 42, 52, 54, 56 are connected through the connecting part 60 since the connecting part 60 connecting between the heat sink 17a and the heat sink 16b. Therefore, when the semiconductor module 10 is used, the connecting part 60 has a middle potential between the upper arm 41, 51, 53, 55 and the lower arm 42, 52, 54, 56. That is, the connecting part 60 has the same potential as the middle lead 13 connected to the three-phase motor 3. An end of the connecting part 60 is connected to the rear surface of the heat sink 17a at a fourth connecting point Ca4, and the opposite end of the connecting part 60 is connected to the front surface of the heat sink 16b at a fifth connecting point Ca5. The fifth connecting point Ca5 is located at one of the corner portions of the rectangular heat sink 16b.

To form the resin mold part 20, the aforementioned components are placed in a molding die, and then resin is injected into the molding die. After the injected resin is molded, the mold resin part 20 is formed. The aforementioned components except for the respective exposed portions of the leads 12 through 14 and control terminals 15 are covered with the mold resin part 20. Thus, the semiconductor chip 11 is protected by the resin mold part 20.

After the molding, that is, after the resin mold part 20 is formed, the frame portion 31 of the lead frame 30 is cut because the frame portion 31 is not necessary in the use of the semiconductor module 10. Therefore, in the finished product, the leads 12 through 14, the control terminals 15a, 15b, the connecting part 60 and the like shown in FIG. 18 are separated and electrically isolated from each other.

The semiconductor module 10 having the aforementioned structure constitutes the 2 in 1 package. In the semiconductor module 10, the lead frame 30 and the heat sinks 16a, 16b are connected in the following manner so as to restrict the components from inclining due to molding pressure during the molding.

In the present embodiment, the lead frame 30 includes a hanging lead 32 to be connected to the heat sink 16a. Further, the connecting portion 60 is configured to serve as a hanging lead. The hanging lead 32 is represented only by a first hanging lead 32a in the present embodiment. The first hanging lead 32a is connected to the heat sink 16a at a sixth connecting point Ca6 that is located at another one of the corner portions of the heat sink 16a.

As described above, the positive electrode lead 12 and the heat sink 16a are connected to each other at the first connecting point Ca1, and the middle lead 13 and the heat sink 16b are connected to each other at the second connecting point Ca2. Therefore, the heat sink 16a is connected to the lead frame 30 at the first connecting point Ca1 and the sixth connecting point Ca6. Also, the heat sink 16b is connected to the lead frame 30 at the second connecting point Ca2 and the fifth connecting point Ca5.

The first connecting point Ca1 and the sixth connecting point Ca6 are located at the diagonal corner portions of the rectangular heat sink 16a. Likewise, the second connecting point Ca2 and the fifth connecting point Ca5 are located at the diagonal corner portions of the rectangular heat sink 16b.

In this way, the leads 12 through 14, the connecting part 60 and the first hanging lead 32a are arranged such that lead frame 30 and each of the heat sinks 16a, 16b are connected to each other on at least one of diagonal lines of the heat sink 16a, 16b. As such, it is less likely that the components will be inclined due to the molding pressure during the molding.

In addition, in the present embodiment, the negative electrode lead 14 and the connecting part 60 are connected to the heat sinks 17a, 17b at corner portions that are on the remaining diagonal lines of the heat sinks 16a, 16b. That is, the negative electrode lead 14 is connected to the heat sink 17b at the third connecting point Ca3 that is on the diagonal line different from the diagonal line on which the second and fifth connecting points Ca2, Ca5 are located. Also, the connecting part 60 is connected to the heat sink 17a at the fourth connecting point Ca4 that is on the diagonal line different from the diagonal line on which the first and sixth connecting points Ca1 and Ca6 are located. Accordingly, the inclination of the components due to the molding pressure can be sufficiently reduced.

Since the connecting part 60 also serves as the hanging lead, it is not necessary to employ a separate hanging lead for connecting the lead frame 30 and the heat sink 16b at the corner portion diagonally opposite to the second connecting point Ca2. Therefore, the following advantageous effects can be achieved, as compared with the case of employing the separate hanging lead.

In the case of employing the separate hanging lead instead of the connecting part 60, the space for the separate hanging lead is necessary. In the example shown in FIG. 30A, the connecting part J60 is located at the middle position of the opposed sides of the heat sinks J16a, J16b, and the heat sinks J16a, J16b are connected to the hanging leads J32b, J32c at the corner portions of the heat sinks 16a, 16b.

In such a case, therefore, the space for the hanging leads 32b, 32c is necessary. Further, the collector potential and the emitter potential (equal to the middle potential) of the semiconductor power element of the upper arm are applied to the hanging lead J32b located adjacent to the control terminals J15a and the control terminal J15a. Therefore, when the inverter is operated, the voltage over 1000V will be applied to the portion b1 between the control terminals J15a and the hanging lead J32b. Likewise, a potential difference between the collector potential of the semiconductor power element of the upper arm and the middle potential occurs at a portion b2, that is, between the hanging lead J32b and the hanging lead J32c. Further, a potential difference between the middle potential and the emitter potential of the semiconductor power element of the lower arm occurs at a portion b3, that is, between the hanging lead J32c and the control terminals J15b. Moreover, the hanging leads J32b, J32c, the control terminals J15b and the like are exposed from the resin mold part J20 in the finished product. Therefore, predetermined creeping distances need to be maintained at the portions b1, b2, b3 corresponding to respective potential differences.

Figure 30A:
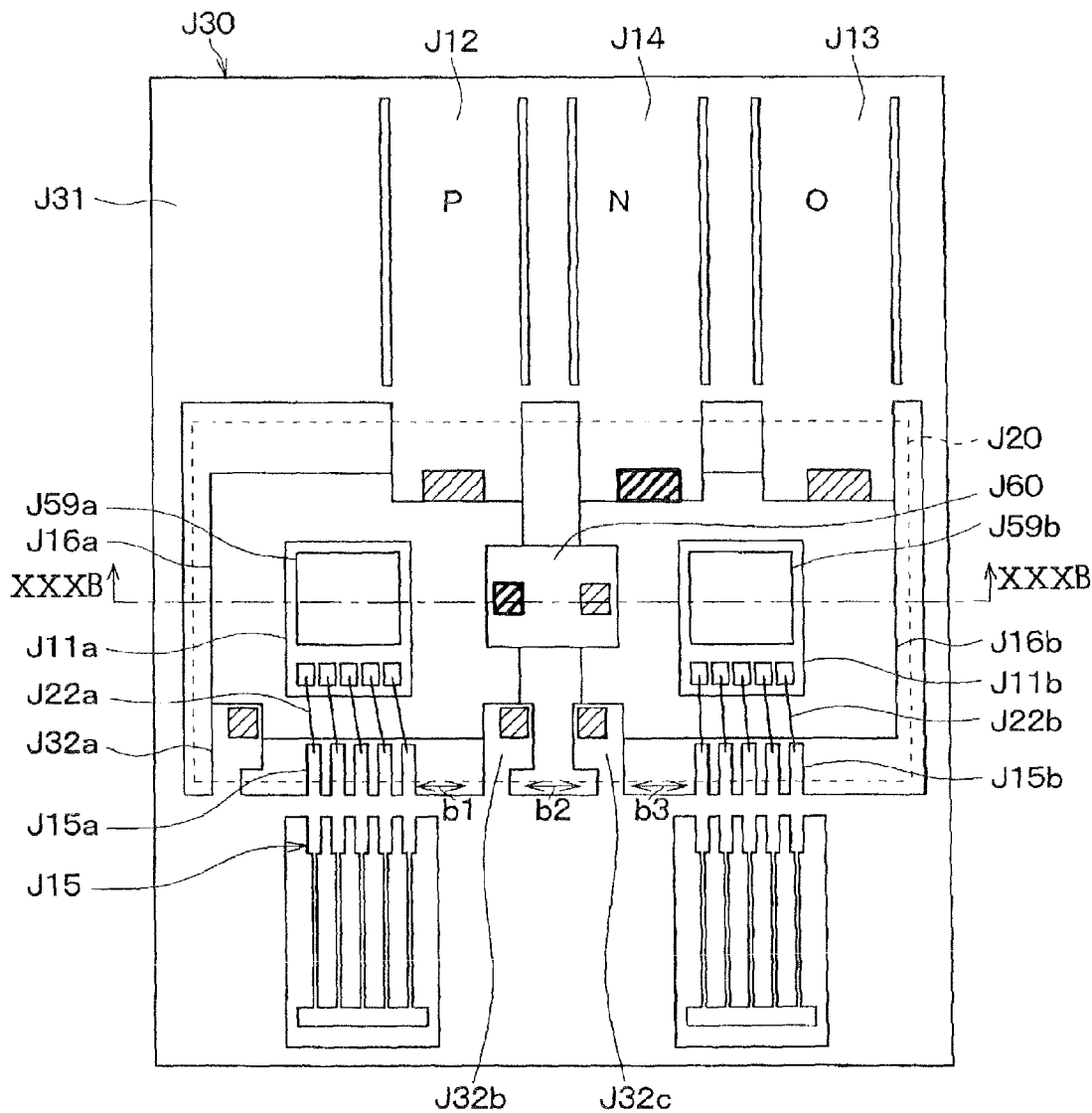
FIG. 30A is a schematic plan view of a semiconductor module, before being molded with a resin, as a comparative example.
Figure 30B:
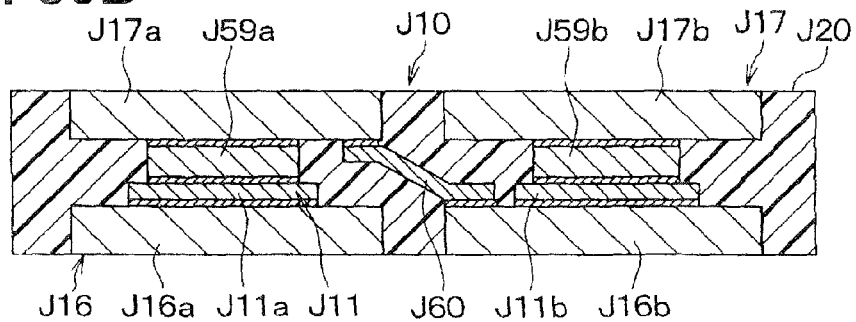
FIG. 30B is a cross-sectional view taken along a line XXXA-XXXA in FIG. 30A.

As a result, a width of the semiconductor module J10, such as a dimension of the semiconductor module J10 in a right and left direction of FIG. 30A, is increased. Accordingly, it is difficult to reduce the size of the semiconductor module J10. In addition, the number of connecting points increases due to the lead frame J30 having the hanging leads J32b, J32c. Further, since the connecting part J60 for connecting between the heat sink J17a and the heat sink J16b is a separate member, it is necessary to fix the connecting part 60 using a special means. As such, the assembling process is complex.

In the present embodiment, on the other hand, since the connecting part 60 is provided by a part of the lead frame 30 and has the function of the hanging lead in addition to the function of connecting part, it is not necessary to employ a separate hanging lead. Further, the connecting part 60 has the middle potential, and the emitter potential of the IGBT 41a, 51a, 53a, 55a of the upper arm 41, 51, 53, 55, which is equal to the middle potential, is applied to the control terminals 15a. Therefore, it is not necessary to ensure a creeping distance at the portion a1. However, the connecting part 60 has the middle potential, and the control terminals 15b of the lower arm 42, 52, 54, 56 is applied with the emitter potential of the IGBT 42a, 52a, 54a, 56a of the lower arm 42, 52, 54, 56, which is equal to the GND potential. Therefore, it is necessary to ensure a creeping distance at the portion a2.

In the present embodiment, since only the connecting part 60 is disposed between the control terminals 15a and the control terminals 15b, it is easy to ensure a distance between the connecting part 60 and the control terminal 15b, as compared with the comparative example in which two hanging leads J32b, J32c are arranged between the control terminal J15a and the control terminal J15b. As such, the components of the upper and lower arms 41, 42, 52 through 56 can be arranged sufficiently close to each other while maintaining the creeping distance between the connecting part 60 and the control terminals 15b.

Accordingly, the width of the semiconductor module 10 along the arrangement direction of the semiconductor chips 11a, 11b can be reduced, and hence the size of the semiconductor module 10 can be reduced. Further, the separate hanging lead is not used. Therefore, the number of connecting portions between the heat sinks 16a, 16b, 17a, 17b and the lead frame 30 can be reduced in total. In addition, since the connecting part 60 for connecting between the heat sink 17a of the upper arm 41, 51, 53, 55 and the heat sink 16b of the lower arm 42, 52, 54, 56 can be provided by a part of the lead frame 30. Therefore, it is not necessary to fix the separate hanging lead using a specific means. Accordingly, the assemblability improves.

In this way, in the semiconductor module 10 of the present embodiment, the connecting part 60 also serves as the hanging lead. Therefore, the number of the hanging lead 32 can be reduced. Also, it is not necessary to employ two hanging leads, that is, a hanging lead connected to the heat sink 16a and a hanging lead connected to the heat sink 16b, between the control terminals 15a, 15b. Therefore, the creeping distance can be ensured between each of the control terminals 15a, 15b and the connecting part 60 serving as the hanging lead. The width of the semiconductor module 10 can be reduced, and hence the size of the semiconductor module 10 can be reduced.

Since the number of the hanging leads can be reduced, the connecting portions between the lead frame 30 and the heat sinks 16a, 16b, 17a, 17b can be reduced. Moreover, the connecting part 60 is provided by the part of the lead frame 30. Therefore, it is not necessary to fix the connecting part 60 using the special means, and hence assemblability improves.

Furthermore, the leads 12 through 14, the connecting part 60 and the first hanging lead 32a are arranged such that the connecting portions between the lead frame 30 and each of the heat sinks 16a, 16b are located on one of the diagonal lines of the heat sink 16a, 16b. Therefore, it is less likely that the components will be inclined due to the molding pressure during the molding.

Fourteenth Embodiment

A fourteenth embodiment will be described with reference to FIG. 19. In the semiconductor module 10 according to the present embodiment, a structure of the connecting part 60 is modified from that of the thirteenth embodiment. Other structures are similar to those of the thirteenth embodiment, and a different structure will be mainly described hereinafter.

Figure 19:
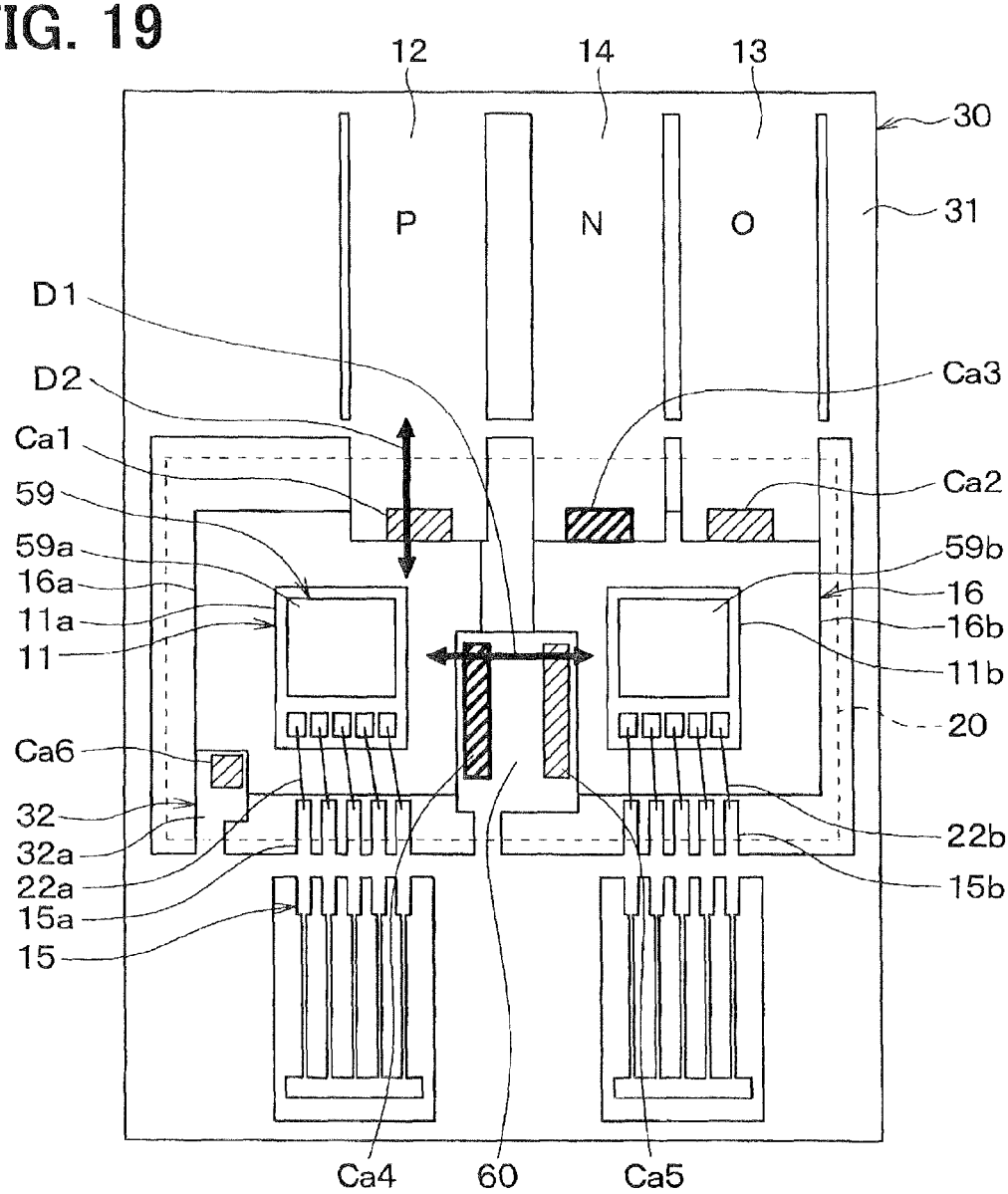
FIG. 19 is a schematic plan view of a semiconductor module, before being molded with a resin, according to a fourteenth embodiment of the present invention.

FIG. 19 is a schematic plan view of the semiconductor module 10, before being molded with the resin, for illustrating the layout of components. The semiconductor module 10 of the present embodiment has a sectional structure similar to that of the thirteenth embodiment shown in FIG. 17. Although FIG. 19 is not a cross-sectional view, some portions are hatched for the sake of clarity.

As shown in FIG. 19, the connecting area of the fourth and fifth connecting points Ca4, Ca5, that is, the connecting area between the connecting part 60 and the heat sinks 17a, 16b is increased, as compared with that of the thirteenth embodiment. For example, a dimension of the connecting part 60 in a direction perpendicular to the direction D1 of the electric current in the connecting part 60 is larger than that of the connecting part 60 of the thirteenth embodiment. That is, a length of the connecting part 60 in an up and down direction in FIG. 19 is greater than that of the connecting part of the thirteenth embodiment shown in FIG. 18. For example, the length of the connecting part 60 is equal to or greater than a dimension of each of the leads 12 through 14 in a direction perpendicular to the direction D2 of the electric current in the lead 12 through 14.

Further, the connecting length between the connecting part 60 and each of the heat sink 17a and the heat sink 16b is greater than that of the thirteenth embodiment with respect to the direction perpendicular to the direction D1. That is, the area of each of the connecting points Ca4, Ca5 is increased in the direction perpendicular to the direction D1, as compared with that of the thirteenth embodiment shown in FIG. 18. In such a case, the connecting part 60 and the heat sinks 17a, 16b are more firmly fixed.

Further, the cross-sectional area of the connecting part 60 defined in the direction perpendicular to the direction D1 is greater than the cross-sectional area of each of the leads 12 through 14 defined in the direction perpendicular to the direction D2. Therefore, the cross-sectional area of the electric current path provided by the connecting part 60 increases, and thus the amount of electric current passing through the connecting part 60 increases.

Fifteenth Embodiment

A fifteenth embodiment will be described with reference to FIGS. 20 and 21. In the semiconductor module 10 according to the present embodiment, a connecting structure between the connecting part 60 and the heat sink 17a is modified from that of the thirteenth and fourteenth embodiments. Other structures are similar to those of the thirteenth and fourteenth embodiments, and a different structure will be mainly described hereinafter.

Figure 20:
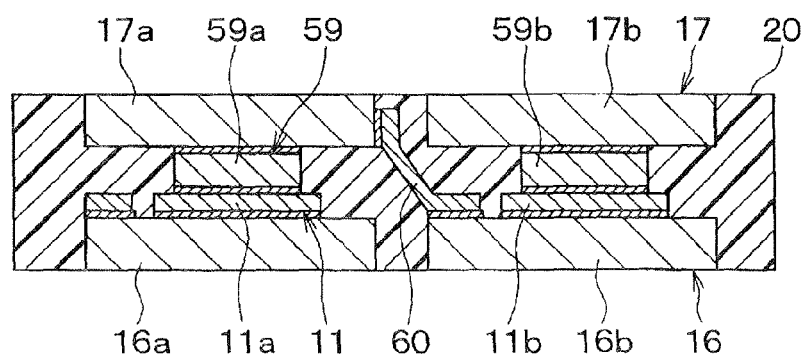
FIG. 20 is a cross-sectional view of a semiconductor module according to a fifteenth embodiment of the present invention.

FIG. 20 is a cross-sectional view of the semiconductor module 10. FIG. 21 is a schematic plan view of the semiconductor module 10, before being molded with a resin, for showing a layout of components. Also, FIG. 20 corresponds to a cross-sectional view taken along a line XX-XX in FIG. 21 in a condition where the semiconductor module 10 has been molded with a resin. Although FIG. 21 is not a cross-sectional view, some portions are hatched for the sake of clarity.

Figure 21:
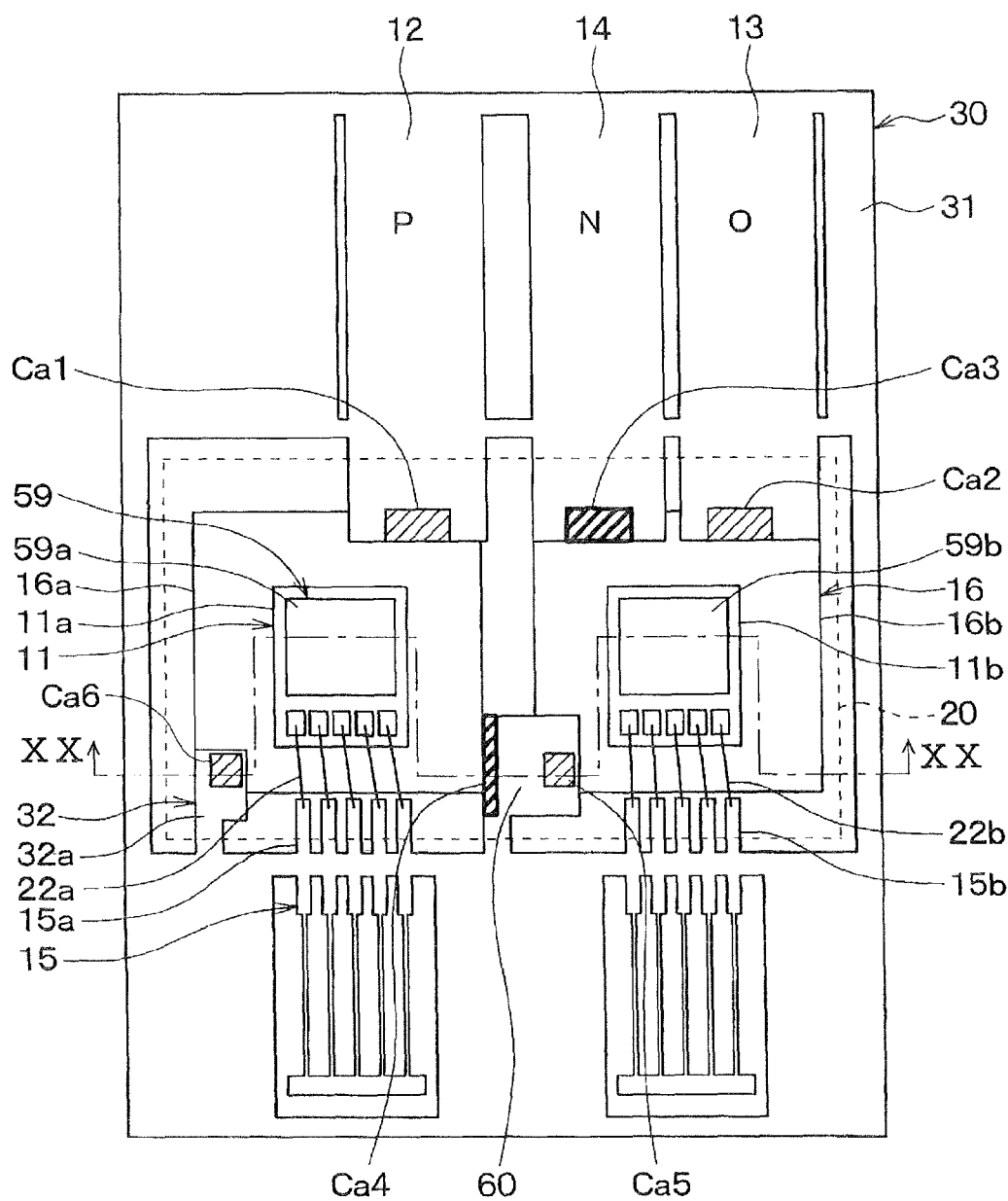
FIG. 21 is a schematic plan view of the semiconductor module, before being molded with a resin, according to the fifteenth embodiment.

As shown in FIGS. 20 and 21, the connecting part 60 is connected to the side surface of the heat sink 17a, in place of connecting to the rear surface of the heat sink 17a. For example, during pressing, the connecting part 60 is bent at two locations. Thus, the connecting part 60 partly includes a perpendicular portion that is perpendicular to the frame portion 31 of the lead frame 30, and the connecting portion 60 is connected to the side surface of the heat sink 17a at the perpendicular portion.

In this way, the connecting part 60 can be connected to the side surface of the heat sink 17a. In such a case, the dimensional tolerance of the connection between the upper arm 41, 51, 53, 55 and the lower arm 42, 52, 54, 56 can be absorbed in a direction along the semiconductor chip 11, not in the direction of the normal to the semiconductor chip 11.

FIG. 21 exemplarily illustrates the connecting part 60 connected to the side surface of the heat sink 17a in the structure of the thirteenth embodiment. Further, such a structure of the connecting part 60 can be employed in the semiconductor module 10 of the fourteenth embodiment.

Sixteenth Embodiment

A sixteenth embodiment will be described with reference to FIGS. 22, 23A and 23B. In the semiconductor module 10 according to the present embodiment, the shape of the connecting part 60 is modified from that of the thirteenth embodiment. Other structures are similar to those of the thirteenth embodiment, and a different structure will be mainly described hereinafter.

Figure 22:
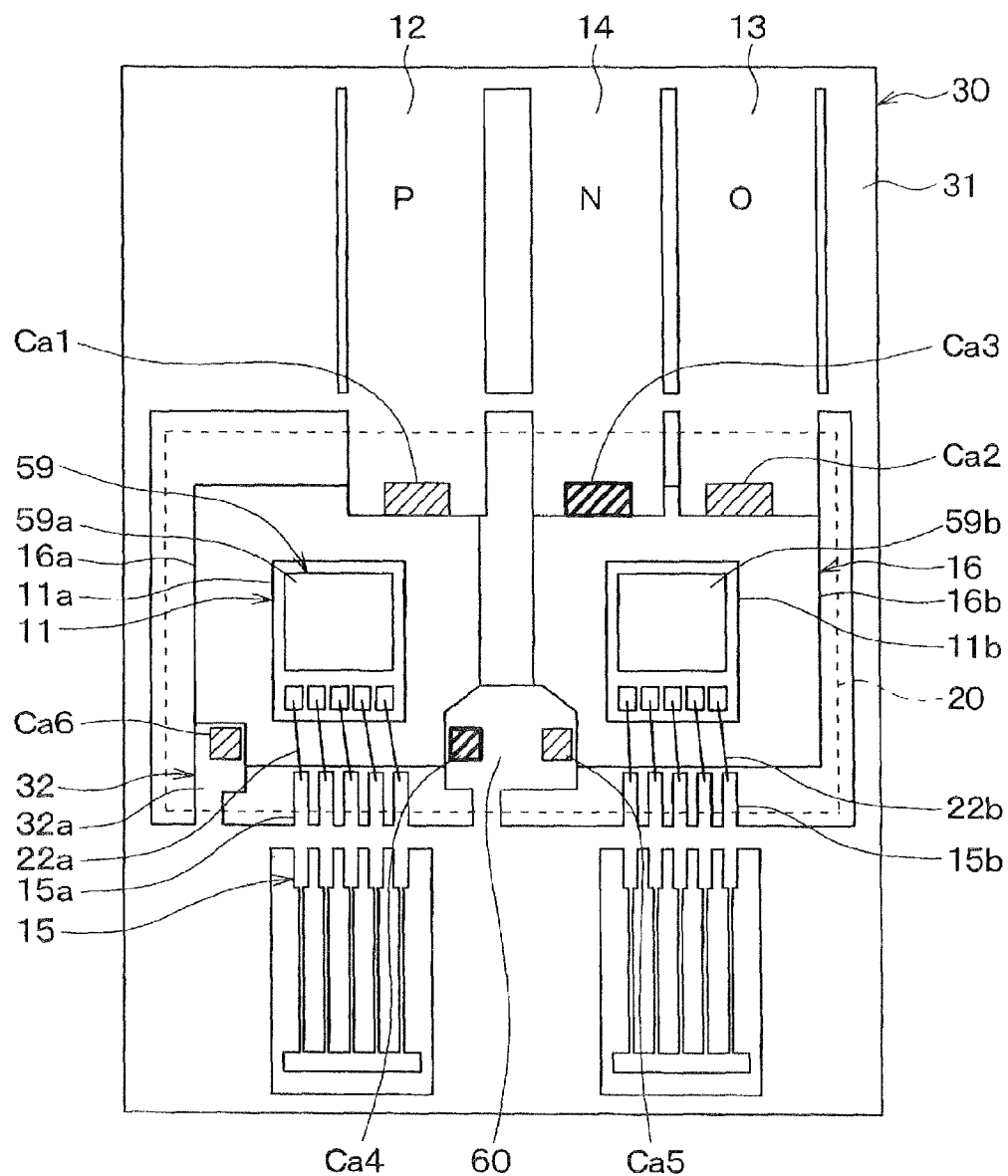
FIG. 22 is a schematic plan view of a semiconductor module, before being molded with a resin, according to a sixteenth embodiment of the present invention.

FIG. 22 is a schematic plan view of the semiconductor module 10, before being molded with the resin, for illustrating the layout of components. The semiconductor module 10 of the present embodiment has a sectional structure similar to that of the thirteenth embodiment shown in FIG. 17. Although FIG. 22 is not a cross-sectional view, some portions are hatched for the sake of clarity.

As shown in FIG. 22, the connecting part 60 has chamfered corners. Namely, the corner portions of the connecting part 60, that is, portions of the connecting part 60 overlapping with the heat sink 17a and the heat sink 16b when viewed along the direction of the normal to the semiconductor chip 11 are chamfered. Hereinafter, the advantageous effects achieved by such a structure will be described with reference to FIGS. 23A and 23B.

Figure 23A:
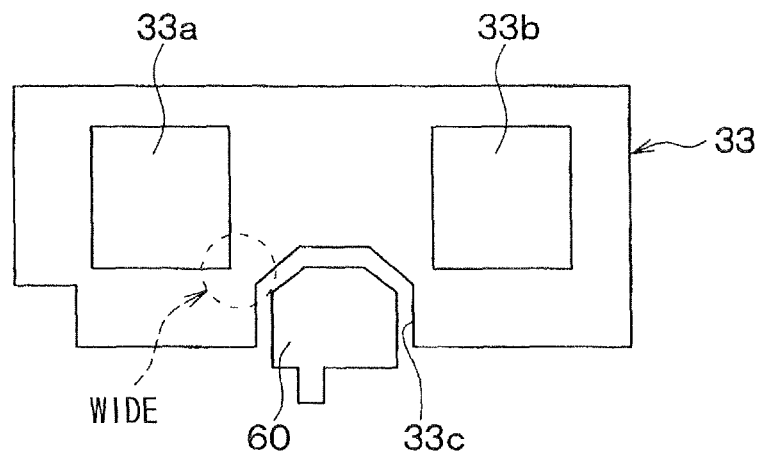
FIG. 23A is a schematic plan view of a connecting part with chamfered corner portions for the semiconductor module according to the sixteenth embodiment.

FIG. 23A illustrates a relationship between the connecting part 60 with chamfered corners and a positioning jig 33. FIG. 23B illustrates a relationship between the connecting part 60 without having chamfered corners and a positioning jig 33.

Figure 23B:
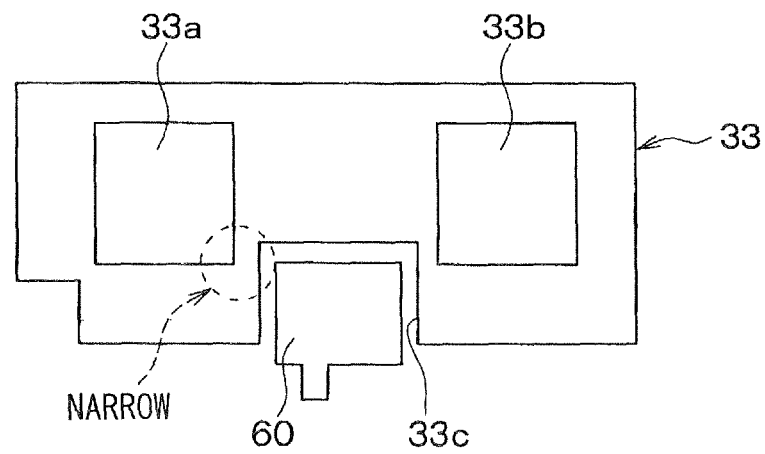
FIG. 23B is a schematic plan view of a connecting part with edged corner portions as a comparative example.

As shown in FIGS. 23A and 23B, the positioning jig 33 is used for keeping a predetermined space between the connecting part 60 and each of the semiconductor chips 11a, 11b when the lead frame 30 and the heat sinks 16a, 16b, 17a, 17b are connected at the first through sixth connecting points Ca1 through Ca6.

The positioning jig 33 has jig openings 33a, 33b into which the semiconductor chips 11a, 11b are arranged and a recess 33c into which the connecting part 60 is arranged. The lead frame 30 and the heat sinks 16a, 16b, 17a, 17b are connected at the first through sixth connecting points Ca1 through Ca6 using the positioning jig 33 in the following manner.

First, the heat sinks 16a, 16b are arranged while maintaining a predetermined space between them. Then, the lead frame 30 is laid on the heat sinks 16a, 16b. Thereafter, the positioning jig 33 is arranged in an opening of the lead frame 30. The shape and size of the positioning jig 33 are decided to correspond to the opening of the lead frame 30. Thus, when the positioning jig 33 is arranged in the opening of the lead frame 30, the connecting part 60 is received in the recess 33c and the jig openings 33a are aligned with the desired positions.

Further, the semiconductor chips 11a, 11b are disposed in the jig openings 33a, 33b through a solder or the like. The lead frame 30 is connected to the heat sinks 16a, 16b at the first, second, fifth and sixth connecting points Ca1, Ca2, Ca5, Ca6. For example, in a case of connecting by a solder, the solder is deposited on corresponding portions of one of the lead frame 30 and the heat sinks 16a, 16b before the lead frame 3 is laid on the heat sinks 16a, 16b. Then, by solder reflowing, the semiconductor chips 11a, 11b are connected to the heat sinks 16a, 16b, and the lead frame 30 is connected to the heat sinks 16a, 16b at the first, second, fifth and sixth connecting points Ca1, Ca2, Ca5, Ca6.

Thereafter, the positioning jig 33 is removed, and the heat sinks 17a, 17b are arranged on the semiconductor chips 11a, 11b through the metal blocks 59a, 59b. The heat sinks 17a, 17b, the metal blocks 59a, 59b and the semiconductor chips 11a, 11b are connected to one another, and the lead frame 30 is connected to the heat sinks 17a, 17b at the third and fourth connecting points Ca3,Ca4. These components are, for example, connected through a solder or the like. The aforementioned solder reflowing can be carried out after the components are all arranged.

When the components are connected using the positioning jig 33 without having the chamfered corners, as shown in FIG. 23B, portions of the positioning jig 33 between the jig openings 33a, 33b and the recess 33c are narrow. On the other hand, when the components are connected using the positioning jig 33 with the chamfered corners, as shown in FIG. 23A, it is less likely that the portions of the positioning jig 33 between the jig openings 33a, 33b and the recess 33c will be narrow. Therefore, the strength of the positioning jig 33 improves.

Seventeenth Embodiment

A seventeenth embodiment will be described with reference to FIG. 24. In the semiconductor module 10 according to the present embodiment, structures of the middle lead 13 and the connecting part 60 are modified from those of the thirteenth embodiment. Other structures are similar to those of the thirteenth embodiment, and a different structure will be mainly described hereinafter.

Figure 24:
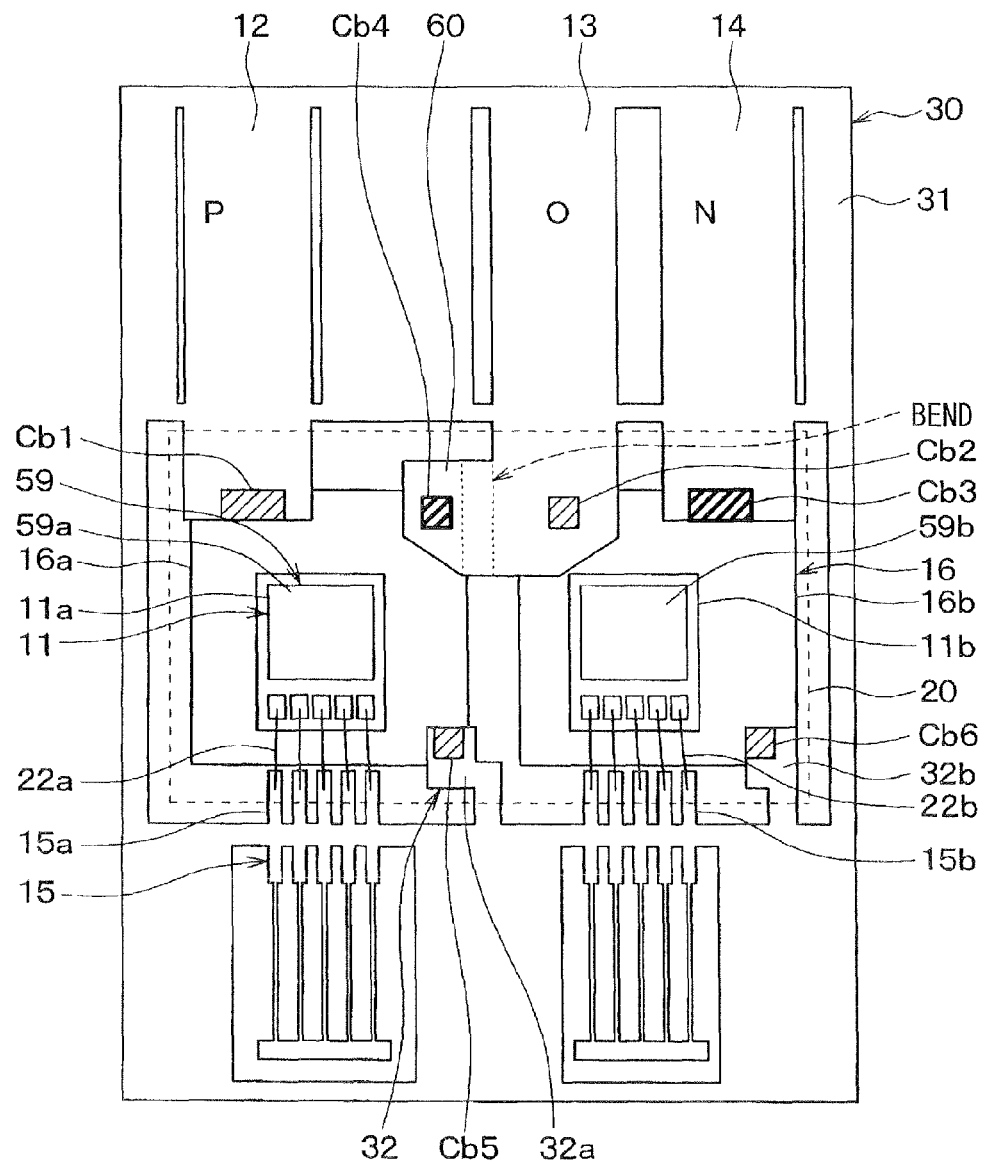
FIG. 24 is a schematic plan view of a semiconductor module, before being molded with a resin, according to a seventeenth embodiment of the present invention.

FIG. 24 is a schematic plan view of the semiconductor module 10, before being molded with the resin, for illustrating the layout of components. The semiconductor module 10 of the present embodiment has a sectional structure similar to that of the thirteenth embodiment shown in FIG. 17. Although FIG. 24 is not a cross-sectional view, some portions are hatched for the sake of clarity.

As shown in FIG. 24, in the present embodiment, the connecting part 60 is integral with the middle lead 13. Because both of the connecting part 60 and the middle lead 13 have the middle potential, the connecting part 60 and the middle lead 13 can be connected to each other. Therefore, the connecting part 60 is disposed on a side opposite to the control terminals 15a, 15b with respect to the semiconductor chips 11a, 11b, and the middle lead 13 is disposed between the positive electrode lead 12 and the negative electrode lead 14. Further, the middle lead 13 is connected to the upper heat sink 17a and the lower heat sink 16b through the connecting part 60.

Further, the hanging lead 32 includes a second hanging lead 32b of the lower arm 42, 52, 54, 56, in addition to the first hanging lead 32a of the upper arm 41, 51, 53, 55. Moreover, the lead frame 30 and the heat sinks 16a, 16b, 17a, 17b are connected to each other at first through sixth connecting points Cb1 through Cb6 in the following manner.

The first connecting point Cb1 between the positive electrode lead 12 and the heat sink 16a is disposed at the corner of the heat sink 16a that is far from the control terminals 15a and the heat sink 16b. For example, the first connecting point Cb1 is located at the left upper corner of the heat sink 16a in FIG. 24.

The second connecting point Cb2 between the middle lead 13 and the heat sink 16b is disposed at the corner of the heat sink 16b that is close to the heat sink 16a, but far from the control terminals 15b. For example, the second connecting point Cb2 is located at the left upper corner of the heat sink 16b in FIG. 24.

The third connecting point Cb3 between the negative electrode lead 14 and the heat sink 17b is disposed at the corner of the heat sink 16b that is far from the heat sink 16a and the control terminals 15b. For example, the third connecting point Cb3 is located at the right upper corner of the heat sink 16b in FIG. 24.

The fourth connecting point Cb4 between the middle lead 13 and the heat sink 17a is disposed at the corner of the heat sink 17a that is close to the heat sink 17b, but far from the control terminals 15a. For example, the fourth connecting point Cb4 is located at the right upper corner of the heat sink 17a in FIG. 24.

The fifth connecting point Cb5 between the first hanging lead 32a and the heat sink 16a is disposed at the corner of the heat sink 16a that is close to the heat sink 16b and the control terminals 15a. For example, the fifth connecting point Cb5 is located at the right lower corner of the heat sink 16a in FIG. 24.

The sixth connecting point Cb6 between the second hanging lead 32b and the heat sink 16b is disposed at the corner of the heat sink 16b that is far from the heat sink 16a, but close to the control terminals 15a. For example, the sixth connecting point Cb6 is located at the right lower corner of the heat sink 16b in FIG. 24.

As such, the lead frame 30 and each of the heat sinks 16a, 16b are connected to each other at locations that are on one of the diagonal lines of the heat sink 16a, 16b, similar to the thirteenth embodiment. Accordingly, it is less likely that the components will be inclined due to the molding pressure during the molding. Further, the negative electrode lead 14 and the heat sink 17b are connected to each other at the third connecting point Cb3 that is on the diagonal line of the heat sink 17b opposite to the diagonal line on which the second and sixth connecting points Cb2, Cb6 are located. Likewise, the connecting part 60 and the heat sink 17a are connected to each other at the fourth connecting point Cb4 that is on the diagonal line of the heat sink 17a opposite to the diagonal line on which the first and fifth connecting points Cb1, Cb5 are located. Therefore, the inclination of the components due to the molding pressure during the molding can be sufficiently reduced. Accordingly, the advantageous effects similar to the thirteenth embodiment can be achieved.

Also in the present embodiment, the connecting part 60 has the chamfered corners at locations overlapping with the heat sink 17a and the heat sink 16b. Accordingly, the advantageous effects similar to the seventeenth embodiment can be achieved.

Eighteenth Embodiment

An eighteenth embodiment will be described with reference to FIG. 25. In the semiconductor module 10 according to the present embodiment, structures of the middle lead 13 and the connecting part 60 are modified from that of the seventeenth embodiment. Other structures are similar to those of the seventeenth embodiment, and a different structure will be mainly described hereinafter.

Figure 25:
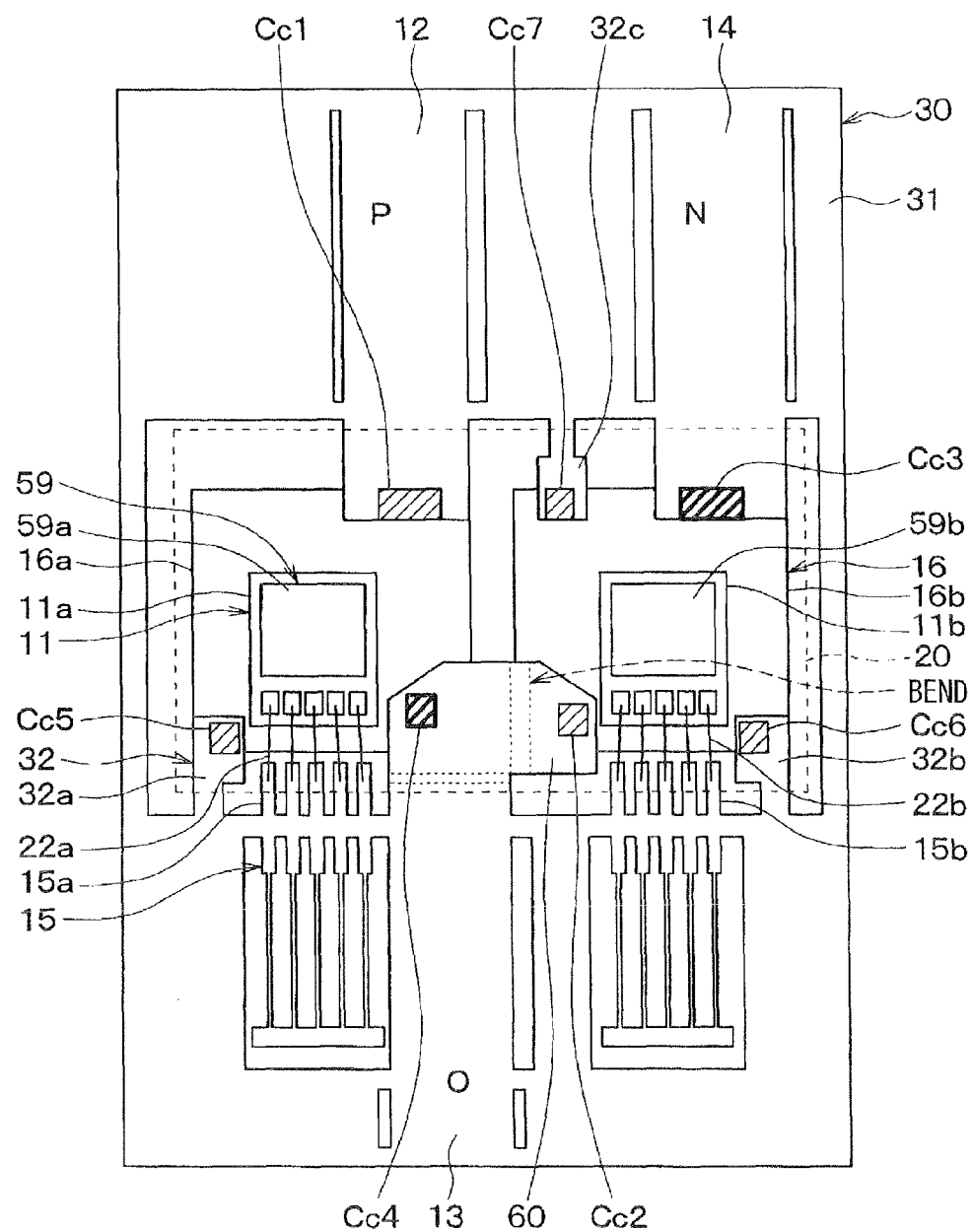
FIG. 25 is a schematic plan view of a semiconductor module, before being molded with a resin, according to an eighteenth embodiment of the present invention.

FIG. 25 is a schematic plan view of the semiconductor module 10, before being molded with the resin, for illustrating the layout of components. The semiconductor module 10 of the present embodiment has a sectional structure similar to that of the thirteenth embodiment shown in FIG. 17. Although FIG. 25 is not a cross-sectional view, some portions are hatched for the sake of clarity.

As shown in FIG. 25, the connecting part 60 is integral with the middle lead 13, similar to the seventeenth embodiment. However, the middle lead 13 is disposed on the same side as the control terminals 15a, 15b with respect to the semiconductor chips 11a, 11b. In addition, the hanging lead 32 includes a third hanging lead 32c in addition to the first hanging lead 32a and the second hanging lead 32c. Further, the lead frame 30 and the heat sinks 16a, 16b, 17a, 17b are connected at first through seventh connecting points Cc1 through Cc7 in the following manner.

The first connecting point Cc1 between the positive electrode lead 12 and the heat sink 16a is disposed at the corner of the heat sink 16a that is close to the heat sink 16b, but far from the control terminals 15a. For example, the first connecting point Cc1 is located at the right upper corner of the heat sink 16a in FIG. 25.

The second connecting point Cc2 between the middle lead 13 and the heat sink 16b is disposed at the corner of the heat sink 16b that is close to the heat sink 16a and the control terminals 15b. For example, the second connecting point Cc2 is located at the left lower corner of the heat sink 16b in FIG. 25.

The third connecting point Cc3 between the negative electrode lead 14 and the heat sink 17b is disposed at the corner of the heat sink 16b that is far from the heat sink 16a and the control terminals 15b. For example, the third connecting point Cc3 is located at the right upper corner of the heat sink 16b in FIG. 25

The fourth connecting point Cc4 between the middle lead 13 and the heat sink 17a is disposed at the corner of the heat sink 17a that is close to the heat sink 17b and the control terminals 15a. For example, the fourth connecting point Cc4 is located at the right lower corner of the heat sink 17a in FIG. 25.

The fifth connecting point Cc5 between the first hanging lead 32a and the heat sink 16a is disposed at the corner of the heat sink 16a that is close to the control terminals 15a, but far from the heat sink 16b. For example, the fifth connecting point Cc5 is located at the left lower corner of the heat sink 16a in FIG. 25.

The sixth connecting point Cc6 between the second hanging lead 32b and the heat sink 16b is disposed at the corner of the heat sink 16b that is far from the heat sink 16a, but close to the control terminals 15a. For example, the sixth connecting point Cc6 is located at the right lower corner of the heat sink 16b in FIG. 25.

The seventh connecting point Cc7 between the third hanging lead 32c and the heat sink 16b is disposed at the corner of the heat sink 16b that is close to the heat sink 16a, but far from the control terminals 15a. For example, the seventh connecting point Cb1 is located at the left upper corner of the heat sink 16b in FIG. 25.

By arranging the first through seventh connecting points Cc1 through Cc7 in the aforementioned manner, the middle lead 13 can be disposed on the same side as the control terminals 15a, 15b with respect to the semiconductor chips 11a, 11b. Further, the lead frame 30 and each of the heat sinks 16a, 16b are connected to each other at locations that are on one of the diagonal lines of the heat sink 16a, 16b, similar to the thirteenth embodiment. Accordingly, it is less likely that the components will be inclined due to the molding pressure during the molding.

Further, the negative electrode lead 14 is connected to the heat sink 17b at the third connecting point Cc3 that is on the diagonal line of the heat sink 17b opposite to the diagonal line on which the sixth and seventh connecting points Cc6, Cc7 are located. Likewise, the connecting part 60 and the heat sink 17a are connected to each other at the fourth connecting point Cc4 that is on the diagonal line of the heat sink 17a opposite to the diagonal line on which the first and fifth connecting points Cc1, Cc5 are located. Therefore, the inclination of the components due to the molding pressure during the molding can be sufficiently reduced. Accordingly, the advantageous effects similar to the thirteenth embodiment can be achieved.

Nineteenth Embodiment

A nineteenth embodiment will be described with reference to FIG. 26. In the semiconductor module 10 according to the present embodiment, structures of the negative electrode lead 14 and the third hanging lead 32c are modified from those of the eighteenth embodiment. Other structures are similar to those of the eighteenth embodiment, and a different structure will be mainly described hereinafter.

Figure 26:
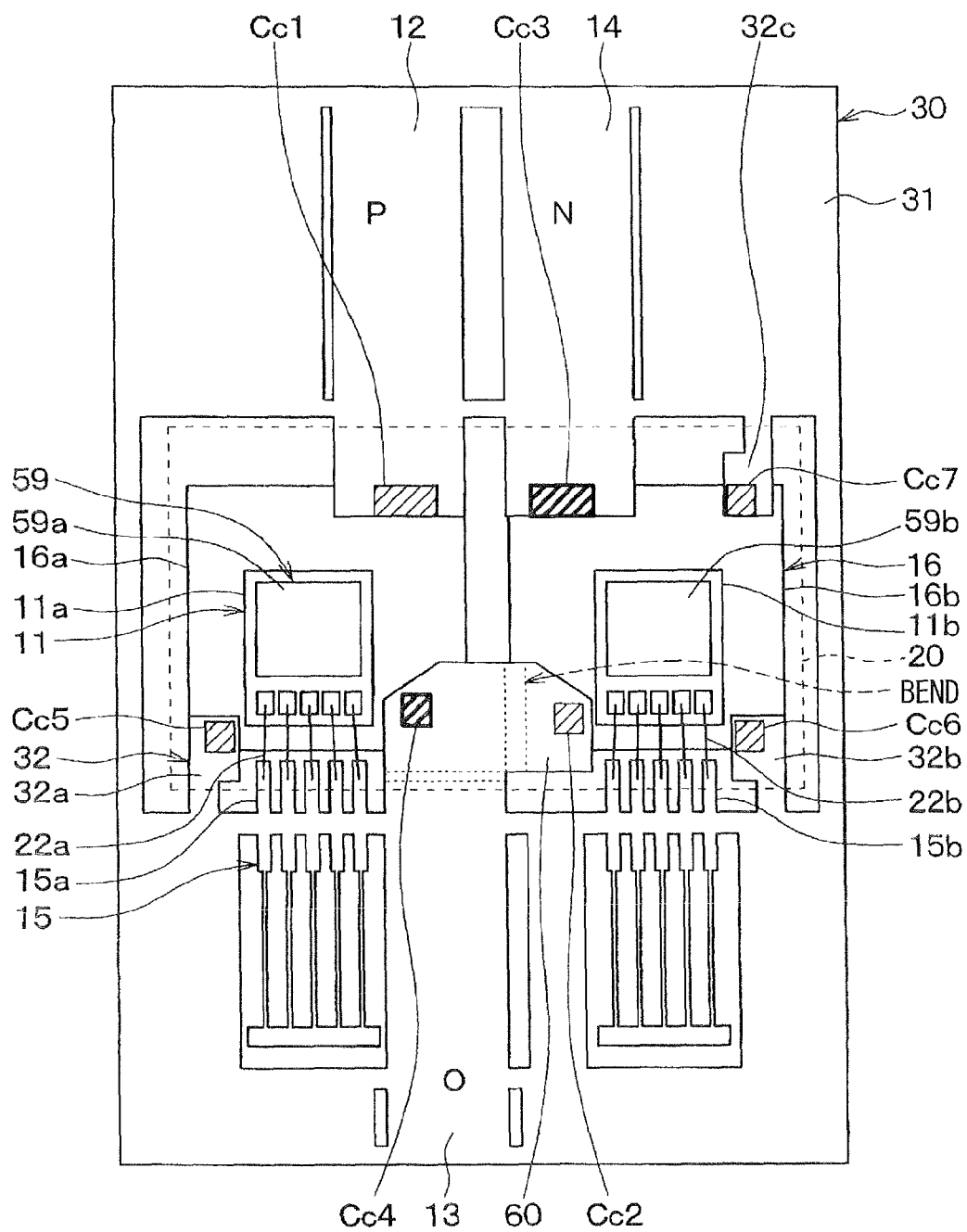
FIG. 26 is a schematic plan view of a semiconductor module, before being molded with a resin, according to a nineteenth embodiment of the present invention.

FIG. 26 is a schematic plan view of the semiconductor module 10, before being molded with the resin, for illustrating the layout of components. The semiconductor module 10 of the present embodiment has a sectional structure similar to that of the thirteenth embodiment shown in FIG. 17. Although FIG. 26 is not a cross-sectional view, some portions are hatched for the sake of clarity.

As shown in FIG. 26, in the present embodiment, the position of the negative electrode lead 14 and the third hanging lead 32c is replaced from that of the eighteenth embodiment. That is, the negative electrode lead 14 is disposed adjacent to the positive electrode lead 12, and the third connecting point Cc3 between the negative electrode lead 14 and the heat sink 17b is disposed at the corner of the heat sink 16b that is close to the heat sink 16a, but far from the control terminals 15b, such as at the left upper corner of the heat sink 16b in FIG. 26. The seventh connecting point Cc7 between the third hanging lead 32c and the heat sink 16b is disposed at the corner of the heat sink 16b that is far from the heat sink 16a and the control terminals 15b, such as at the right upper corner of the heat sink 16b in FIG. 26.

In this way, the negative electrode lead 14 can be disposed adjacent to the positive electrode lead 12. In such a structure, inductance can be reduced. Therefore, the structure is preferable in a case where inductance need to be reduced to meet the requirement of the inverter 1.

Twentieth Embodiment

A twentieth embodiment will be described with reference to FIGS. 27A, 27B and 28. The semiconductor module 10 according to the present embodiment is constructed as a 4 in 1 package structure in which the four arms constituting two phases are integrated. Other structures are similar to those of the thirteenth through nineteenth embodiments, and a different structure will be mainly described hereinafter.

Figure 27A:
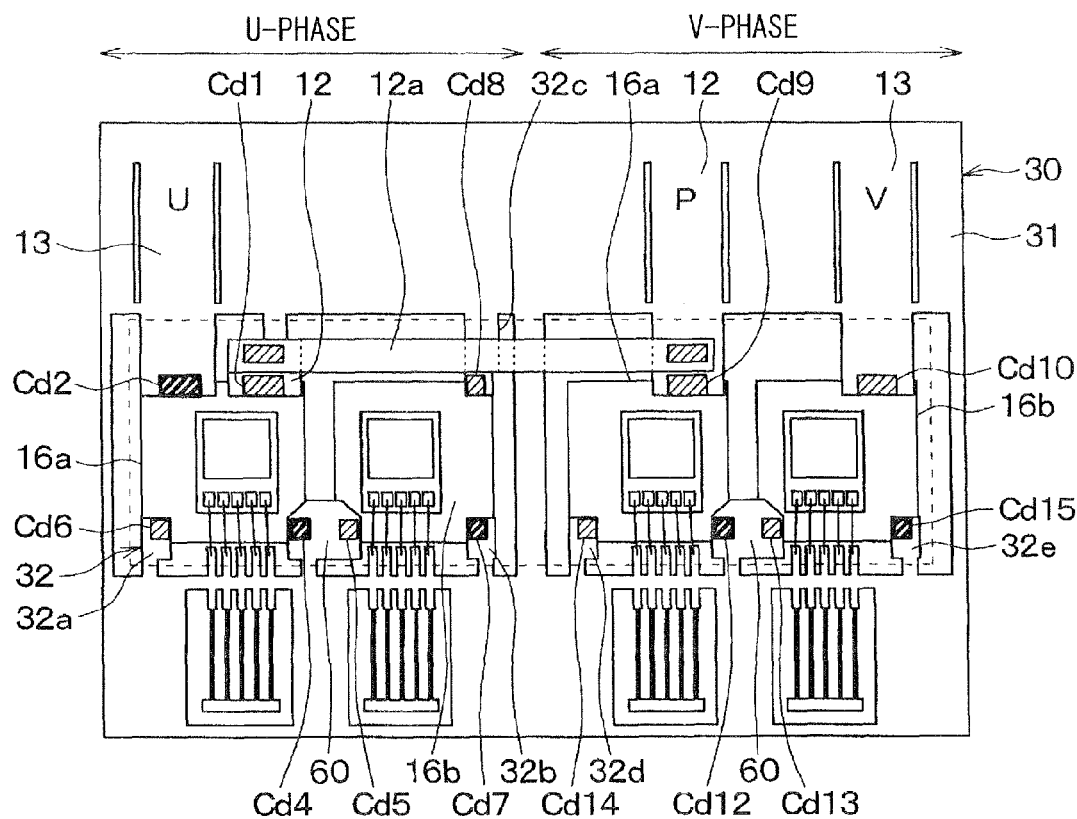
FIGS. 27A and 27B are schematic plan views of a semiconductor module for illustrating a layout of components according to a twentieth embodiment of the present invention.
Figure 27B:
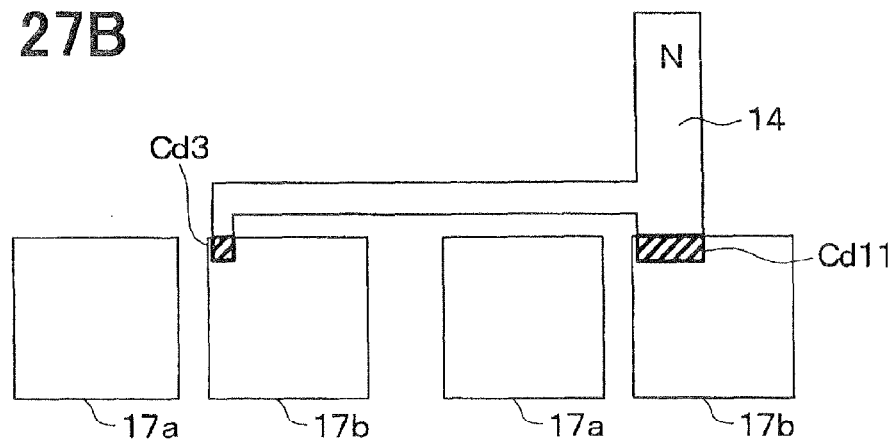
Figure 28:
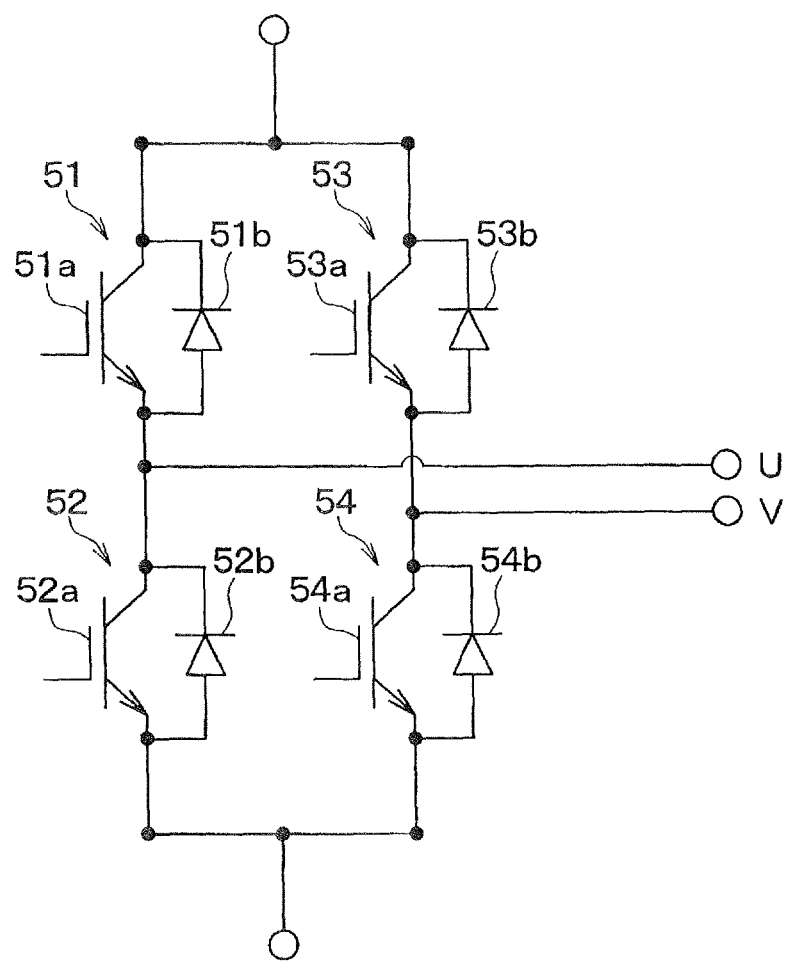
FIG. 28 is a diagram of an equivalent circuit of the semiconductor module shown in FIGS. 27A and 27B.

FIGS. 27A and 27B are schematic plan views for illustrating the layout of component in the semiconductor module 10 before being molded with a resin. Particularly, FIG. 27A is a plan view of the semiconductor module 10 from which the heat sinks 17a, 17b and the negative electrode lead 14 are removed, and FIG. 27B is a plan view illustrating the layout of the heat sinks 17a, 17b and the negative electrode lead 14. Although FIGS. 27A and 27B are not cross-sectional views, some portions are hatched for the sake of clarity. FIG. 28 is a diagram of an equivalent circuit of the semiconductor module 10 according to the present embodiment.

As shown in FIGS. 27A and 27B, the semiconductor module 10 has the upper arms and the lower arms for constituting two phases, such as the U-phase and the V-phase. As shown in FIG. 28, therefore, the equivalent circuit of the semiconductor module 10 is configured as in an H-bridge shape.

Specifically, the positive electrode lead 12 of the U-phase and the positive electrode lead 12 of the V-phase are connected through the coupling part 12a. The negative electrode lead 14 of the U-phase and the negative electrode lead 14 of the V-phase are separate from each other. The negative electrode leads 14 are connected to the heat sinks 17b of the corresponding phases. The lead frame 30 includes the first through hanging leads 32a through 32c in the U-phase, and the fourth and fifth hanging leads 32d, 32e in the V-phase. Further, the lead frame 30 and the heat sinks 16a, 16b, 17a, 17b are connected to each other at first through fifteenth connecting points Cd1 through Cd15 in the following manner.

First, the connection in the U-phase will be described. The first connecting point Cd1 between the positive electrode lead 12 and the heat sink 16a is disposed at the corner of the heat sink 16a that is close to the heat sink 16b, but far from the control terminals 15a. For example, the first connecting point Cd1 is located at the right upper corner of the heat sink 16a in FIG. 27A.

The second connecting point Cd2 between the middle lead 13 and the heat sink 17a is disposed at the corner of the heat sink 17a that is far from the heat sink 17b and the control terminals 15a. For example, the second connecting point Cd2 is located at the left upper corner of the heat sink 17a in FIG. 27A.

The third connecting point Cd3 between the negative electrode lead 14 and the heat sink 17b is disposed at the corner of the heat sink 17b that is close to the heat sink 17a, but far from the control terminals 15b. For example, the third connecting point Cd3 is located at the left upper corner of the heat sink 17b in FIG. 27B.

The fourth connecting point Cd4 between the connecting part 60 and the heat sink 17a is disposed at the corner of the heat sink 17a that is close to the heat sink 17b and the control terminals 15b. For example, the fourth connecting point Cd4 is located at the right lower corner of the heat sink 17a in FIG. 27A.

The fifth connecting point Cd5 between the connecting part 60 and the heat sink 16b is disposed at the corner of the heat sink 16b that is close to the heat sink 16a and the control terminals 15b. For example, the fifth connecting point Cd5 is located at the left lower corner of the heat sink 16b in FIG. 27A.

The sixth connecting point Cd6 between the first hanging lead 32a and the heat sink 16a is disposed at the corner of the heat sink 16a that is far from the heat sink 16b, but close to the control terminals 15a. For example, the sixth connecting point Cd6 is located at the left lower corner of the heat sink 16a in FIG. 27A. The seventh connecting point Cd7 between the second hanging lead 32b and the heat sink 17b is disposed at the corner of the heat sink 17b that is far from the heat sink 17a, but close to the control terminals 15a. For example, the seventh connecting point Cd7 is located at the right lower corner of the heat sink 17b in FIG. 27A.

The eighth connecting point Cd8 between the third hanging lead 32c and the heat sink 16b is disposed at the corner of the heat sink 16b that is far from the heat sink 16a and the control terminals 15a. For example, the eighth connecting point Cd8 is located at the right upper corner of the heat sink 16b in FIG. 27A.

Next, the connection in the V-phase will be described. The ninth connecting point Cd9 between the positive electrode lead 12 and the heat sink 16a is disposed at the corner of the heat sink 16a that is close to the heat sink 16b, but far from the control terminals 15a. For example, the ninth connecting point Cd9 is located at the right upper corner of the heat sink 16a in FIG. 27A.

The tenth connecting point Cd10 between the middle lead 13 and the heat sink 16b is disposed at the corner of the heat sink 16b that is far from the heat sink 16a and the control terminals 15b. For example, the tenth connecting point Cd10 is located at the right upper corner of the heat sink 16b in FIG. 27A.

The eleventh connecting point Cd11 between the negative electrode lead 14 and the heat sink 17b is disposed at the corner of the heat sink 17b that is close to the heat sink 16a, but far from the control terminals 15b. For example, the eleventh connecting point Cd11 is located at the left upper corner of the heat sink 17b in FIG. 27B.

The twelfth connecting point Cd12 between the connecting part 60 and the heat sink 17a is disposed at the corner of the heat sink 17a that is close to the heat sink 17b and the control terminals 15b. For example, the twelfth connecting point Cd12 is located at the right lower corner of the heat sink 17a in FIG. 27A.

The thirteenth connecting point Cd13 between the connecting part 60 and the heat sink 16b is disposed at the corner of the heat sink 16b that is close to the heat sink 16a and the control terminals 15b. For example, the thirteenth connecting point Cd13 is located at the left lower corner of the heat sink 16b in FIG. 27A.

The fourteenth connecting point Cd14 between the fourth hanging lead 32d and the heat sink 16a is disposed at the corner of the heat sink 16a that is far from the heat sink 16b, but close to the control terminals 15a. For example, the fourteenth connecting point Cd14 is located at the left lower corner of the heat sink 16a in FIG. 27A.

The fifteenth connecting point Cd15 between the fifth hanging lead 32e and the heat sink 17b is disposed at the corner of the heat sink 17b that is far from the heat sink 17a, but close to the control terminals 15a. For example, the fifteenth connecting point Cd15 is located at the right lower corner of the heat sink 17b in FIG. 27A.

The semiconductor module 10 having the 4 in 1 package structure is constructed in the aforementioned manner. Also in such a structure, the advantageous effects similar to those of the aforementioned embodiments can be achieved. In the example of FIGS. 27A and 27B, the leads 12 through 14 are disposed on the side opposite to the control terminals 15 with respect to the semiconductor chips 11a, 11b, similar to the thirteenth through seventeenth embodiments. Alternatively, the output leads 13 can be disposed on the same side as the control terminals 15, similar to the eighteenth and nineteenth embodiments.

Twenty-First Embodiment

A twenty-first embodiment will be described with reference to FIGS. 29A and 29B. In the semiconductor module 10 according to the present embodiment, six arms constituting three phases are integrated. That is, the semiconductor module 10 is constructed as a 6 in 1 package structure. Other structures are similar to the thirteenth through twentieth embodiments, and a different structure will be mainly described hereinafter.

FIGS. 29A and 29B are schematic plan views of the semiconductor module 10, before being molded with a resin, for illustrating the layout of components. Particularly, FIG. 29A is a plan view of the semiconductor module 10 from which the heat sinks 17a, 17b and the negative electrode lead 14 are removed, and FIG. 29B is a plan view illustrating the layout of the heat sinks 17a, 17b and the negative electrode lead 14.

As shown in FIGS. 29A and 29B, in the present embodiment, the semiconductor module 10 includes the upper arms and the lower arms for the for constituting three-phases, such as the U-phase, the V-phase and the W-phase. Therefore, the equivalent circuit of the semiconductor module 10 includes the whole of the three-phases of the inverter output circuit 5 shown in FIG. 1.

In the semiconductor module 10, the U-phase and the V-phase have the similar structure as those of the 4 in 1 package shown in FIGS. 27A and 27B of the twentieth embodiment. The semiconductor module 10 further includes the structure of the W-phase. The positive electrode leads 12 of the U-phase, the V-phase and the W-phase are connected to each other through the coupling part 12a. The negative electrode lead 14 is commonly provided for the U-phase, the V-phase and the W-phase. The negative electrode lead 14 is separate from the lead frame 30.

In the W-phase, the lead frame 30 includes a sixth hanging lead 32f and a seventh hanging lead 32g. In the W-phase, the lead frame 30 and the heat sinks 16a, 16b, 17a, 17b are connected to each other at sixteenth through twenty-second connecting points Cd16 through Cd22, which are respectively similar to the ninth through fifteenth connecting points Cd9 through Cd15 of the V-phase.

The semiconductor module 10 having the 6 in 1 package structure is constructed in the aforementioned manner. Also in such a structure, the advantageous effects similar to those of the aforementioned embodiments can be achieved. In the example of FIGS. 29A and 29B, the leads 12 through 14 are disposed on the side opposite to the control terminals 15 with respect to the semiconductor chips 11a, 11b, similar to the thirteenth through seventeenth embodiments. Alternatively, the output leads 13 can be disposed on the same side as the control terminals 15, similar to the eighteenth and nineteenth embodiments.

Other Embodiments

In the fourth through ninth embodiments, the negative electrode lead 14 is integral with the terminal body portion 14a, similar to the middle lead 13. Alternatively, the negative electrode lead 14 may be separate from the terminal body portion 14a, as the negative electrode lead 14 and the terminal 19 of the first through third embodiments.

In the fourth through ninth embodiments, the connecting part 13a and the output terminal portion 13b are formed by diverging a lead portion extending from one location of the terminal body portion 13a. Alternatively, the connecting part 13a and the output terminal portion 13b may extend from different locations of the terminal body portion 13c. For example, the connecting part 13a can extend from the terminal body portion 13c along the line passing through the semiconductor chips 11a, 11b as the connecting part 18a of the first embodiment. However, in a case where the metal plate for forming the lead frame 30 has the thick portion continuously along the predetermined line, the connecting part 13a may preferably has the shape of any of the fourth through ninth embodiments.

In the fourth through ninth embodiments, the connecting part 13a of the middle lead 13 is inclined relative to the output terminal portion 13b and connected to the front surface of the heat sink 16b. In the eleventh embodiment, the connecting part 17ab is inclined relative to the heat sink 17a and is connected to the front surface of the heat sink 16b. In the twelfth embodiment, the connecting part 16ba is inclined relative to the heat sink 16b and is connected to the rear surface of the heat sink 17a. Such configurations may be modified in various other ways. For example, the end of the connecting parts 13a, 16ba, 17ab may be connected to the side surface of the corresponding heat sink 16b, 17a, as the connecting part 18a of the third embodiment shown in FIG. 5.

In the first through third embodiments, the leads 12 through 14 are extended opposite to the control terminals 15 from the semiconductor chips 11a, 11b. That is, the leads 12 through 14 extend in the same direction. Alternatively, the leads 12 through 14 may extend in different directions, such as in two or more directions.

In the eighth and ninth embodiments, the semiconductor module 10 has the 4 in 1 package or 6 in 1 package structure employing the structure of any of the fourth through seventh embodiments. Likewise, the structure of any of the first through third embodiments may be employed in the 4 in 1 package structure, 6 in 1 package structure or the like by arranging the same structures for the predetermined number of phases. In such a case, the positive electrode leads 12 of the multiple phases are connected through the coupling part 12a, and the negative electrode leads 14 of the multiple phases are connected through the coupling part 14b.

In the thirteenth through twenty-first embodiments, the heat sinks 17a, 17b and the metal blocks 59a, 59b are separate members. Alternatively, the heat sink 17a and the metal block 59a may be integral with each other, and the heat sink 17b and the metal block 59b may be integral with each other.

The connecting part 60 of the fourteenth embodiment, which is increased in the size, may be employed to the semiconductor modules 10 of the fifteenth through twenty-first embodiments. It is noted that, in a case where the connecting part 60 with chamfered corners is elongated in the direction perpendicular to the direction D1, that is, in a case where the structure of the fourteenth embodiment is employed to the structure of the seventeenth embodiment, the connecting part 60 is configured that the narrowest portion is still wider than the leads 12 through 14. In such a case, the advantageous effects similar to the fourteenth embodiment can be achieved.

The structure of the fifteenth embodiment may be employed in the semiconductor modules 10 of the sixteenth through twenty-first embodiments. That is, in the semiconductor modules 10 of the sixteenth through twenty-first embodiments, the connecting part 60 may be connected to the side surface of the heat sink 17a, in place of the rear surface of the heat sink 17a.

The shape of the heat sinks 16a, 16b, 17a, 17b is not limited to the rectangular plate shape. Even if the shape of the heat sinks 16a, 16b, 17a, 17b is modified, the aforementioned advantageous effects can be achieved as long as the leads 12 through 14 and the hanging lead 32 are arranged in the similar manner.

In the aforementioned embodiments, the semiconductor module 10 is exemplarily employed to the inverter 1 for driving the three-phase motor 3. Alternatively, use of the semiconductor module 10 of the aforementioned embodiments is not limited to the inverter 1. For example, the semiconductor module 10 of the aforementioned embodiments may be employed to a converter or the like.

In the aforementioned embodiments other than the fifth embodiment, the IGBT 41a, 42a, 51a through 56a and the FWD 41b, 42b, 51b through 56b are integrally formed in the semiconductor chip 11. Alternatively, the IGBT 41a, 42a, 51a through 56a and the FWD 41b, 42b, 51b through 56b may be formed in separate semiconductor chips, as the fifth embodiment. Further, the semiconductor power element is not limited to the IGBT, but may be any other elements, such as a power MOSFET.

In the aforementioned embodiments, the lead frame 30 and the heat sinks 16, 17 are exemplarily connected through a solder or the like. The lead frame 30 and the heat sinks 16, 17 may be connected to each other by any other means, such as by mechanical fixing, welding, ultrasonic-bonding.

Further, the present invention may be implemented by combining the aforementioned embodiments in various ways.

Additional advantages and modifications will readily occur to those skilled in the art. The invention in its broader term is therefore not limited to the specific details, representative apparatus, and illustrative examples shown and described.

What is claimed is:

1. A semiconductor module comprising:
a first semiconductor chip provided with a semiconductor power element for constituting an upper arm, the first semiconductor chip having a first surface and a second surface;
a second semiconductor chip provided with a semiconductor power element for constituting a lower arm, the second semiconductor chip having a first surface and a second surface;
a first heat sink connected to a pad disposed on the second surface of the first semiconductor chip;
a positive electrode lead connected to the first heat sink;
a first terminal connected to a pad disposed on the first surface of the first semiconductor chip;
a middle lead connected between the upper arm and the lower arm as a middle terminal;
a second heat sink connected to the first terminal on a side opposite to the first semiconductor chip;
a third heat sink connected to a pad disposed on the second surface of the second semiconductor chip;
a second terminal connected to a pad disposed on the first surface of the second semiconductor chip;
a fourth heat sink connected to the second terminal on a side opposite to the second semiconductor chip;
a negative electrode lead connected to a pad disposed on the first surface of the second semiconductor chip;
a connecting part connecting between the upper arm and the lower arm; and
a resin mold part covering the first and second semiconductor chips, the first through fourth heat sinks, the positive electrode lead, the middle lead, the negative electrode lead, and the connecting part, wherein
the connecting part is integral with the first terminal, and
the connecting part includes an inclined portion inclined relative to the first terminal, and is connected to the third heat sink.

2. The semiconductor module according to claim 1, wherein
the connecting part is disposed away from a line passing through the first semiconductor chip and the second semiconductor chip toward the middle lead, and
the connecting part is connected to the third heat sink at a location away from the line toward the middle lead.

3. The semiconductor module according to claim 1, wherein
the first terminal and the connecting part are integral with the middle lead,
the middle lead has an output terminal portion extending from the first terminal, and
the output terminal portion exposes from the resin mold part.

4. The semiconductor module according to claim 3, wherein
the first terminal has a thickness greater than a thickness of the connecting part and the terminal output portion,
the second terminal is integral with the negative electrode lead, and
the second terminal has a thickness greater than a thickness of the negative electrode lead.

5. The semiconductor module according to claim 1, wherein
the positive electrode lead, the middle lead and the negative electrode lead are arranged in an arrangement direction on a same side of the first and second semiconductor chips, and
the middle lead is disposed at an end with respect to the arrangement direction.

6. The semiconductor module according to claim 1, wherein
the positive electrode lead, the middle lead and the negative electrode lead are arranged in an arrangement direction on a same side of the first and second semiconductor chips, and
the middle lead is disposed between the positive electrode lead and the negative electrode lead with respect to the arrangement direction.

7. The semiconductor module according to claim 1, wherein
the positive electrode lead and the middle lead are disposed on opposite sides of the first and second semiconductor chips, and
the negative electrode lead is disposed on a same side as the middle lead with respect to the first and second semiconductor chips.

8. The semiconductor module according to claim 1, wherein
each of the first semiconductor chip and the second semiconductor chip includes a first chip portion and a second chip portion, and
the semiconductor power element is formed in the first chip portion, and
the second chip portion is formed with a freewheel diode.

9. The semiconductor module according to claim 1, wherein
the first and second semiconductor chips, the first through fourth heat sinks, the positive electrode lead, the middle lead and the negative electrode lead constitute one phase, and a plurality of phases are molded in the resin mold part,
the positive electrode leads of the plurality of phases are coupled through a first coupling part, and
the negative electrode leads of the plurality of phases are coupled through a second coupling part.

10. A method of manufacturing the semiconductor module according to claim 1, comprising:
forming a lead frame by pressing a metal plate, the lead frame having the positive electrode lead, the middle lead including the first terminal, the negative electrode lead including the second terminal, and a frame portion that holds the positive electrode lead, the middle lead and the negative electrode lead;
connecting the first terminal of the middle lead to the first semiconductor chip and the second heat sink in a state of the lead frame;
connecting the second terminal of the negative electrode lead to the second semiconductor chip and the fourth heat sink in the state of the lead frame; and
molding the first and second semiconductor chips, the first through fourth heat sinks, the positive electrode lead, the middle lead and the negative electrode lead with a resin, wherein
the metal plate has a thick portion having a thickness greater than the other portion of the metal plate along a line on which the first and second terminals are to be formed, the line extending in a longitudinal direction of the metal plate.

11. A semiconductor module comprising:
a first semiconductor chip provided with a semiconductor power element for constituting an upper arm, the first semiconductor chip having a first surface and a second surface;
a second semiconductor chip provided with a semiconductor power element for constituting a lower arm, the second semiconductor chip having a first surface and a second surface;
a first heat sink connected to a pad disposed on the second surface of the first semiconductor chip;
a positive electrode lead connected to the first heat sink;
a second heat sink including a first terminal and being connected to a pad disposed on the first surface of the first semiconductor chip through the first terminal;
a third heat sink connected to a pad disposed on the second surface of the second semiconductor chip;
a fourth heat sink including a second terminal and being connected to a pad disposed on the first surface of the second semiconductor chip through the second terminal;
a negative electrode lead connected to the fourth heat sink;
a middle lead connected between the upper arm and the lower arm as a middle terminal;
a resin mold part covering the first and second semiconductor chips, the first through fourth heat sinks, the positive electrode lead, the middle lead and the negative electrode lead, wherein
one of the second heat sink and the third heat sink has a connecting part extending toward the other of the second heat sink and the third heat sink, and
the connecting part includes an inclined portion inclined relative to the one, and is connected to the other.

12. A semiconductor module comprising:
a first semiconductor chip provided with a semiconductor power element for constituting an upper arm, the first semiconductor having a first surface and a second surface;
a second semiconductor chip provided with a semiconductor power element for constituting a lower arm, the second semiconductor chip having a first surface and a second surface;
a first heat sink connected to a pad disposed on the second surface of the first semiconductor chip;
a positive electrode lead connected to the first heat sink;
a first control terminal electrically connected to a pad that is disposed on the first surface of the first semiconductor chip and connected to the semiconductor power element through a boning wire;
a second heat sink connected to the first surface of the first semiconductor chip;
a third heat sink connected to a pad disposed on the second surface of the second semiconductor chip;
a second control terminal electrically connected to a pad that is disposed on the first surface of the second semiconductor chip and connected to the semiconductor power element through a bonding wire;
a fourth heat sink connected to the first surface of the second semiconductor chip;
a negative electrode lead connected to the fourth heat sink;
a connecting part connecting between the second heat sink and the third heat sink;
a middle lead connected to at least one of the second heat sink, the third heat sink and the connecting part;
a resin mold part covering the first semiconductor chip and the second semiconductor chip in a state that surfaces of the first through fourth heat sinks and ends of the positive electrode lead, the middle lead, the negative electrode lead, the first control terminal and the second control terminal are exposed from the resin mold part, the surfaces of the first through fourth heat sinks being opposite to the first and second semiconductor chips, wherein
the positive electrode lead, the middle lead, the connecting part and the first and second control terminals were integral with a frame portion of a lead frame and were separated from a frame portion of a lead frame after the resin mold part was formed, and wherein
the connecting part is connected to the second heat sink and the third heat sink, and is configured to serve as a hanging lead being integral with the frame portion at a time of forming the resin mold part.

13. The semiconductor module according to claim 12, wherein
the connecting part is connected to a corner portion of the second heat sink and a corner portion of the third heat sink, the corner portion of the second heat sink being located adjacent to the fourth heat sink, the corner portion of the third heat sink being located adjacent to the first heat sink.

14. The semiconductor module according to claim 12, further comprising a first hanging lead disposed on a same side as the first control terminal with respect to the first semiconductor chip, wherein
- the first heat sink and the third heat sink are arranged in a first direction,
- the second heat sink and the fourth heat sink are arranged in the first direction,
- the positive electrode lead, the middle lead and the negative electrode lead are disposed on a side opposite to the first and second control terminals with respect to the first and second semiconductor chips,
- the positive electrode lead is connected to the first heat sink at a first connecting point that is located opposite to the first control terminal with respect to the first semiconductor chip within the first heat sink,
- the middle lead is connected to the third heat sink at a second connecting point that is located opposite to the second control terminal with respect to the second semiconductor chip within the third heat sink,
- the negative electrode lead is connected to the fourth heat sink at a third connecting point that is located opposite to the second control terminal with respect to the second semiconductor chip and closer to the second heat sink than the middle lead within the fourth heat sink,
- the connecting part is connected to the second heat sink at a fourth connecting point that is located on a same side as the first control terminal with respect to the first semiconductor chip and closer to the fourth heat sink than the first control terminal within the second heat sink,
- the connecting part is further connected to the third heat sink at a fifth connecting point that is on a same side as the second control terminal with respect to the second semiconductor chip and closer to the first heat sink than the second control terminal within the third heat sink, and
- the first hanging lead is connected to the first heat sink at a sixth connecting point that is located on a same side as the first control terminal with respect to the first semiconductor chip and on a side opposite to the third heat sink with respect to the first control terminal within the first heat sink.

15. The semiconductor module according to claim 12, further comprising a first hanging lead disposed on a same side as the first control terminal with respect to the first semiconductor chip, wherein
- the first through fourth heat sinks have a rectangular shape when viewed along a direction of a normal to the first and second semiconductor chips,
- the first heat sink and the third heat sink are arranged such that one of sides of the first heat sink is opposed to one of sides of the third heat sink,
- the second heat sink and the fourth heat sink are arranged such that one of sides of the second heat sink is opposed to one of sides of the fourth heat sink,
- the positive electrode lead, the middle lead and the negative electrode lead are disposed on a side opposite to the first and second control terminals with respect to the first and second semiconductor chips,
- the positive electrode lead is connected to the first heat sink at a first connecting point that is located at a corner portion of the first heat sink adjacent to the third heat sink and far from the first control terminal,
- the middle lead is connected to the third heat sink at a second connecting point that is located at a corner portion of the third heat sink far from the first heat sink and the second control terminal,
- the negative electrode lead is connected to the fourth heat sink at a third connecting point that is located at a corner portion of the fourth heat sink adjacent to the second heat sink and far from the second control terminal,
- the connecting part is connected to the second heat sink at a fourth connecting point that is located at a corner portion of the second heat sink adjacent to the fourth heat sink and the first control terminal,
- the connecting part is further connected to the third heat sink at a fifth connecting point that is located a corner portion of the third heat sink adjacent to the first heat sink and the second control terminal, and
- the first hanging lead is connected to the first heat sink at a sixth connecting point that is located at a corner portion of the first heat sink far from the third heat sink and adjacent to the control terminal.

16. The semiconductor module according to claim 12, further comprising:
- a first hanging lead disposed on a same side as the first control terminal with respect to the first semiconductor chip; and
- a second hanging lead disposed on a same side as the second control terminal with respect to the second semiconductor chip, wherein
- the first heat sink and the third heat sink are arranged in a first direction,
- the second heat sink and the fourth heat sink are arranged in the first direction,
- the positive electrode lead, the middle lead, the negative electrode lead are disposed on a side opposite to the first and second control terminals with respect to the first and second semiconductor chips,
- the positive electrode lead is connected to the first heat sink at a first connecting point that is located on a side opposite to the first control terminal with respect to the first semiconductor chip within the first heat sink,
- the connecting part is connected to the third heat sink at a second connecting point that is located on a side opposite to the second control terminal with respect to the second semiconductor chip within the third heat sink,
- the negative electrode lead is connected to the fourth heat sink at a third connecting point that is located on a side opposite to the second control terminal with respect to the second semiconductor chip and farther from the second heat sink than the connecting part within the fourth heat sink,
- the connecting part is further connected to the second heat sink at a fourth connecting point that is located on a side opposite to the first control terminal with respect to the first semiconductor chip and closer to the fourth heat sink than the positive electrode lead within the second heat sink,
- the first hanging lead is connected to the first heat sink at a fifth connecting point that is located on a same side as the first control terminal with respect to the first semiconductor chip and closer to the third heat sink than the first control terminal within the first heat sink,
- the second hanging lead is connected to the third heat sink at a sixth connecting point that is located on a same side as the second control terminal with respect to the second semiconductor chip and on a side opposite to the first heat sink with respect to the second control terminal within the third heat sink,
- the middle lead connects to the connecting part, and
- the middle lead is connected to the second heat sink and the third heat sink through the connecting part.

17. The semiconductor module according to claim 12, further comprising:
- a first hanging lead disposed on a same side as the first control terminal with respect to the first semiconductor chip; and
- a second hanging lead disposed on a same side as the second control terminal with respect to the second semiconductor chip, wherein
- the first through fourth heat sinks have a rectangular shape when viewed from a direction of a normal to the first and second semiconductor chips,
- the first heat sink and the third heat sink are arranged such that one of sides of the first heat sink is opposed to one of sides of the third heat sink,
- the second heat sink and the fourth heat sink are arranged such that one of sides of the second heat sink is opposed to one of sides of the fourth heat sink,
- the positive electrode lead, the middle lead and the negative electrode lead are disposed on a side opposite to the first and second control terminals with respect to the first and second semiconductor chips,
- the positive electrode lead is connected to the first heat sink at a first connecting point that is located at a corner portion of the first heat sink far from the third heat sink and the first control terminal,
- the connecting part is connected to the third heat sink at a second connecting point that is located at a corner portion of the third heat sink adjacent to the first heat sink and far from the second control terminal,
- the negative electrode lead is connected to the fourth heat sink at a third connecting point that is located at a corner portion of the fourth heat sink far from the second heat sink and the second control terminal,
- the connecting part is further connected to the second heat sink at a fourth connecting point that is located at a corner portion of the second heat sink adjacent to the fourth heat sink and far from the first control terminal,
- the first hanging lead is connected to the first heat sink at a fifth connecting point that is located at a corner portion of the first heat sink adjacent to the third heat sink and the first control terminal,
- the second hanging lead is connected to the third heat sink at a sixth connecting point that is located at a corner portion of the third heat sink far from the first heat sink and adjacent to the second control terminal,
- the middle lead connects to the connecting part, and
- the middle lead is connected to the second heat sink and the third heat sink through the connecting part.

18. The semiconductor module according to claim 12, further comprising:
- a first hanging lead disposed on a same side as the first control terminal with respect to the first semiconductor chip;
- a second hanging lead disposed on a same side as the second control terminal with respect to the second semiconductor chip; and
- a third hanging lead disposed on a side opposite to the second control terminal with respect to the second semiconductor chip, wherein
- the first heat sink and the third heat sink are arranged in a first direction,
- the second heat sink and the fourth heat sink are arranged in the first direction,
- the positive electrode lead and the negative electrode lead are disposed on a side opposite to the first and second control terminals with respect to the first and second semiconductor chips,
- the middle lead is disposed on a same side as the first and second control terminals with respect to the first and second semiconductor chips,
- the positive electrode lead is connected to the first heat sink at a first connecting point that is located on a side opposite to the first control terminal with respect to the first semiconductor chip within the first heat sink,
- the connecting part is connected to the third heat sink at a second connecting point that is located on a same side as the second control terminal with respect to the second semiconductor chip and closer to the first heat sink than the second control terminal within the third heat sink,
- the negative electrode lead is connected to the fourth heat sink at a third connecting point that is located on a side opposite to the second control terminal with respect to the second semiconductor chip within the fourth heat sink,
- the connecting part is further connected to the second heat sink at a fourth connecting point that is located on a same side as the first control terminal with respect to the first semiconductor chip and closer to the fourth heat sink than the first control terminal within the second heat sink,
- the first hanging lead is connected to the first heat sink at a fifth connecting point that is located on a same side as the first control terminal with respect to the first semiconductor chip and on a side opposite to the third heat sink with respect to the first control terminal within the first heat sink,
- the second hanging lead is connected to the third heat sink at a sixth connecting point that is located on a same side as the second control terminal with respect to the second semiconductor chip and on a side opposite to the first heat sink with respect to the second control terminal within the third heat sink,
- the third hanging lead is connected to the third heat sink at a seventh connecting point that is located on a side opposite to the second control terminal with respect to the second semiconductor chip and closer to the first heat sink than the negative electrode lead within the third heat sink,
- the middle lead connects to the connecting part, and
- the middle lead is connected to the second heat sink and the third heat sink through the connecting part.

19. The semiconductor module according to claim 12, further comprising:
- a first hanging lead disposed on a same side as the first control terminal with respect to the first semiconductor chip;
- a second hanging lead disposed on a same side as the second control terminal with respect to the second semiconductor chip; and
- a third hanging lead disposed on a side opposite to the second control terminal with respect to the second semiconductor chip, wherein
- the first through fourth heat sinks have a rectangular shape when viewed along a direction of a normal to the first and second semiconductor chips,
- the first heat sink and the third heat sink are arranged such that one of sides of the first heat sink is opposed to one of sides of the third heat sink,
- the second heat sink and the fourth heat sink are arranged such that one of sides of the second heat sink is opposed to one of sides of the fourth heat sink, the positive electrode lead and the negative electrode lead are disposed on a side opposite to the first and second control terminals with respect to the first and second semiconductor chips, the middle lead is disposed on a same side as the first and second control terminals with respect to the first and second semiconductor chips, the positive electrode lead is connected to the first heat sink at a first connecting point that is located at a corner portion of the first heat sink adjacent to the third heat sink and far from the first control terminal, the connecting part is connected to the third heat sink at a second connecting point that is located at a corner portion of the third heat sink adjacent to the first heat sink and the second control terminal, the negative electrode lead is connected to the fourth heat sink at a third connecting point that is located at a corner portion of the fourth heat sink far from the second heat sink and the second control terminal, the connecting part is further connected to the second heat sink at a fourth connecting point that is located at a corner portion of the second heat sink adjacent to the fourth heat sink and the first control terminal, the first hanging lead is connected to the first heat sink at a fifth connecting point that is located at a corner portion of the first heat sink far from the third heat sink and adjacent to the first control terminal, the second hanging lead is connected to the third heat sink at a sixth connecting point that is located at a corner portion of the third heat sink far from the first heat sink and adjacent to the second control terminal, the third hanging lead is connected to the third heat sink at a seventh connecting point that is located at a corner portion of the third heat sink adjacent to the first heat sink and far from the second control terminal, the middle lead connects to the connecting part, and the middle lead is connected to the second heat sink and the third heat sink through the connecting part.

20. The semiconductor module according to claim 12, further comprising:

a first hanging lead disposed on a same side as the first control terminal with respect to the first semiconductor chip;

a second hanging lead disposed on a same side as the second control terminal with respect to the second semiconductor chip; and a third hanging lead disposed on a side opposite to the second control terminal with respect to the second semiconductor chip, wherein the first heat sink and the third heat sink are arranged in a first direction, the second heat sink and the fourth heat sink are arranged in the first direction, the positive electrode lead and the negative electrode lead are disposed on a side opposite to the first and second control terminals with respect to the first and second semiconductor chips, the middle lead is disposed on a same side as the first and second control terminals with respect to the first and second semiconductor chips, the positive electrode lead is connected to the first heat sink at a first connecting point that is located on a side opposite to the first control terminal with respect to the first semiconductor chip within the first heat sink, the connecting part is connected to the third heat sink at a second connecting point that is located on a same side as the second control terminal with respect to the second semiconductor chip and closer to the first heat sink than the second control terminal within the third heat sink, the negative electrode lead is connected to the fourth heat sink at a third connecting point that is located on a side opposite to the second control terminal with respect to the second semiconductor chip within the fourth heat sink, the connecting part is further connected to the second heat sink at a fourth connecting point that is located on a same side as the first control terminal with respect to the first semiconductor chip and closer to the fourth heat sink than the first semiconductor chip within the second heat sink, the first hanging lead is connected to the first heat sink at a fifth connecting point that is located on a same side as the first control terminal with respect to the first semiconductor chip and on a side opposite to the third heat sink with respect to the first control terminal within the first heat sink, the second hanging lead is connected to the third heat sink at a sixth connecting point that is located on a same side as the second control terminal with respect to the second semiconductor chip and on a side opposite to the first heat sink with respect to the second control terminal within the third heat sink, the third hanging lead is connected to the third heat sink at a seventh connecting point that is located on a side opposite to the second control terminal with respect to the second semiconductor chip and farther from the first heat sink than the negative electrode lead within the third heat sink, the middle lead connects to the connecting part, and the middle lead is connected to the second heat sink and the third heat sink through the connecting part.

21. The semiconductor module according to claim 12, further comprising:

a first hanging lead disposed on a same side as the first control terminal with respect to the first semiconductor chip;

a second hanging lead disposed on a same side as the second control terminal with respect to the second semiconductor chip; and a third hanging lead disposed on a side opposite to the second control terminal with respect to the second semiconductor chip, wherein the first through fourth heat sinks have a rectangular shape when viewed along a direction of a normal to the first and second semiconductor chips, the first heat sink and the third heat sink are arranged such that one of sides of the first heat sink is opposed to one of sides of the third heat sink, the second heat sink and the fourth heat sink are arranged such that one of sides of the second heat sink is opposed to one of sides of the fourth heat sink, the positive electrode lead and the negative electrode lead are disposed on a side opposite to the first and second control terminals with respect to the first and second semiconductor chips, the middle lead is disposed on a same side as the first and second control terminals with respect to the first and second semiconductor chips, the positive electrode lead is connected to the first heat sink at a first connecting point that is located at a corner portion of the first heat sink adjacent to the third heat sink and far from the first control terminal, the connecting part is connected to the third heat sink at a second connecting point that is located at a corner portion of the third heat sink adjacent to the first heat sink and the second control terminal, the negative electrode lead is connected to the fourth heat sink at a third connecting point that is located at a corner portion of the fourth heat sink adjacent to the second heat sink and far from the second control terminal, the connecting part is further connected to the second heat sink at a fourth connecting point that is located at a corner portion of the second heat sink adjacent to the fourth heat sink and the first control terminal, the first hanging lead is connected to the first heat sink at a fifth connecting point that is located at a corner portion of the first heat sink far from the third heat sink and adjacent to the first control terminal, the second hanging lead is connected to the third heat sink at a sixth connecting point that is located at a corner portion of the third heat sink far from the first heat sink and adjacent to the second control terminal, the third hanging lead is connected to the third heat sink at a seventh connecting point that is located at a corner portion of the third heat sink far from the first heat sink and the second control terminal, the middle lead connects to the connecting part, and the middle lead is connected to the second heat sink and the third heat sink through the connecting part.

22. The semiconductor module according to claim 12, wherein
a dimension of the connecting part in a direction perpendicular to a direction of an electric current in the connecting part is greater than a dimension of at least one of the positive electrode lead, the middle lead and the negative electrode lead in a direction perpendicular to a direction of an electric current in the one.

23. The semiconductor module according to claim 12, wherein
the connecting part has chamfered corners at locations respectively corresponding to the second heat sink and the third heat sink when viewed along a direction of a normal to the first and second semiconductor chips.

24. The semiconductor module according to claim 12, wherein
the first and second semiconductor chips, the first through fourth heat sinks, the positive electrode lead, the middle lead, the negative electrode lead, the first control terminal, the second control terminal and the connecting part constitute one phase in which one upper arm and one lower arm are connected, and the resin mold part covers a plurality of phases,
the positive electrode leads of the plurality of phases are connected through a coupling part, and
the negative electrode leads of the plurality of phases are provided by a single member that is separate from the lead frame.

25. A method of manufacturing a semiconductor module that includes a first semiconductor chip, a second semiconductor chip, first through fourth heat sinks, a positive electrode lead, an middle lead, a negative electrode lead, a first control terminal, a second control terminal, a connecting part and a resin mold part, the first semiconductor chip including a semiconductor power element for constituting an upper arm, the second semiconductor chip including a semiconductor power element for constituting a lower arm, the first heat sink being connected to a pad disposed on a second surface of the first semiconductor chip, the positive electrode lead being connected to the first heat sink, the first control terminal being electrically connected to a pad disposed on a first surface of the first semiconductor chip for controlling the semiconductor power element through a bonding wire, the second heat sink being connected to the first surface of the first semiconductor chip, the third heat sink being connected to a pad disposed on a second surface of the second semiconductor chip, the second control terminal being electrically connected to a pad disposed on a first surface of the second semiconductor chip for controlling the semiconductor power element through a bonding wire, the fourth heat sink being connected to the first surface of the second semiconductor chip, the negative electrode lead being connected to the fourth heat sink, the middle lead connecting between the second heat sink and the third heat sink, and the middle lead being connected to at least one of the second heat sink, the third heat sink and the connecting part, the method comprising:
preparing a lead frame in which the positive electrode portion, the middle lead, the first control terminal, the second control terminal, and the connecting part connect to a frame portion;
connecting the connecting part to the second heat sink and the third heat sink;
molding the first and second semiconductor chips with a resin while functioning the connecting part as a hanging lead, thereby to form the resin mold part, wherein surfaces of the first through fourth heat sinks opposite to the first and second semiconductor chips and ends of the positive electrode lead, the middle lead, the negative electrode lead and the first and second control terminals are exposed from the resin mold part; and
separating the frame portion from the positive electrode lead, the middle lead, the first and second control terminals and the connecting part after the molding.

26. The semiconductor module according to claim 25, wherein
in the connecting, the connecting part is connected to a corner portion of the second heat sink and a corner portion of the third heat sink, the corner portion of the second heat sink being adjacent to the fourth heat sink, and the corner portion of the third heat sink is adjacent to the first heat sink.

* * * * *